(12) United States Patent
Hatakeyama et al.

(10) Patent No.: US 10,002,740 B2
(45) Date of Patent: Jun. 19, 2018

(54) INSPECTION DEVICE

(71) Applicant: EBARA CORPORATION, Tokyo (JP)

(72) Inventors: Masahiro Hatakeyama, Tokyo (JP); Ryo Tajima, Tokyo (JP); Kenichi Suematsu, Tokyo (JP); Kenji Watanabe, Tokyo (JP); Yasushi Toma, Tokyo (JP); Kenji Terao, Tokyo (JP); Takeshi Murakami, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days. days.

(21) Appl. No.: 15/667,040

(22) Filed: Aug. 2, 2017

(65) Prior Publication Data

US 2018/0040452 A1  Feb. 8, 2018

Related U.S. Application Data

(63) Continuation of application No. PCT/JP2016/053384, filed on Feb. 4, 2016.

(30) Foreign Application Priority Data

Feb. 5, 2015 (JP) ................................. 2015-021169
Jan. 12, 2016 (JP) ................................. 2016-003745
Jan. 28, 2016 (JP) ................................. 2016-014182

(51) Int. Cl.
*H01J 37/05* (2006.01)
*H01J 37/147* (2006.01)
(Continued)

(52) U.S. Cl.
CPC ............ *H01J 37/05* (2013.01); *H01J 37/141* (2013.01); *H01J 37/147* (2013.01); *H01J 37/244* (2013.01); *H01J 37/26* (2013.01)

(58) Field of Classification Search
USPC ............ 250/306, 307, 310, 311, 396 R, 397, 250/492.1, 492.2, 492.3; 382/145–149
See application file for complete search history.

(56) References Cited

U.S. PATENT DOCUMENTS 6,265,719 B1  7/2001 Yamazaki et al.
6,677,587 B2 * 1/2004 Kohama ............ G01N 23/2251
850/9

(Continued)

FOREIGN PATENT DOCUMENTS

JP  H05-109381 A  4/1993
JP  H11-132975 A  5/1999
(Continued)

*Primary Examiner* — Bernard Souw
(74) *Attorney, Agent, or Firm* — Pearne & Gordon LLP

(57) ABSTRACT

An electron beam inspection device includes: a primary electron optical system that irradiates the surface of a sample with an electron beam; and a secondary electron optical system that gathers secondary electrons emitted from the sample and forms an image on the sensor surface of a detector. An electron image of the surface of the sample is obtained from a signal detected by the detector, and the sample is inspected. A cylindrical member that is formed with conductors stacked as an inner layer and an outer layer, and an insulator stacked as an intermediate layer is provided inside a lens tube into which the secondary electron optical system is incorporated. An electron orbital path is formed inside the cylindrical member, and the members constituting the secondary electron optical system are arranged outside the cylindrical member.

13 Claims, 25 Drawing Sheets

(51) Int. Cl.
*H01J 37/141* (2006.01)
*H01J 37/26* (2006.01)
*H01J 37/244* (2006.01)

(56) References Cited

U.S. PATENT DOCUMENTS

| | | | | |
|---|---|---|---|---|
| 6,853,143 | B2* | 2/2005 | Nakasuji | G01N 23/04 251/310 |
| 6,855,929 | B2* | 2/2005 | Kimba | G01N 23/225 250/307 |
| 7,212,017 | B2* | 5/2007 | Watanabe | G01R 31/305 324/754.22 |
| 7,408,175 | B2* | 8/2008 | Kimba | G01N 23/225 250/307 |
| 7,645,988 | B2* | 1/2010 | Nagahama | H01J 37/26 250/307 |
| 8,193,493 | B2* | 6/2012 | Tanimoto | G01N 23/225 250/306 |
| 9,601,302 | B2* | 3/2017 | Yoshikawa | G01N 23/2204 |
| 2002/0028399 | A1 | 3/2002 | Nakasuji et al. | |
| 2002/0033449 | A1* | 3/2002 | Nakasuji | G01N 23/225 250/306 |
| 2002/0130262 | A1* | 9/2002 | Nakasuji | G01N 23/225 250/311 |
| 2002/0148975 | A1* | 10/2002 | Kimba | G01N 23/225 250/492.1 |
| 2003/0085355 | A1* | 5/2003 | Kohama | G01N 23/2251 250/310 |
| 2005/0199807 | A1* | 9/2005 | Watanabe | G01R 31/305 250/306 |
| 2007/0194235 | A1* | 8/2007 | Kimba | G01N 23/225 250/310 |
| 2007/0228275 | A1 | 10/2007 | Fuse et al. | |
| 2008/0017797 | A1* | 1/2008 | Cheng | H01J 37/244 250/310 |
| 2008/0121804 | A1* | 5/2008 | Nakasuji | G01N 23/225 250/310 |
| 2009/0224151 | A1 | 9/2009 | Hatakeyama et al. | |
| 2011/0139985 | A1* | 6/2011 | Tanimoto | G01N 23/225 250/310 |
| 2014/0312227 | A1* | 10/2014 | Yoshikawa | G01N 23/2204 250/310 |
| 2015/0340193 | A1* | 11/2015 | Yoshikawa | G01N 23/2204 250/310 |

FOREIGN PATENT DOCUMENTS

| | | |
|---|---|---|
| JP | 3014210 B2 | 2/2000 |
| JP | 2000-149853 A | 5/2000 |
| JP | 2007-048686 A | 2/2007 |
| JP | 2007-294850 A | 11/2007 |
| JP | 2008-135336 A | 6/2008 |
| JP | 4332922 B2 | 9/2009 |
| JP | 2014-209460 A | 11/2014 |
| WO | 02-01596 A1 | 3/2002 |

\* cited by examiner

INSPECTION DEVICE

CROSS-REFERENCE TO RELATED APPLICATIONS

This application claims the benefit of Japanese Priority Patent Applications JP 2015-021169 filed on Feb. 5, 2015, JP2016-003745 filed on Jan. 12, 2016, JP2016-014182 filed on Jan. 28, 2016, PCT/JP2016/053384 filed on Feb. 4, 2016, the entire contents of which are incorporated herein by reference.

FIELD

The present technology relates to an inspection device.

BACKGROUND AND SUMMARY

There is a known electron beam inspection device that inspects a semiconductor substrate by irradiating the target sample with an electron beam, detecting secondary electrons emitted from the sample, obtaining an electron image of the sample surface, and inspecting the sample.

There is a demand for development of a higher-performance inspection device, and a necessary technology for developing the higher-performance inspection device.

DETAILED DESCRIPTION OF NON-LIMITING EXAMPLE EMBODIMENTS

The following is a detailed description of embodiments, with reference to the accompanying drawings.

1: First Embodiment

Technical Field

This embodiment relates to an electron beam inspection device to be used for inspection or evaluation of an ultrafine state of a sample surface, such as inspection to be conducted to determine whether there is a defect or foreign matter on the photomask of a semiconductor substrate or the circuit pattern of a wafer, and to a projection structure that irradiates the surface of a sample with an electron beam, and forms a two-dimensional electron image of the sample on the sensor surface of a detector.

Background Art

In the process of manufacturing a semiconductor integrated circuit, an electron beam inspection device is used to inspect the semiconductor substrate. The electron beam inspection device obtains an electron image of the surface of a target sample by irradiating the sample with an electron beam and detecting secondary electrons emitted from the sample (emitted electrons such as mirror electrons and reflected electrons as well as secondary electrons are collectively called secondary electrons). The electron beam inspection device then inspects the sample.

Figure 9:
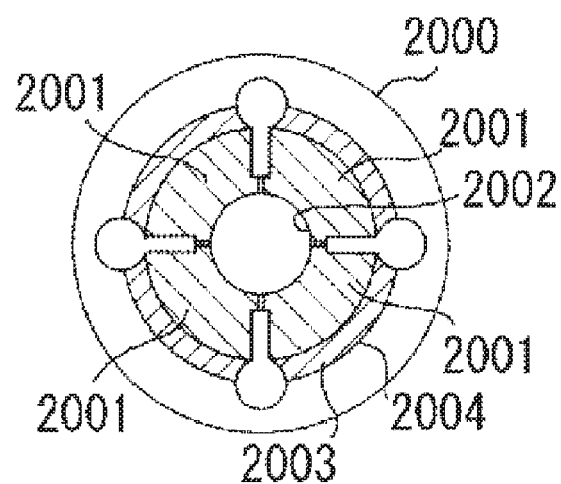
FIG. 9 is a cross-sectional view of an example of a conventional electrostatic deflector.

As shown in FIG. 9, there is a known electrostatic deflector that includes a cylindrical base member 2000, electrostatic electrodes 2001 provided in the cylindrical base member 2000, a conductive layer 2002 stacked on the inner side of the electrostatic electrodes 2001, and an insulating layer 2003 and a conductive layer 2004 stacked on the outer side of the electrostatic electrodes 2001, to prevent an occurrence of charging up (see JP 2007-294850 A, for example).

SUMMARY OF THIS EMBODIMENT

Problem to be Solved by this Embodiment

As the semiconductor manufacturing technology has further advanced in recent years, semiconductor device integration and circuit pattern miniaturization have further progressed. For example, development of a manufacturing device that forms a pattern with a line width of 10 to 20 nm on a wafer is becoming more realistic with the advanced exposure technology.

In such ultrafine pattern defect inspection, a pattern with a line width of 10 to 20 nm is formed on a wafer. In a case where a pattern with a line width four to five times greater, which is 40 to 100 nm, is formed on a mask, it is necessary to recognize a defect of 2 to 5 nm in size on the wafer, and a defect of 10 to 25 nm in size on the mask daring inspection of defects in these patterns. However, a conventional optical inspection device does not have a sufficiently high resolution, and is incapable of pattern recognition. For example, the SEM (Scanning Electron Microscope) method with high resolution requires an enormous amount of time in obtaining an inspection image, and therefore, is difficult to be used in semiconductor circuit production lines.

To increase the signal amount or the acceleration of an electron beam with secondary electrons so as to increase the resolution, it is necessary to set the reference voltage at a high value in the lens tube that forms the electron beam orbital path.

In a conventional electron beam inspection device, however, the reference voltage in the electron beam orbital path is normally set at the ground potential. Any conventional electron beam inspection device does not have a means or a function to set the voltage in the orbital path at a high value.

The use of an electrostatic lens or a deflector as a means to increase the resolution only increases the size of the lens tube, and requires an expensive power supply for supplying a high voltage. If each of the magnetic field lenses incorporated into the lens tube has a multi-layer structure as shown in FIG. 9, the cross-sectional area of the electron path region in the lens tube becomes larger, and the coil size and the power consumption also become larger, resulting in an increase in the size of the lens tube.

To achieve, without an increase in the size of the lens tube, a higher resolution in inspection than that of a device having a conventional structure, it is necessary to develop a novel device that has a function to increase the reference voltage in the lens tube.

Although SEM provides high resolution as described above, a circuit pattern needs to be scanned with an electron beam several times when a defect of 20 nm in size on a mask is to be detected by SEM. Therefore, it takes too long a time to inspect each one mask. It is technically difficult to reach the standard of an inspection device that can be placed in a semiconductor production line by the existing SEM.

Meanwhile, an inspection device compatible with PEM (Projection Electron Microscopy) irradiates the surface of a mask with an electron beam, and generates a two-dimensional image on the sensor surface of a detector with secondary electrons emitted from the mask. Accordingly, such an inspection device can inspect a mask in a short time. However, to inspect or analyze a fine structure with a higher degree of accurate at a higher speed, it is necessary to increase the reference voltage in the lens tube serving as the orbital path of an electron beam formed with secondary electrons, and increase the energy of the electron beam. Further, an inspection device that can be placed and used in a semiconductor production line compliant with a mass-production system needs to have a small size.

In view of the above problem of conventional technologies, this embodiment aims to provide an electron beam inspection device that can obtain a fine observation image of the surface of a sample such as an ultrafine pattern with a high degree of accuracy and at a high speed, and has such a small size as to be used in a semiconductor integrated circuit production line.

Solution to Problem

As described above, a conventional inspection device does not have any means or function to increase the reference voltage in the lens tube, and therefore, it is difficult to increase the reference voltage.

To increase the signal amount or the acceleration of an electron beam in a device having a conventional structure in which the reference voltage in the electron beam orbital path is set at the ground potential, the potential of the sample needs to be set at a negative high voltage. With such a setting, however, an aberration increase due to the electron repulsion accompanying the increase in the electron quantity of an electron beam cannot be prevented, and a sharp electron image cannot be obtained. As a result, the resolution in inspection becomes lower. Furthermore, a detector that has a sensor surface an electron beam is to enter needs to be operated at the ground potential. Therefore, if the potential of the sample is high, the ripple accuracy of the sensor is too low. When a high-potential electron beam enters the sensor image, the sensor image is severely damaged, and rapidly deteriorates. Therefore, such a detector is not suitable for practical use.

To solve the above problem, this embodiment, an electron beam inspection device comprises:

a primary electron optical system configured to irradiate a surface of a sample with an electron beam; and a secondary electron optical system configured to gather secondary electrons emitted from the sample and form an image with the secondary electrons on an electron sensor surface of a detector, wherein an electron image of the surface of the sample is obtained from a signal detected by the detector to inspect the sample, a cylindrical member is provided inside a lens tube into which the secondary electron optical system is incorporated, the cylindrical member being formed by stacking an inner layer conductor, an intermediate layer insulator and an outer layer conductor, an electron orbital path is formed inside the cylindrical member, and members constituting the secondary electron optical system are arranged outside the cylindrical member.

As the above structure of this embodiment is adopted, a device having a function to increase the reference voltage of the electron beam orbital path in the lens tube can be developed. The aberration increase due to the electron repulsion caused when the electron quantity of an electron beam is increased can be prevented, and accordingly, the aberration can be reduced while the processing capability is increased. A high voltage that is two to 30 times higher than that in a conventional device is used as the reference voltage in the lens tube, and thus, a high-energy electron beam image can be formed.

Further, the electron orbital path is formed inside the cylindrical member, and each magnetic field lens and each magnetic field aligner are arranged outside the cylindrical member. Accordingly, there is no need to form the respective conductors of magnetic field lenses in the stacked cross-section structure formed with conductors and an insulator. Thus, the coil size of the magnetic field lenses and the power consumption can be reduced, and the lens tube can have a small size.

In the electron beam inspection device having the above structure, to increase the insulation properties of the electron orbital path, flange portions that protrude outward are preferably formed at the upper and lower end portions of the insulator as the intermediate layer of the cylindrical member, and thus, the creepage distance between the end portions of the conductors serving as the inner and outer layers is preferably increased. Further, the insulator as the intermediate layer of the cylindrical member may be formed with an upper insulator having a thin step portion at its lower end portion, and a lower insulator having a thin step portion at its upper end portion. As the step portions are joined to each other, the cylindrical member is formed.

In the inspection device having the above structure, wider portions having a greater diameter than the cylindrical member are preferably formed in the electron orbital path of the lens tube, and an exhaust pipe that is provided outside the lens tube and is connected to a vacuum pump is preferably connected to each of the wider portions by a connecting pipe.

In a case where the degree of vacuum in the electron orbital path is low, contaminated matter is generated due to a reaction between electrons and residual gas particles, and such contaminated matter might adhere to the inner wall of the orbital path, the aperture, or the sensor surface of the detector, resulting in performance degradation. According to this embodiment, in the electron orbital path, the cylindrical member is formed at the portions where the magnetic field lenses are disposed, and wide cross-section regions as the large-diameter wider portions are maintained at the other portions. Through the exhaust pipe connected to the respective wider portions, the air in the electron orbital path can be efficiently evacuated. Thus, a high degree of vacuum can be maintained in the electron orbital path, and performance degradation due to adherence of contaminated matter can be effectively prevented.

The exhaust pipe connected to the vacuum pump preferably has exhaust performance (conductance) five or more times higher than that in the electron orbital path of the lens tube.

In the inspection device having the above structure, an auxiliary small-size magnetic field lens is preferably provided in the vicinity of each magnetic field lens disposed outside the cylindrical member.

With this arrangement, when an electron beam or an electron image rotates due to an operation of a magnetic field lens, the small-size magnetic field lens is activated to rotate the position of the electron beam or the electron image in predetermined X- and Y-directions. Thus, the position of the electron beam or the electron image can be adjusted.

BRIEF DESCRIPTION OF DRAWINGS

Figure 1:
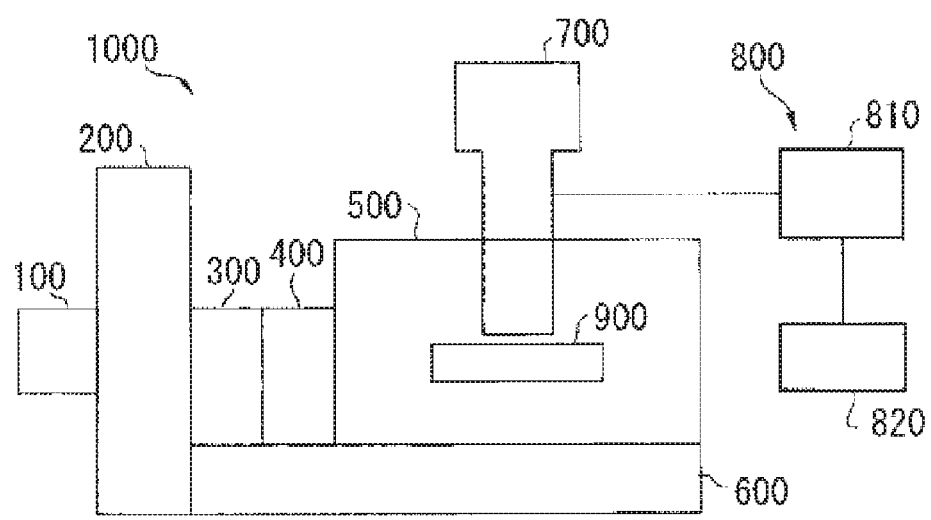
FIG. 1 is a diagram schematically showing the configuration of an electron beam inspection device according to an embodiment.
Figure 2:
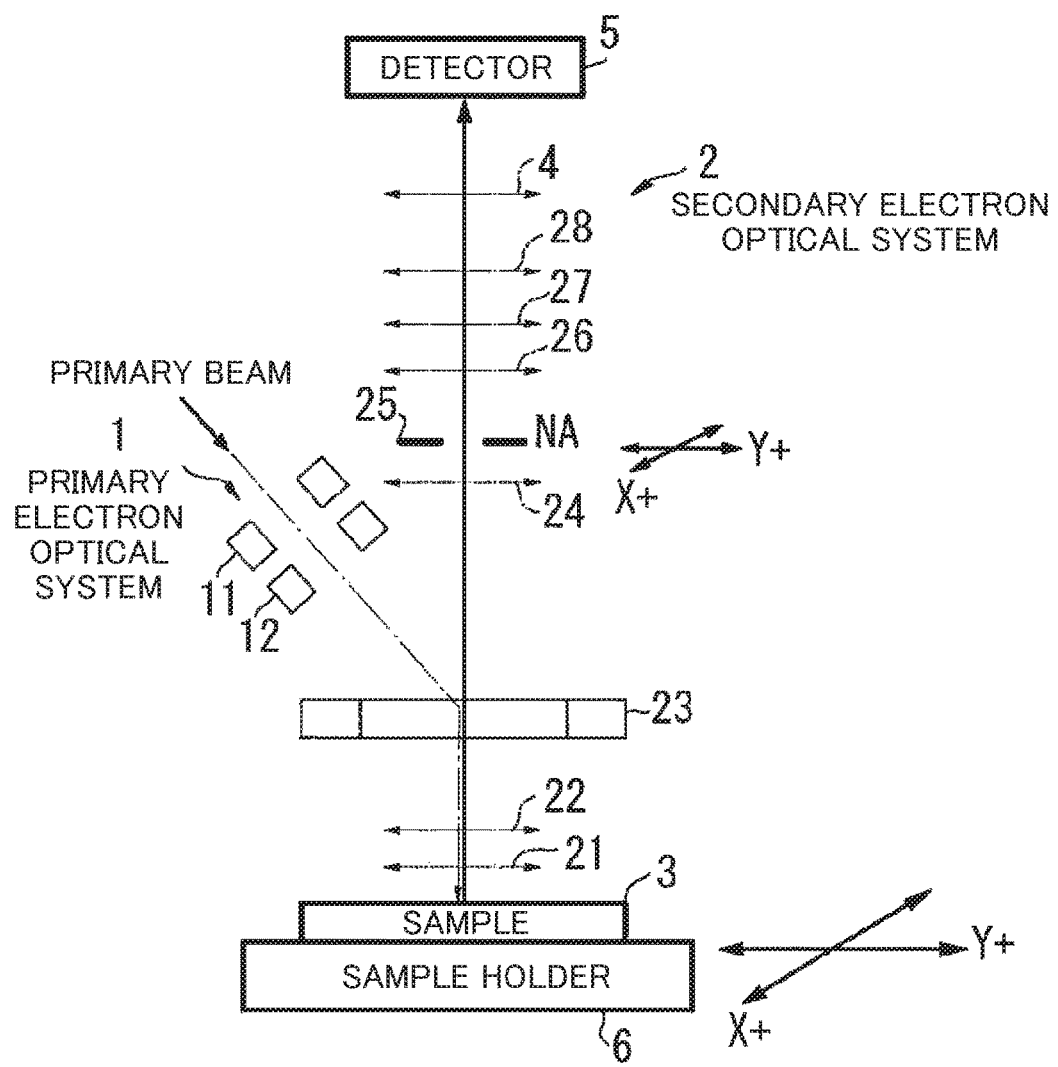
FIG. 2 is a diagram schematically showing the configuration of the portion extending from the electron column to the stage in the electron beam inspection device show in FIG. 1.
Figure 3:
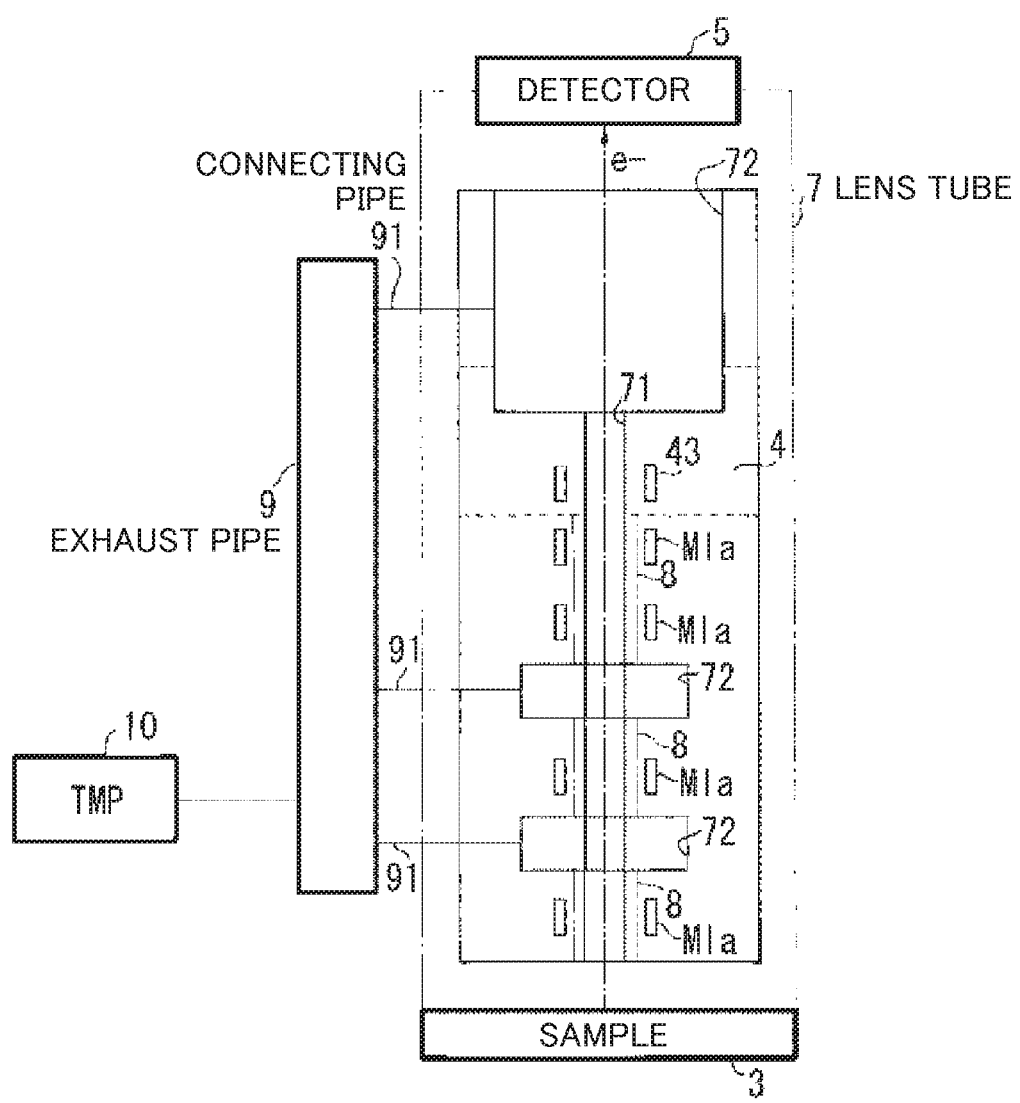
FIG. 3 is a diagram schematically showing the lens tube.
Figure 4:
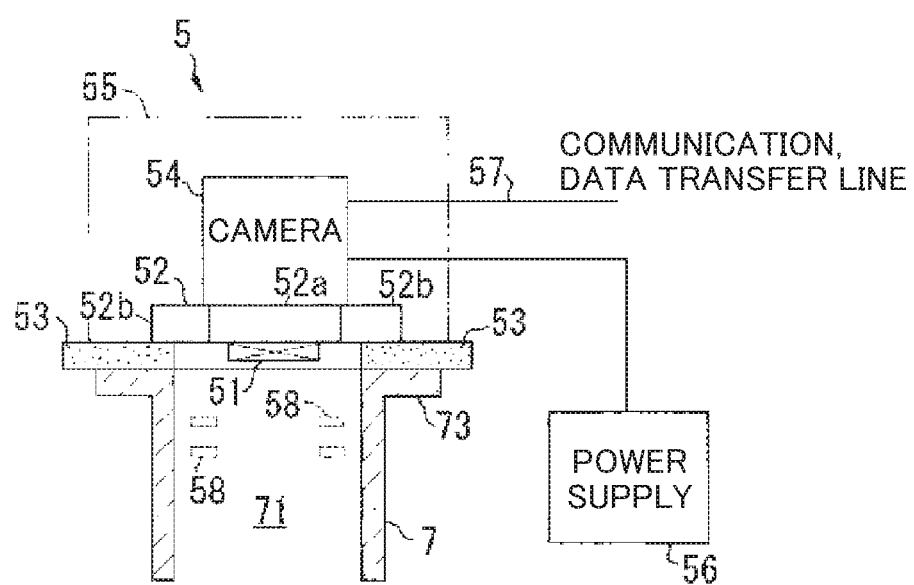
FIG. 4 is a diagram schematically showing the detector.
Figure 5:
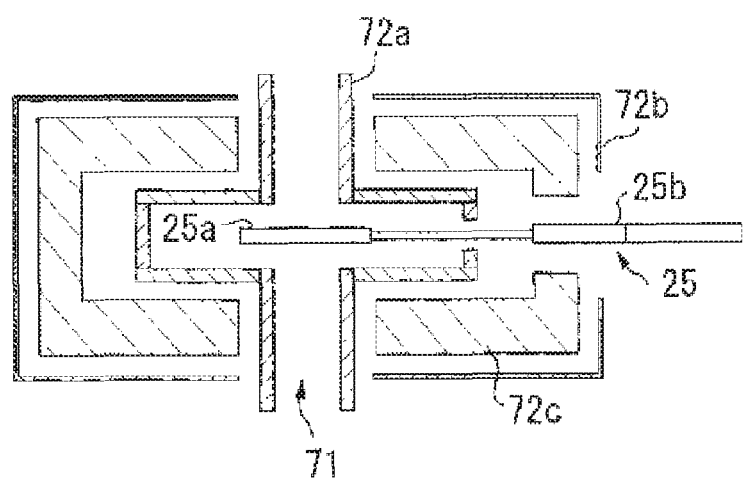
FIG. 5 is a diagram schematically showing the configuration of the NA aperture mechanism.
Figure 6:
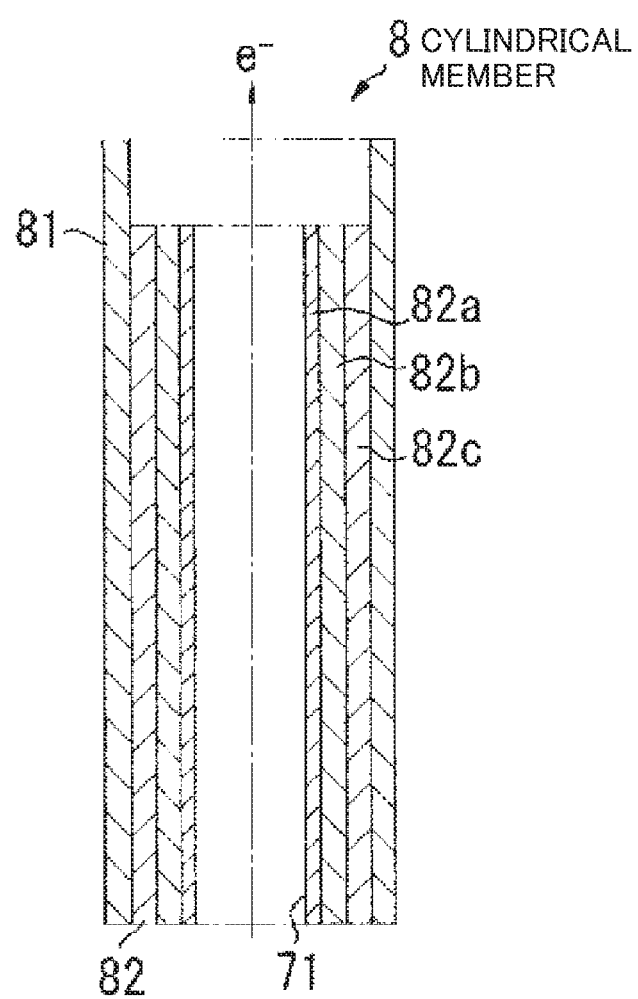
FIG. 6 is a cross-sectional diagram schematically showing an example configuration of a cylindrical member.
Figure 7:
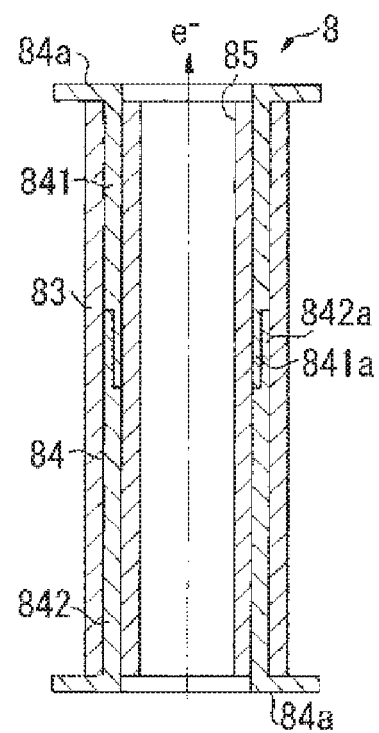
FIG. 7 is a cross-sectional diagram schematically showing another example configuration of a cylindrical member.
Figure 8:
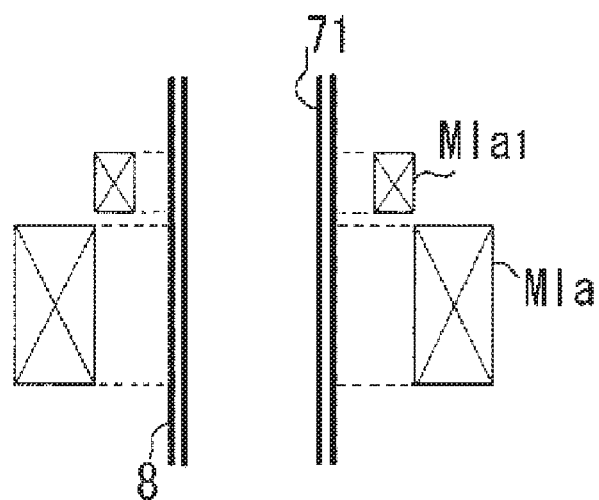
FIG. 8 shows a state where a magnetic field lens and a small-size magnetic field lens are arranged.

FIG. 1 is a diagram schematically showing the configuration of an electron beam inspection device according to an embodiment;

FIG. 2 is a diagram schematically showing the configuration of the portion extending from the electron column to the stage in the electron beam inspection device show in FIG. 1;

FIG. 3 is a diagram schematically showing the lens tube;

FIG. 4 is a diagram schematically showing the detector;

FIG. 5 is a diagram schematically showing the configuration of the NA aperture mechanism;

FIG. 6 is a cross-sectional diagram schematically showing an example configuration of a cylindrical member;

FIG. 7 is a cross-sectional diagram schematically showing another example configuration of a cylindrical member;

FIG. 8 shows a state where a magnetic field lens and a small-size magnetic field lens are arranged; and FIG. 9 is a cross-sectional view of an example of a conventional electrostatic deflector.

This embodiment is now described, with reference to the accompanying drawings.

FIG. 1 schematically shows the entire configuration of an electron beam inspection device of this embodiment applied to a projection observation instrument that inspects a semiconductor circuit pattern, for example. As shown in the drawing, an electron beam inspection device 1000 includes a sample carrier (a load boat) 100, a mini-environment 200, a load lock 300, a transfer chamber 400, a main chamber 500, a vibration isolation table 600, an electron column 700, a processing unit 800 including an image processing unit 810 and a control unit 820, and a stage 900. The electron column 700 is attached to an upper portion of the main chamber 500.

A sample such as a semiconductor circuit to be inspected is stored in the sample carrier 100. A conveyance robot, a sample alignment device, a clean air supply mechanism, and the like (not shown) are provided in the air in the mini-environment 200. The sample in the sample carrier 100 is conveyed into the mini-environment 200, and is subjected to an alignment process by the sample alignment device therein. The aligned sample is conveyed to the load lock 300 by the conveyance robot in the air.

When the air is evacuated from the load lock 300 by a vacuum pump (not shown), and the pressure becomes equal to or lower than a certain value (1 Pa, for example), the sample is conveyed to the main chamber 500 by a conveyance robot (not shown) in a vacuum in the transfer chamber 400. As a conveyance robot is provided in the transfer chamber 400 that is always in a vacuum state, generation of particles due to pressure fluctuations can be minimized.

The stage 900 that moves in the X-direction, the Y-direction, and the θ-direction (a rotational direction) is set inside the main chamber 500. A sample holder 6 that will be described later is placed on the stage 900, and the sample conveyed from the transfer chamber 400 into the main chamber 500 is held on the stage 900 by the sample holder 6. The main chamber 500 is controlled to maintain a vacuum state by a vacuum control system (not shown). The main chamber 500 is placed, together with the load lock 300 and the transfer chamber 400, on the vibration isolation table 600, so that vibration from the floor is not transmitted to the main chamber 500.

One electron column 700 is also attached to the main chamber 500. A detection signal from the electron column 700 is sent to the image processing unit 810, and is processed therein. The control unit 820 controls the image processing unit 810 and the like. Under the control of the control unit 820, the image processing unit 810 can perform both on-time signal processing and off-time signal processing. On-time signal processing is performed while inspection is being conducted. In a case where off-time signal processing is performed, only an image is obtained, and signal processing is performed later.

Data processed by the image processing unit 810 is saved on a recording medium such as a hard disk or a memory, and, if necessary, can be displayed on a monitor on a console. The data to be displayed is an observation image, an inspection region, a defect map, a defect size distribution/map, a defect classification, and a patch image, for example.

FIGS. 2 and 3 schematically show the configuration of the electron column 700 including the stage 900 set in the main chamber 500. In the drawings, reference numeral 1 indicates a primary-electron optical system, reference numeral 2 indicates a secondary electron optical system, reference numeral 3 indicates a sample, reference numeral 4 indicates a beam corrector, reference numeral 5 indicates a detector, reference numeral 6 indicates a sample holder, reference numeral 7 indicates a lens tube, reference numeral 8 indicates cylindrical members, reference numeral 9 indicates an exhaust pipe, and reference numeral 10 indicates a vacuum pump.

The primary electron optical system 1 includes an electron gun (not shown) that is an electron beam supply means, a lens 11 that controls the shape of an electron beam, and an aligner 12 that controls the traveling direction of the electron beam. The primary electron optical system 1 is designed to adjust the shape of an electron beam emitted from the electron gun with the lens 11 and further control the traveling direction of the electron beam with the aligner 12, to guide the electron beam to the sample 3 held on the sample holder 6.

The secondary electron optical system 2 includes an electrostatic electrode 21, a lens 22, a beam separator 23, a lens 24, a numerical aperture (NA) mechanism 25, zoom lenses 26 and 27, a projector lens 28, and the beam corrector 4. The secondary electron optical system 2 is designed so that secondary electrons emitted from the sample surface when an electron beam guided by the primary electron optical system 1 irradiates the sample 3 are guided to the sensor surface of the detector 5 with the respective lenses, and form an image thereon.

As shown in FIG. 3, magnetic field lenses Mia and magnetic field aligners (not shown) are provided near the respective lenses, to adjust the orbit of an electron beam to the center of each lens. The respective members constituting the secondary electron optical system 2, including the magnetic field lenses Mia and the magnetic field aligners, are arranged outside the cylindrical members 8 extending along the electron orbital path 71 of the lens tube 7.

Specifically, to reduce aberration to a far lower level than a conventional device, the secondary electron optical system 2 in this embodiment is designed as described below.

First, the electrostatic electrode 21 is placed above the sample 3, and the extraction voltage of the sample 3 (the difference between the voltages to be applied to the sample and the inner surfaces of the cylindrical members, or the difference between the voltages to be applied to the sample and the electrostatic electrode in a case where the electrostatic electrode is provided, for example) is set at a value that is 1.5 to 15 times higher than that in a conventional device, so that the energy of an electron beam passing through the electron orbital path 71 becomes higher.

Secondary electrons emitted from the sample surface or the region near the sample due to electron beam irradiation are gathered to form an image at the center portion of the beam separator 23 by the lens 22, so that the aberration and distortion of the electron image due to the beam separator 23 is reduced.

Further, a crossover is formed in the position of the aperture of the NA mechanism 25 by the lens 24. After an image is enlarged at a predetermined magnification by the zoom lenses 26 and 27 and the projector lens 28 provided in the stage immediately after the NA mechanism 25, the image formation position is corrected by the beam corrector 4 so that a high-precision electron image is formed on the detector 5.

The detector 5 is designed to be able to rotate an appropriate degree of angle on the sensor surface, using a microchannel plate (MCP) that doubles secondary electrons, for example, a fluorescent plate that converts the doubled electrons into light, and a time delay integration (TDI)-CCD camera that captures the converted light signal as an image signal. The detector 5 also has a function to adjust the voltage of the sensor surface in the range of −10 to +10 kV, for example, to an appropriate voltage for the extraction voltage of the sample 3.

The electron image formed on the sensor surface of the detector 5 is converted into an electrical signal by the detector 5, and image data is created. The image data is sent to the image processing unit 810, and is subjected to an inspection process to determine defects in the sample 3, for example. The transfer of the data from the detector 5 to the image processing unit 810 is conducted through an insulated cable 57 formed with an optical fiber, as shown in FIG. 4. With this, low-noise and secure communication and data transfer can be performed between devices. The detector 5 may be formed with an electron beam (EB)-CCD camera or an EB-TDI sensor.

The sample holder 6 is formed with an electrostatic chuck provided on the stage 900, and the sample 3 is placed on the electrostatic chuck. Alternatively, the sample 3 is placed on a pallet or a jig, and is then held on the electrostatic chuck. The sample mounting surface of the sample holder 6 can be moved in the X-direction, the Y-direction, and the Z-direction (θ: a rotational direction) by the stage 900, while holding the sample 3.

As shown in FIG. 3, the lens tube 7 includes the electron orbital path 71 that is a space through which primary electrons traveling from the primary electron optical system 1 toward the sample 3 and secondary electrons emitted from the sample 3 toward the detector 5 pass. The respective members of both of the optical systems are incorporated into the lens tube 7.

The cylindrical members 8 are placed on the electron orbital path 71 extending from the sample 3 to the detector 5, so that the electron orbital path 71 is formed inside the cylindrical members 8. The respective members constituting the secondary electron optical system 2, the respective magnetic field lenses Mia, and the respective magnetic field aligners (not shown) are arranged outside the cylindrical members 8.

Meanwhile, portions of the electron orbital path 71 of the lens tube 7 at which the cylindrical members 8 and the magnetic field lenses Mia are not arranged are wider portions 72 having a greater diameter than the cylindrical members 8. The respective wider portions 72 are connected to the exhaust pipe 9 provided outside the lens tube 7 by connecting pipes 91, and the air in the electron orbital path 71 is evacuated through the exhaust pipe 9 by the vacuum pump 10 to form a high vacuum state, so that the inside of the electron orbital path 71 can be maintained at a high degree of vacuum.

The NA mechanism 25 can be set at any of the wider portions 72 of the lens tube 7.

As shown in FIG. 6, each of the cylindrical members 8 has such a shape that an inner cylindrical tube 82 formed with a stack of conductors 82a and 82c as an inner layer and an outer layer, and an insulator 82b as an intermediate layer is integrally fitted in an outer cylindrical tube 81 that is a conductive tube made of a nonmagnetic metal.

In the inner cylindrical tube 82 having a three-layer structure formed with a conductor, an insulator, and a conductor, the conductor 82c as the outer layer is grounded, so that a high voltage of 10 to 100 kV can be applied to the conductor 82a as the inner layer. Ceramic or insulating resin, for example, can be used as the insulator 82b of the inner cylindrical tube 82. For example, polyimide resin has a withstand voltage of 100 kV/mm or higher. Even in a case where 100 kV is applied to the conductor 82a as the inner layer while the conductor 82c as the outer layer is grounded as described above, insulation is maintained as long as the layer in between has a thickness of 0.5 mm or greater. Therefore, polyimide resin is suitable as the insulator 82b.

In another example of a cylindrical member 8, as shown in FIG. 7, an insulator 84 and a conductor 85 are stacked inside a cylindrical tube 83 that is a conductive tube made of a nonmagnetic metal as in the above described example. In this manner, a cylindrical tube having a three-layer structure formed with a conductor, an insulator, and a conductor is formed. Further, flange portions 84a that protrude outward from the end portions of the cylindrical tube 83 are formed at the upper and lower end portions of the insulator 84. With this arrangement, the spatial distance and the creepage distance between the end portions of the conductor 85 as the inner layer at a high potential and the cylindrical tube 83 at the ground potential become longer, because the flange portions 84a, 84a of the insulator 84 exist in between. Thus, insulation can be maintained without fail.

In a case where the conductor 85 as the inner layer is connected to an upper portion or a lower portion of a high-pressure pipe, such as a case where the cylindrical members 8 are vertically connected to one another, the end portions of the conductor 85 protrude outward so as to maintain junction areas at the connecting portions. To cope with such a structure, the flange portions 84a need to be formed at the end portions of the insulator 84 in such as manner as to overlap with the protruding end portions of the conductor 85.

Also, as shown in FIG. 7, the insulator 84 includes an upper insulator 841 having a thin step portion 841a at its lower end portion, and a lower insulator 842 having a thin step portion 842a at its upper end portion. The step portions 841a and 842a are joined to each other, so that a sufficiently long creepage distance is maintained between the upper and lower insulators 841 and 842, with the step portions 841a and 842a being interposed in between. The step portions 841a and 842a are joined and fixed to each other with a resin adhesive, so that a cylindrical member 8 having a stronger insulating structure can be formed.

The creepage distance between the end portions of the conductor 85 and the cylindrical tube 83 having the flange portions 84a of the insulator 84 in between, and the creepage distance between the upper and lower insulators 841 and 842 having the step portions 841a and 842a in between are preferably 50 mm or longer in a case where there is a potential difference of 50 kV between the conductor 85 as the inner layer and the cylindrical tube 83 as the outer layer. That is, to maintain insulation, a creepage distance of 1 mm or longer is preferably set for a potential difference of 1 kV.

Further, as shown in FIG. 2, the beam position corrector 4 is provided in the electron orbital path 71 located in the step before the detector 5 in the lens tube 7.

As shown in FIG. 8, an auxiliary small-size magnetic field lens MIa1 is provided in the vicinity of each magnetic field lens MIa of the secondary electron optical system 2. When an electron beam or an electron image rotates due to an operation of a magnetic field lens MIa, the corresponding small-size magnetic field lens MIa1 is activated to rotate the position of the electron beam or the electron image in the predetermined X- and Y-directions. Thus, position adjustment can be performed.

An inspection of the sample 3 using the inspection device having such a configuration is conducted as follows. A high voltage is applied to the electron orbital path 71, to increase the amount of electron energy. The sample 3 is then irradiated with an electron beam emitted from the electron gun, and the secondary electrons emitted from the sample surface are gathered to form an image on the sensor surface of the detector 5. Thus, the electron image of the sample surface is obtained.

To perform an inspection operation to successively obtain electron images with the detector 5, the position of each electron image is corrected in the X- and Y-directions through the procedures described below.

First, a Y-direction pattern along the vertical line of a pattern of the sample 3 is selected. The stage 900 is moved, together with the sample holder 6, in the Y-direction of the selected pattern, or in the X- and Y-directions. The position of the electron image is then rotated by the small-size magnetic field lens MIa1 so as to substantially conform to the Y-direction of the sensor of the detector 5 with an error of ±1 degree or smaller, for example. The rotation mechanism of the detector 5 is then activated to perform fine adjustment to the Y-direction, and correct the position of the electron image that enters the sensor surface. The electron image is then captured, and fine adjustment is performed to reduce the X-direction difference in the position of the vertical line.

The amount of correction of positional shift caused by beam vibration in the X- and Y-direction is then adjusted by the beam position corrector 4, so that the positional shift of the electron image due to the stage vibration (in the X- and Y-directions) can be minimized. Thus, a high MTF is achieved, and a high-resolution, high-contrast electron image of the sample 3 can be obtained.

As described above, the electron beam inspection device of this embodiment has been developed to achieve a technical objective that is to enable fine structure inspection and analysis with higher degrees of accuracy and at higher speeds in a projection inspection device that forms a two-dimensional inspection image on the sensor surface of a detector.

To achieve such a technical objective, the reference voltage in the electron beam orbital path needs to be set at a high value, and the energy of an electron beam that enters the sensor surface needs to be increased so that a high-precision, low-aberration inspection image captured by a projection technique can be obtained. However, in a conventional inspection device that is incorporated into a production line compliant with a mass-production system, if the reference voltage in the lens tube is set at a high value, the device becomes too large for practical use. Therefore, such a method is not used in conventional inspection devices.

As for this embodiment, on the other hand, intensive studies on techniques to set the reference voltage in the electron orbital path at a high value without any increase in the size of the device have been made. As a result, it has been discovered that both an increase in the energy of an electron beam and a reduction in the size of the device can be achieved, if the cylindrical members that are to form the electron orbital path are placed inside the lens tube, and the reference voltage in the lens tube is set at a high value, while the members constituting the secondary electron optical system are arranged outside the cylindrical members. In this manner, the device of this embodiment has been developed.

Meanwhile, a detector having a conventional configuration cannot generate an effective electron image by increasing the energy of an electron beam and guiding the electron beam to the sensor surface.

An EB-TDI sensor and an EB-CCD sensor (an electron-injection internal tube) are preferable as the sensor of a detector, because such sensors have higher resolutions than the other types of sensors and can obtain high-resolution inspection images. However, if the energy of an incident electron beam is very high, these sensors deteriorate rapidly, and cannot be put into practical use. Further, if the voltage of the incidence plane of the sensor is lower than the potential of the electron beam in the electron orbital path, and the potential difference is large, the electron image formed on the sensor surface has large distortion due to the potential difference.

To solve the former one of the technical problems, the entire detector that includes a sensor and a camera is operated at the same potential with a floating power supply in this embodiment. To solve the latter one of the technical problems, a correcting electrode is placed before the sensor surface of the detector, and the potential of the electron beam entering the sensor surface is adjusted to an appropriate potential. Thus, high-precision, low-aberration imaging is enabled.

As described above, the electron beam inspection device of this embodiment adopts a novel technology by which the reference voltage in the cylindrical members inside the lens tube is set at a high value, the voltage of the detector is controlled with a floating power supply, and a correcting electrode is provided immediately before the incidence plane of the sensor. In this manner, fine structure inspection and analysis can be conducted with higher degrees of accuracy and at higher speeds by a projection technique. Such performance and functions cannot be achieved with any conventional device.

It should be noted that the form of each of the components of the electron beam inspection device described as an embodiment and shown in the drawings is merely an example. This embodiment is not limited to this example, and other appropriate modifications may be made to the embodiment.

From the first embodiment described above, the modes described below can be developed, for example.

[Appendix 1]. An electron beam inspection device comprising:
a primary electron optical system configured to irradiate a surface of a sample with an electron beam; and
a secondary electron optical system configured to gather secondary electrons emitted from the sample and form an image with the secondary electrons on an electron sensor surface of a detector,
wherein an electron image of the surface of the sample is obtained from a signal detected by the detector to inspect the sample,
a cylindrical member is provided inside a lens tube into which the secondary electron optical system is incorporated, the cylindrical member being formed by stacking an inner layer conductor, an intermediate layer insulator and an outer layer conductor, an electron orbital path is formed inside the cylindrical member,
and members constituting the secondary electron optical system are arranged outside the cylindrical member.

[Appendix 2}. The electron beam inspection device according to appendix 1, wherein flange portions protruding outward are formed at upper and lower end portions of the intermediate layer insulator of the cylindrical member, to increase a creepage distance between end portions of the inner layer conductor and the outer layer conductor.

[Appendix 3]. The electron beam inspection device according to appendix 1, wherein a plurality of wider portions having a greater diameter than the cylindrical member are formed in the electron orbital path of the lens tube, and an exhaust pipe is connected to each of the wider portions by a connecting pipe, the exhaust pipe being provided outside the lens tube and being connected to a vacuum pump.

[Appendix 4]. The electron beam inspection device according to appendix 1, wherein an auxiliary small-size magnetic field lens is disposed near a magnetic field lens provided outside the cylindrical member.

REFERENCE SIGNS LIST

1000 Electron beam inspection device
100 Sample carrier
200 Mini-environment
300 Load lock
400 Transfer chamber
500 Main chamber
600 Vibration isolation table
700 Electron column
800 Processing unit
810 Image processing unit
820 Control unit
900 Stage
1 Primary electron optical system
2 Secondary electron optical system
3 Sample
4 Beam position corrector
5 Detector
6 Sample holder
7 Lens tube
71 Electron orbital path
8 Cylindrical member
9 Exhaust pipe
10 Vacuum pump 2: Second Embodiment Technical Field This embodiment relates to an inspection device that inspects defects and the like in a pattern formed on the surface of the inspection object, and to an inspection method.

Background Art

A conventional semiconductor inspection device is a device compliant with 100-nm design rules and technologies. However, there are various samples as inspection objects, such as wafers, exposure masks, EUV masks, nanoimprint lithography (NIL) masks, and substrates. Therefore, there is a demand for devices and technologies compliant with design rules for samples of 5 to 30 nm in size. In this regard, there is the need to comply with the generation involving 5- to 30-nm L/S (line/space) or hp (half pitch) nodes in patterns. In a case where such samples are inspected with an inspection device, it is necessary to achieve a high resolution.

Here, "samples" are exposure masks, EUV masks, nanoimprint masks (and templates), semiconductor wafers, substrates for optical elements, substrates for optical circuits, and the like. The samples include samples with patterns and samples without patterns. The samples with patterns include samples with surface roughness and samples without surface roughness. The patterns on the samples without surface roughness are formed with different materials. The samples without patterns include samples coated with an oxide film and samples without oxide film coating.

As a conventional semiconductor inspection device, there is a known electron beam inspection device including an electronic optical device that implements an electron image follow-up method. The electronic optical device synchronizes movement of a sample moving with continuous movement of a stage with a deflecting means deflecting the orbital path of a beam (hereinafter referred to as the secondary beam) obtained by unidirectionally accelerating secondary electrons emitted from the sample, and controls the movement of the sample and the deflection of the orbital path. By doing so, the electronic optical device holds an image of the secondary beam on a two-dimensional CCD sensor, and, daring the synchronization period, projects an image of the same detection portion of the sample onto the same portion of the two-dimensional CCD sensor (see JP 2007-294850 A, for example).

In such a conventional inspection device, secondary electrons are required to have a high acceleration potential, so as to achieve both a higher resolution and a higher throughput. It is difficult for an electrostatic lens to form a lens of an optical system having a higher acceleration potential than 5 keV, and therefore, an electromagnetic lens is used as a lens of such an optical system. To achieve a higher resolution, an electromagnetic lens of a magnetic field immersion type is used as the objective lens of the secondary optical system. An electromagnetic lens of a magnetic field immersion type is a lens designed so that an object plane, a focal point, or an image surface enters (or is immersed in) a magnetic field generated with a lens coil.

Summary of this Embodiment

Problem to be Solved by this Embodiment

However, where an electromagnetic lens of a magnetic field immersion type is used as the objective lens of the secondary optical system, the secondary electron quantity decreases dramatically in the region surrounding the field of view, and the burring in the surrounding region is much larger than the value predicted from the optical design. Since these phenomena were not observed in optical designs based on the aberration theories, detailed orbit calculations were performed. The results of the calculations reveal that, of the orbital paths starting from a lens magnetic field, the orbital paths that start from positions not located and extend parallel to the optical axis do not intersect with the optical axis. The distance of each orbital path from the optical axis at the location closest to the optical axis is proportional to the distance (object height) from the optical axis at the starting position (object plane). Therefore, when the aperture angle is adjusted with an aperture stop placed in an optical path by a conventional method, a beam with a great object height cannot pass through the aperture stop, unless the beam has a small signal amount and a large aperture angle. As a result, the secondary electron quantity becomes smaller, and the aberration that depends on the aperture angle becomes greater. This leads to larger blurring than predicted from the design.

This embodiment has been developed in view of the above problem, and aims to provide an inspection device that includes an objective lens in which secondary electrons emitted parallel to the optical axis of a secondary optical system from a position not located on the optical axis intersect with the optical axis at one point.

Solution to Problem

According to the present embodiment, an inspection device that inspects a sample, the inspection device comprises:

a stage on which the sample is placed;

a primary optical system configured to irradiate the sample on the stage with an electron beam with a planar shape of a predetermined size; and a secondary optical system configured to accelerate secondary electrons emitted from the sample upon irradiation with the electron beam, guide the secondary electrons to a detector, and projecting an image on the detector, the secondary optical system comprising an objective lens, wherein the objective lens comprises:

a first coil;

a second coil disposed along an optical axis of the secondary optical system and parallel to the first coil, the second coil being asymmetrical with respect to the first coil; and a yoke formed with a magnetic material, the yoke comprising a first housing configured to house the first coil and a second housing configured to house the second coil, the yoke having a ring-like slit for each of the first housing and the second housing, each ring-like slit being located near the optical axis of the secondary optical system and being concentric with respect to the optical axis, there is a potential difference between the sample and the secondary optical system, and the secondary electrons emitted from the sample are accelerated to a predetermined potential in an electric field, and currents are applied to the first coil and the second coil, to cause a magnetic flux density of the second coil to cancel a magnetic flux density of the first coil at a position of a surface of the sample on the optical axis of the secondary optical system.

In this structure, at the position of the sample surface on the optical axis of the secondary optical system, the magnetic flux density of the first coil is canceled by the magnetic flux density of the second coil. Accordingly, secondary electrons emitted parallel to the optical axis from a position located not on the optical axis of the secondary optical system intersect with the optical axis at one point. Thus, it is possible to reduce or prevent occurrences of phenomena, such as a large decrease in the secondary electron quantity in a region surrounding the field of view, and a larger increase in blurring in the surrounding region than predicted from the optical design.

In the inspection device of this embodiment, the objective lens may include an acceleration electrode that is disposed between the yoke and the sample, and is formed with a nonmagnetic material.

As the acceleration electrode is provided in this structure, a sufficient acceleration voltage can be maintained, and the aberration can be reduced.

According to the present embodiment, an objective lens included in an inspection device that inspects a sample, the inspection device irradiating the sample on a stage with an electron beam with a planar shape of a predetermined size, guiding secondary electrons emitted from the sample upon irradiation with the electron beam to a detector, and projecting an image on the detector, the objective lens comprises:

a first coil;

a second coil disposed along an optical axis of the secondary optical system and parallel to the first coil, the second coil being asymmetrical with respect to the first coil; and a yoke formed with a magnetic material, the yoke comprising a first housing configured to house the first coil and a second housing configured to house the second coil, the yoke having a ring-like slit for each of the first housing and the second housing, each ring-like slit being located near the optical axis of the secondary optical system and being concentric with respect to the optical axis, wherein there is a potential difference between the sample and the secondary optical system, and the secondary electrons emitted from the sample are accelerated to a predetermined potential in an electric field, and currents are applied to the first coil and the second coil, to cause a magnetic flux density of the second coil to cancel a magnetic flux density of the first coil at a position of a surface of the sample on the optical axis of the secondary optical system.

In this objective lens, at the position of the sample surface on the optical axis of the secondary optical system, the magnetic flux density of the first coil is canceled by the magnetic flux density of the second coil, as in the above described inspection device. Accordingly, it is possible to reduce or prevent occurrences of phenomena, such as a large decrease in the secondary electron quantity in a region surrounding the field of view, and a larger increase in blurring in the surrounding region than predicted from the optical design.

Effect of this Embodiment

According to this embodiment, it is possible to reduce or prevent occurrences of phenomena, such as a large decrease in the secondary electron quantity in a region surrounding the field of view, and a larger increase in blurring in the surrounding region than predicted from the optical design.

BRIEF DESCRIPTION OF DRAWINGS

Figure 10:
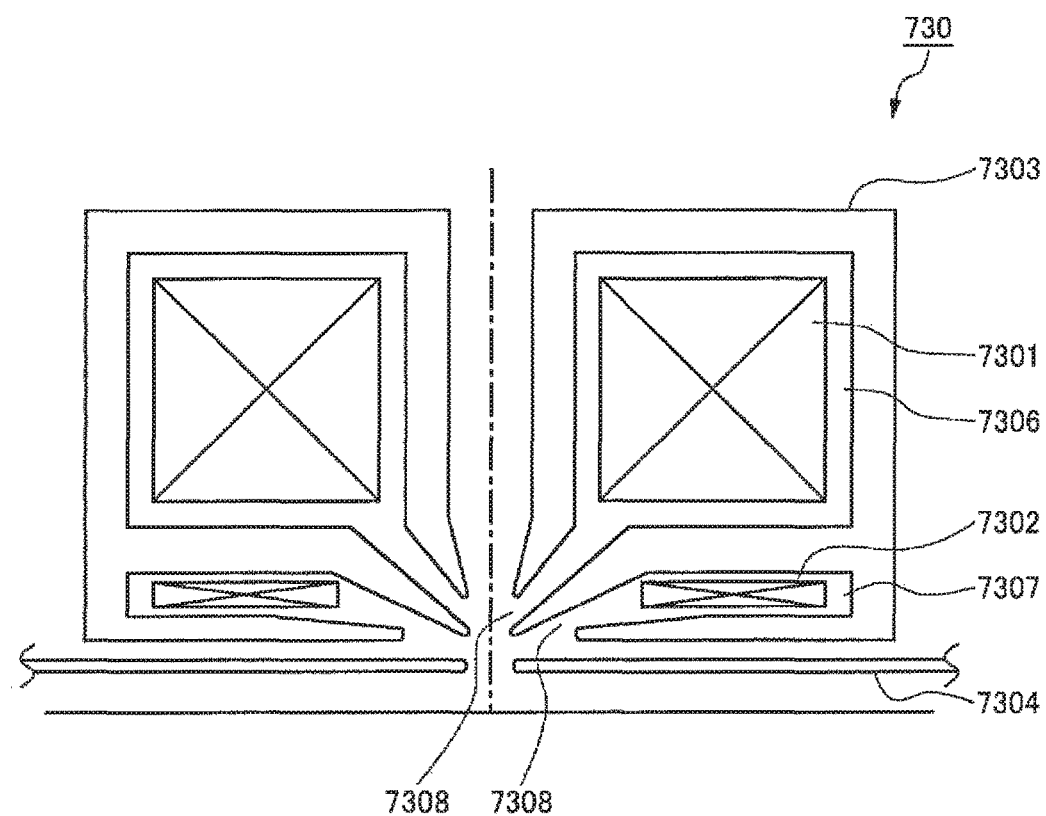
FIG. 10 is a diagram showing the structure of an objective lens according to an embodiment.
Figure 11:
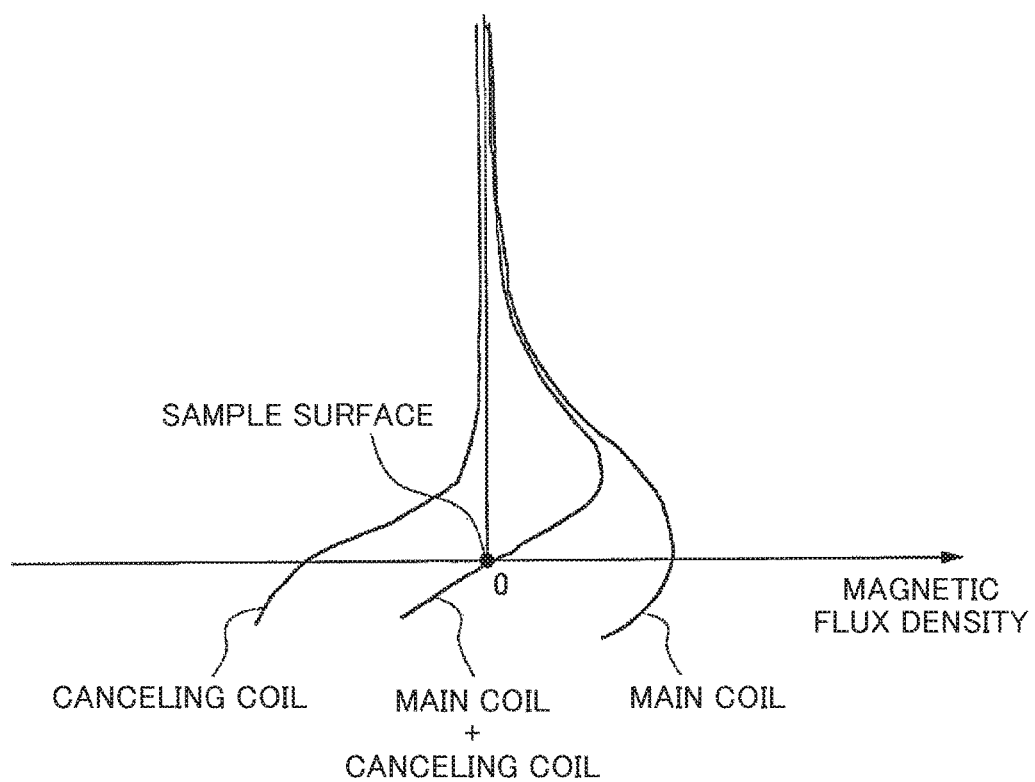
FIG. 11 is a graph showing magnetic flux densities of the objective lens according to an embodiment.

FIG. 10 is a diagram showing the structure of an objective lens according to an embodiment; and FIG. 11 is a graph showing magnetic flux densities of the objective lens according to an embodiment.

<Objective Lens>

FIG. 10 is a diagram showing the structure of an objective lens 730 to be used in a secondary optical system of an inspection device according to this embodiment. As shown in FIG. 10, the objective lens 730 includes a first coil 7301, a second coil 7302 (a canceling coil), a yoke 7303, and an acceleration electrode 7304. The first coil 7301 is the main coil, and the second coil 7302 is a canceling coil. The second coil 7302 is disposed along the optical axis of the secondary optical system so as to be parallel to the first coil 7301, and is located on the sample surface side of the first coil 7301 (the lower side in FIG. 10), for example. The yoke 7303 includes a first housing 7306 that houses the first coil 7301, and a second housing 7307 that houses the second coil 7302. The yoke 7303 has a ring-like slit 7308 for each of the housings. Each slit 7308 is located close to the optical axis of the secondary optical system, and is concentric with respect to the optical axis. The yoke 7303 is formed with a magnetic material. There is a potential difference between the sample and the secondary optical system, and secondary electrons emitted from the sample are accelerated to a predetermined potential in the electric field. The acceleration electrode 7304 is disposed between the yoke 7303 and the sample, and is located on the sample surface side of the yoke 7303 (the lower side in FIG. 10) in this case.

The second coil 7302 may be designed to be asymmetrical with respect to the first coil 7301. Specifically, the size and the number of turns of the second coil 7302 may differ from the size and the number of turns of the first coil 7301. For example, the size of the second coil 7302 may be smaller than the size of the first coil 7301, and the number of turns of the second coil 7302 may be smaller than the number of turns of the first coil 7301. The value of the current applied to the second coil 7302 may also be smaller than the value of the current applied to the first coil 7301. Further, the second coil 7302 is designed to generate a magnetic field that is the opposite of a magnetic field to be generated by the first coil 7301. For example, the turning direction of the second coil 7302 is the opposite direction from the turning direction of the first coil 7301 (in this case, the direction of the current applied to the second coil 7302 is the same as the direction of the current applied to the first coil 7301). Alternatively, the direction of the current applied to the second coil 7302 is the opposite direction from the direction of the current applied to the first coil 7301 (in this case, the turning direction of the second coil 7302 is the same as the turning direction of the first coil 7301). This objective lens 730 may be regarded as being formed with an asymmetric double-gap lens.

FIG. 11 is a graph showing magnetic flux densities of the objective lens 730 of this embodiment. As shown in FIG. 11, at the position of the sample surface on the optical axis of the secondary optical system (or on the sample surface), the magnetic flux density of the first coil 7301 is canceled by the magnetic flux density of the second coil 7302. In this case, on the sample surface, the sum of the magnetic flux density of the first coil 7301 and the magnetic flux density of the second coil 7302 is zero.

In the objective lens 730 of this embodiment, when the magnetic flux density of the first coil 7301 is canceled by the magnetic flux density of the second coil 7302 at the position of the sample surface on the optical axis of the secondary optical system, secondary electrons that are emitted from a position not located on the optical axis of the secondary optical system and travel parallel to the optical axis intersect with the optical axis at one point. In view of this, an aperture stop is formed at the point, so that the aperture angle distribution passing through the aperture stop becomes uniform over a wide field of view on the sample surface, and problems of uneven signal amounts and uneven aberration due to an uneven aperture angle distribution are not caused. At the same time, an object-side telecentric optical system can be formed.

As the objective lens 730 of this embodiment further includes the acceleration electrode 7304, a sufficient acceleration voltage can be maintained, and the aberration can be reduced.

Although an example of this embodiment has been described, the scope of this embodiment is not limited to the above example, and changes and modifications may be made as appropriate to the example within the scope claimed in this specification.

For example, in the above described embodiment, the sum of the magnetic flux density of the first coil 7301 and the magnetic flux density of the second coil 7302 is zero on a sample surface. However, the sum of the magnetic flux density of the first coil 7301 and the magnetic flux density of the second coil 7302 is not necessarily zero. Specifically, on the sample surface, the sum of the magnetic flux density of the first coil 7301 and the magnetic flux density of the second coil 7302 is may be a value close to zero. If secondary electrons emitted parallel to the optical axis from a position within the field of view of the secondary optical system are at a distance from the optical axis that is 20% or less of the aperture diameter at the position of the aperture stop, the problems of uneven signal amounts and uneven aberration due to an uneven aperture angle distribution are not caused, and an object-side telecentric optical system can be formed without trouble.

From the second embodiment described above, the modes described below can be developed, for example.

[Appendix 1] An inspection device that inspects a sample, the inspection device comprising:
  a stage on which the sample is placed;
  a primary optical system configured to irradiate the sample on the stage with an electron beam with a planar shape of a predetermined size; and
  a secondary optical system configured to accelerate secondary electrons emitted from the sample upon irradiation with the electron beam, guide the secondary electrons to a detector, and projecting an image on the detector, the secondary optical system comprising an objective lens, wherein
    the objective lens comprises:
    a first coil;
    a second coil disposed along an optical axis of the secondary optical system and parallel to the first coil, the second coil being asymmetrical with respect to the first coil; and
    a yoke formed with a magnetic material, the yoke comprising a first housing configured to house the first coil and a second housing configured to house the second coil, the yoke having a ring-like slit for each of the first housing and the second housing, each ring-like slit being located near the optical axis of the secondary optical system and being concentric with respect to the optical axis,
    there is a potential difference between the sample and the secondary optical system, and the secondary electrons emitted from the sample are accelerated to a predetermined potential in an electric field, and
    currents are applied to the first coil and the second coil, to cause a magnetic flux density of the second coil to cancel a magnetic flux density of the first coil at a position of a surface of the sample on the optical axis of the secondary optical system.

[Appendix 2] The inspection device according to appendix 2, wherein the objective lens comprises an acceleration electrode disposed between the yoke and the sample, the acceleration electrode being formed with a nonmagnetic material.

[Appendix 3] An objective lens included in an inspection device that inspects a sample,
  the inspection device irradiating the sample on a stage with an electron beam with a planar shape of a predetermined size, guiding secondary electrons emitted from the sample upon irradiation with the electron beam to a detector, and projecting an image on the detector,
  the objective lens comprising:
    a first coil;
    a second coil disposed along an optical axis of the secondary optical system and parallel to the first coil, the second coil being asymmetrical with respect to the first coil; and
    a yoke formed with a magnetic material, the yoke comprising a first housing configured to house the first coil and a second housing configured to house the second coil, the yoke having a ring-like slit for each of the first housing and the second housing, each ring-like slit being located near the optical axis of the secondary optical system and being concentric with respect to the optical axis, wherein
    there is a potential difference between the sample and the secondary optical system, and the secondary electrons emitted from the sample are accelerated to a predetermined potential in an electric field, and
    currents are applied to the first coil and the second coil, to cause a magnetic flux density of the second coil to cancel a magnetic flux density of the first coil at a position of a surface of the sample on the optical axis of the secondary optical system.

REFERENCE SIGNS LIST

1 Inspection device
2 Controller
30 Main housing
50 Stage device
55 Holder
571 Mirror
572 Laser interferometer
70 Electronic optical device
761 Detector
7611 Two-dimensional sensor
763 Image processor
72 Primary optical system
74 Secondary optical system
7211 Laser source
7212 Electric-light planar cathode
722 Lens
701 First nigh-voltage reference pipe
702 Second high-voltage reference pipe
703 Third high-voltage reference pipe
704 Fourth high-voltage reference pipe
730 Objective lens
749 High-speed deflector
742 NA aperture
726 ExB filter
750 Intermediate electrode
90 Deflection controller
7301 First coil
7302 Second coil
7303 Yoke 7304 Acceleration electrode
7306 First housing
7307 Second housing
7308 Slit 3: Third Embodiment Technical Field This embodiment relates to a Wien filter that is formed with an electric field and a magnetic field perpendicular to each other, and is an electron beam energy separator.

Background Art

As a conventional semiconductor inspection device, there is a known electron beam inspection device including an electronic optical device that implements an electron image follow-up method. The electronic optical device synchronizes movement of a sample moving with continuous movement of a stage with a deflecting means deflecting the orbital path of an electron beam (hereinafter referred to as the secondary beam) emitted from the sample upon electron irradiation of the sample, and controls the movement of the sample and the deflection of the orbital path. By doing so, the electronic optical device holds an image of the secondary beam on a two-dimensional CCD sensor, and, during the synchronization period, projects an image of the same detection portion of the sample onto the same portion of the two-dimensional CCD sensor (see JP 4332922 B1, for example).

Where the energy of incidence of an electron beam emitted to a sample (this electron beam will be hereinafter referred to as the primary beam) is several eV, there is a need to achieve a uniform current density in the emission field and a uniform incident angle distribution on the sample. Therefore, these requirements need to be taken into account when an electronic optical system is designed.

WO 2002/001596 A discloses the fact that the primary beam having an optical axis to be deflected by a Wien filter has different focusing properties in the electric field direction and in the magnetic field direction. However, if the deflection angle of the primary beam is as large as 45 degrees, too large a difference to be called "aberration" is caused.

Summary of this Embodiment

Problem to be Solved by this Embodiment

When an electronic optical system for the primary beam is designed, a difference caused in focusing properties between the electric field direction and the magnetic field direction as described in paragraph [0004] is preferably eliminated. It is more preferable to achieve such an effect with a single Wien filter. Although such an effect is achieved with a change in the angle of an electrode in WO 2002/001596 A, it is difficult to adopt such a technique in a Wien filter formed with the electromagnetic poles of a multipole.

Therefore, this embodiment has been made to effectively solve the above problems. This embodiment aims to provide a Wien filter that is formed with electromagnetic poles of a multipole, and reduces the difference in focusing properties of the primary beam between the electric field direction and the magnetic field direction.

Solution to Problem

According to one embodiment, provided is a Wien filter used in an inspection device that emits a primary beam to a sample and conducts inspection of the sample in accordance with a secondary beam generated from the sample, the Wien filter deflecting the primary beam entering from obliquely above in a vertically downward direction and emitting the deflected primary beam, the Wien filter emitting the secondary beam without deflecting the secondary beam entering from vertically below, the Wien filter comprising:

at least eight electromagnetic poles arranged at regular angular intervals about an optical axis of the secondary beam, the electromagnetic poles being formed with conductive members and soft magnetic members;

coils wound around the respective electromagnetic poles; and a shield member provided to cover circumferences of the electromagnetic poles, wherein potentials different from one another are applied to the respective electromagnetic poles, to generate a uniformly parallel electric field in a direction in which the primary beam is deflected, the uniformly parallel electric field being generated near the optical axis of the secondary beam, currents different from one another are applied to the respective coils, to generate a uniformly parallel magnetic field in a direction in which the primary beam is deflected, the uniformly parallel magnetic field being generated near the optical axis of the secondary beam, a first beam hole, a second beam hole, and a third beam hole are formed in the shield member, the primary beam entering the first beam hole from obliquely above, the primary beam deflected by the electromagnetic poles exiting from the second beam hole, the secondary beam generated from the sample entering the second beam hole, the secondary beam exiting from the third beam hole, and an exit plane of the first beam hole is not horizontal.

As the exit plane of the first beam hole is not horizontal, the focusing properties of the primary beam entering from obliquely above can be improved.

Preferably, an angle between the exit plane of the first beam hole and a horizontal plane is set in accordance with focusing properties of the primary beam in an electric field direction and focusing properties of the primary beam in a magnetic field direction.

An angle between the exit plane of the first beam hole and a horizontal plane may be set at a value with which a difference between focusing properties of the primary beam in an electric field direction and focusing properties of the primary beam in a magnetic field direction becomes smaller.

An angle between the exit plane of the first beam hole and a horizontal plane may be set at a value with which a difference between a focus position of the primary beam in an electric field direction and a focus position of the primary beam in a magnetic field direction becomes smaller.

The primary beam may enter the first beam hole from above in a 45-degree oblique direction, and an angle between the exit plane of the first beam hole and a horizontal plane may be approximately 90 degrees.

The electromagnetic poles may overlap one of a tetrapolar electric field and a tetrapolar magnetic field with the uniformly parallel electric field and the uniformly parallel magnetic field.

Effect of the Embodiment

According to this embodiment, primary beam focusing in two directions can be achieved, without the addition of a new optical element. Also, the shape of the shield member is simply changed, and there is no need to change the shapes of electrodes or magnetic poles in an asymmetric manner as in WO 2002/001596 A. Thus, focusing in two directions can be more easily achieved, and factors that might hinder the secondary beam from traveling in a straight line are eliminated.

BRIEF DESCRIPTION OF DRAWINGS

Figure 12:
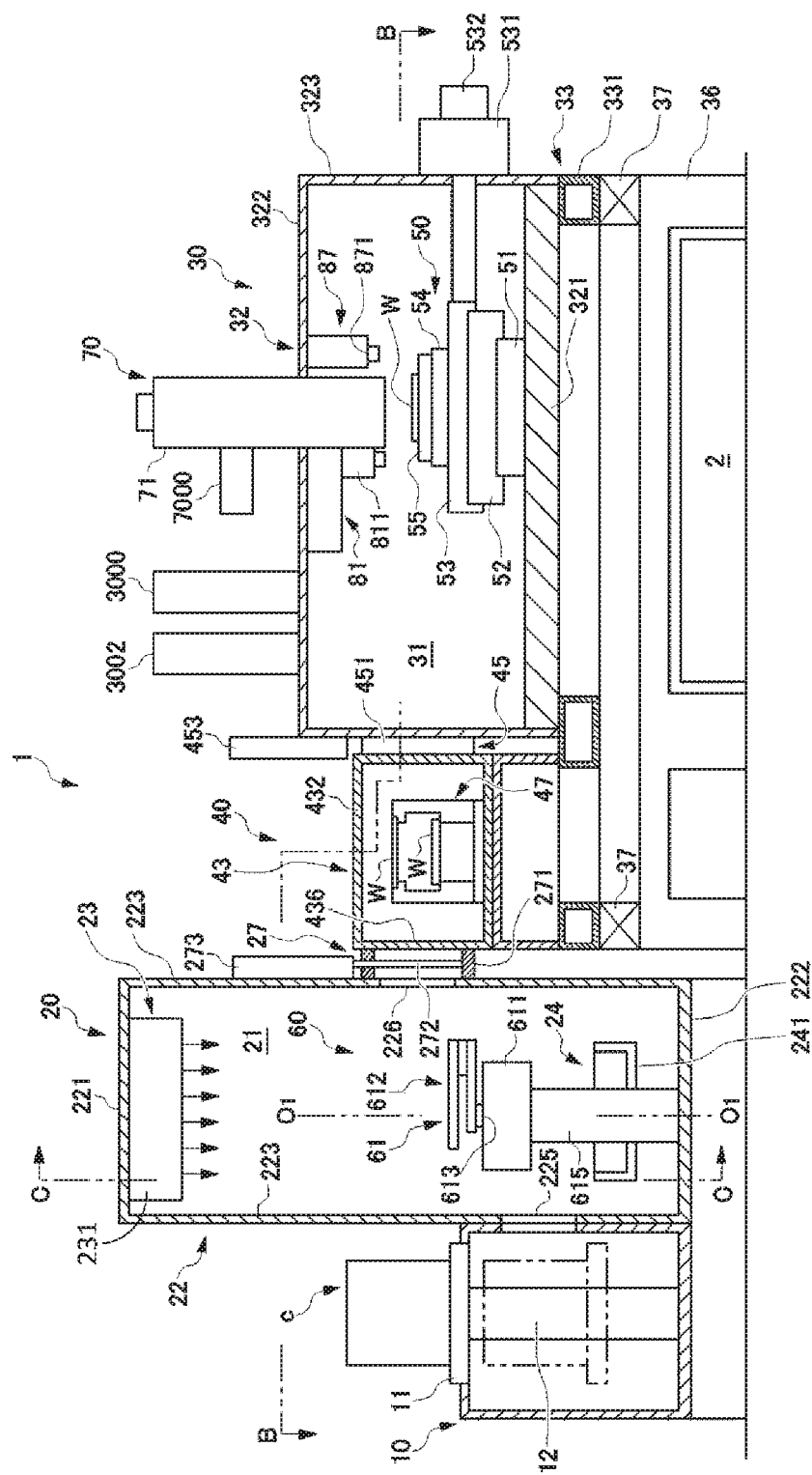
FIG. 12 is an elevation view of the principal components of an inspection device according to an embodiment.
Figure 13:
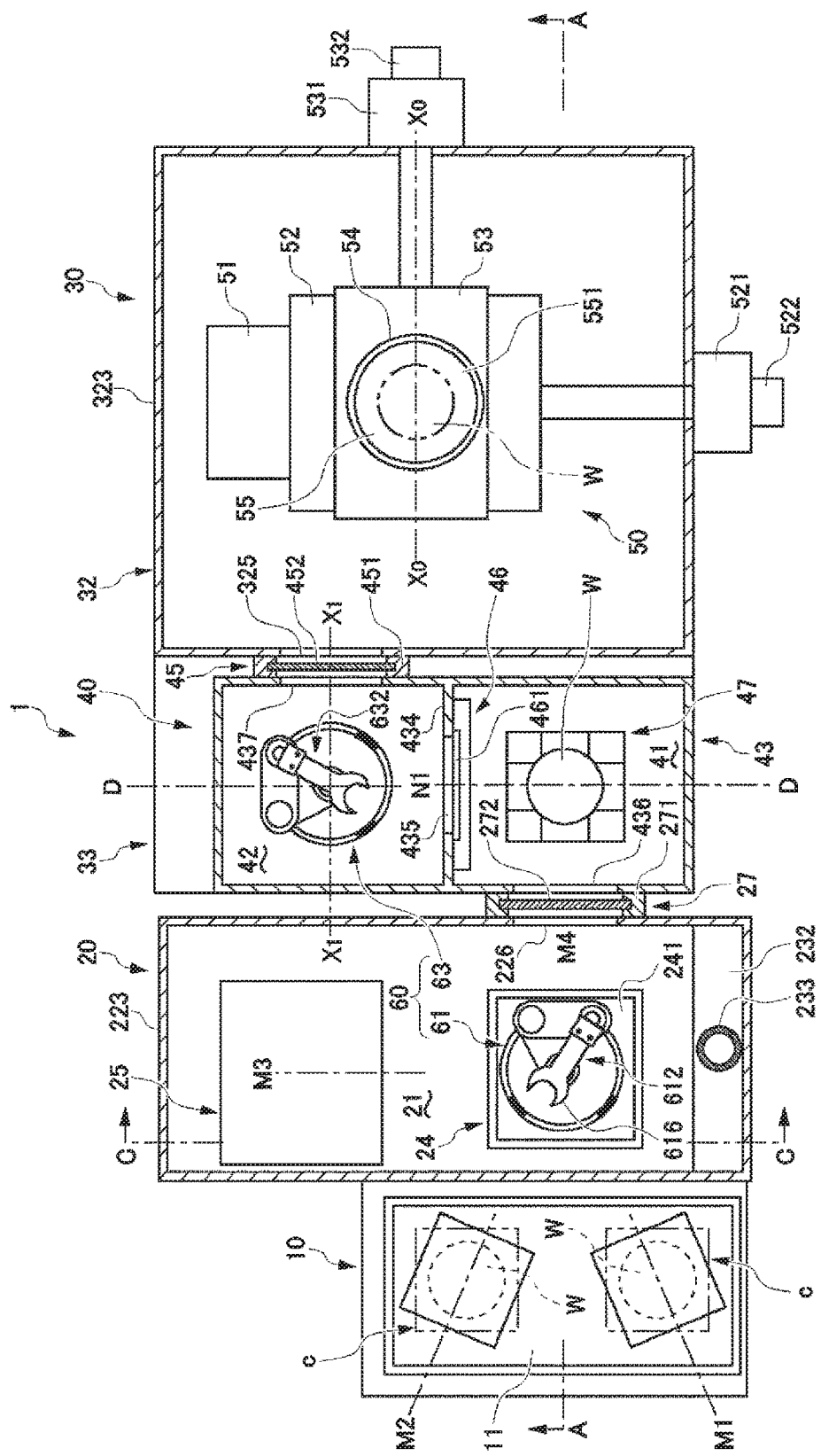
FIG. 13 is a plan view of the principal components of the inspection device shown in FIG. 12, and is a diagram of the inspection device seen along the line B-B defined in FIG. 12.
Figure 14:
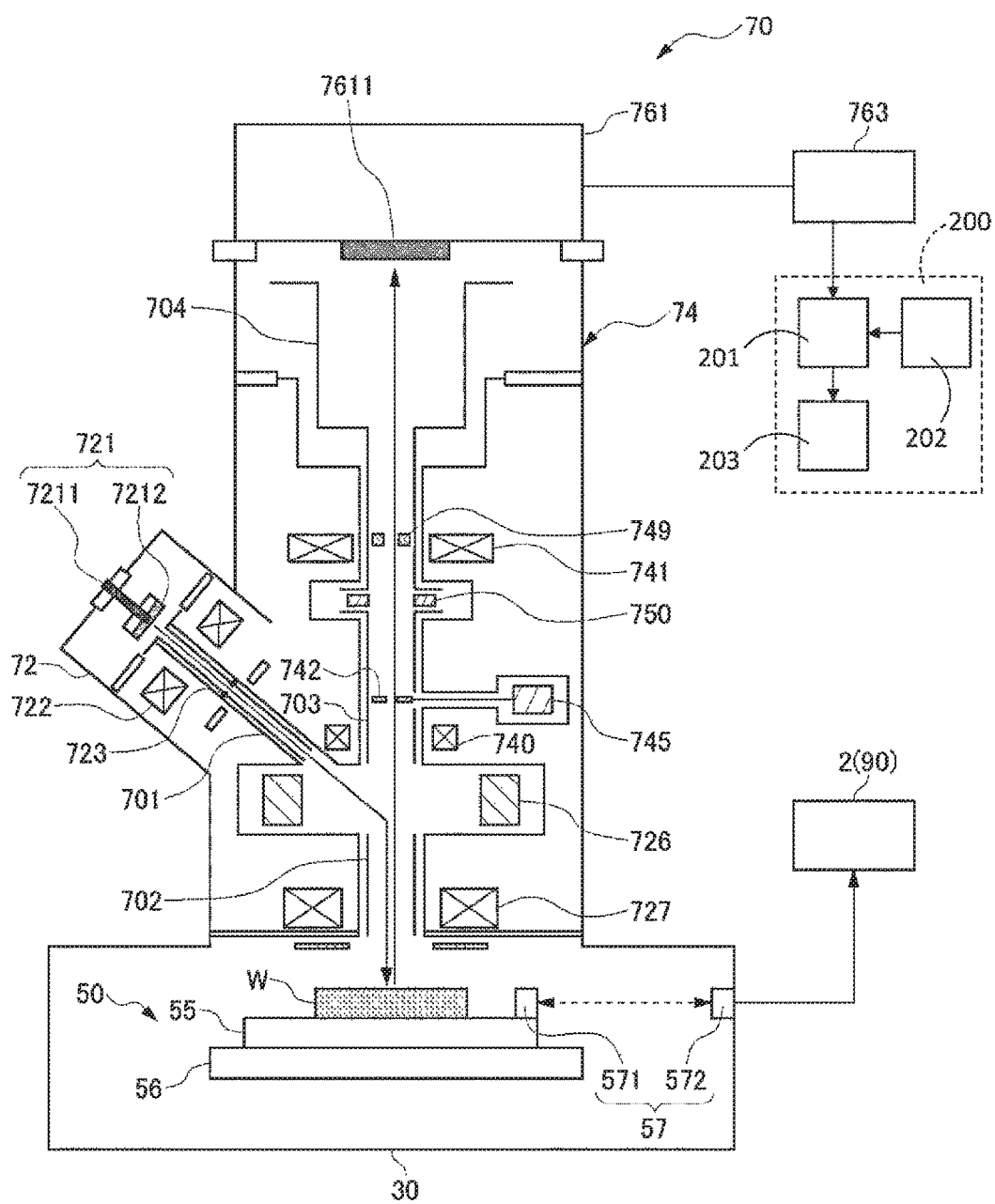
FIG. 14 is a diagram showing the configuration of an electronic optical device according to an embodiment.
Figure 15:
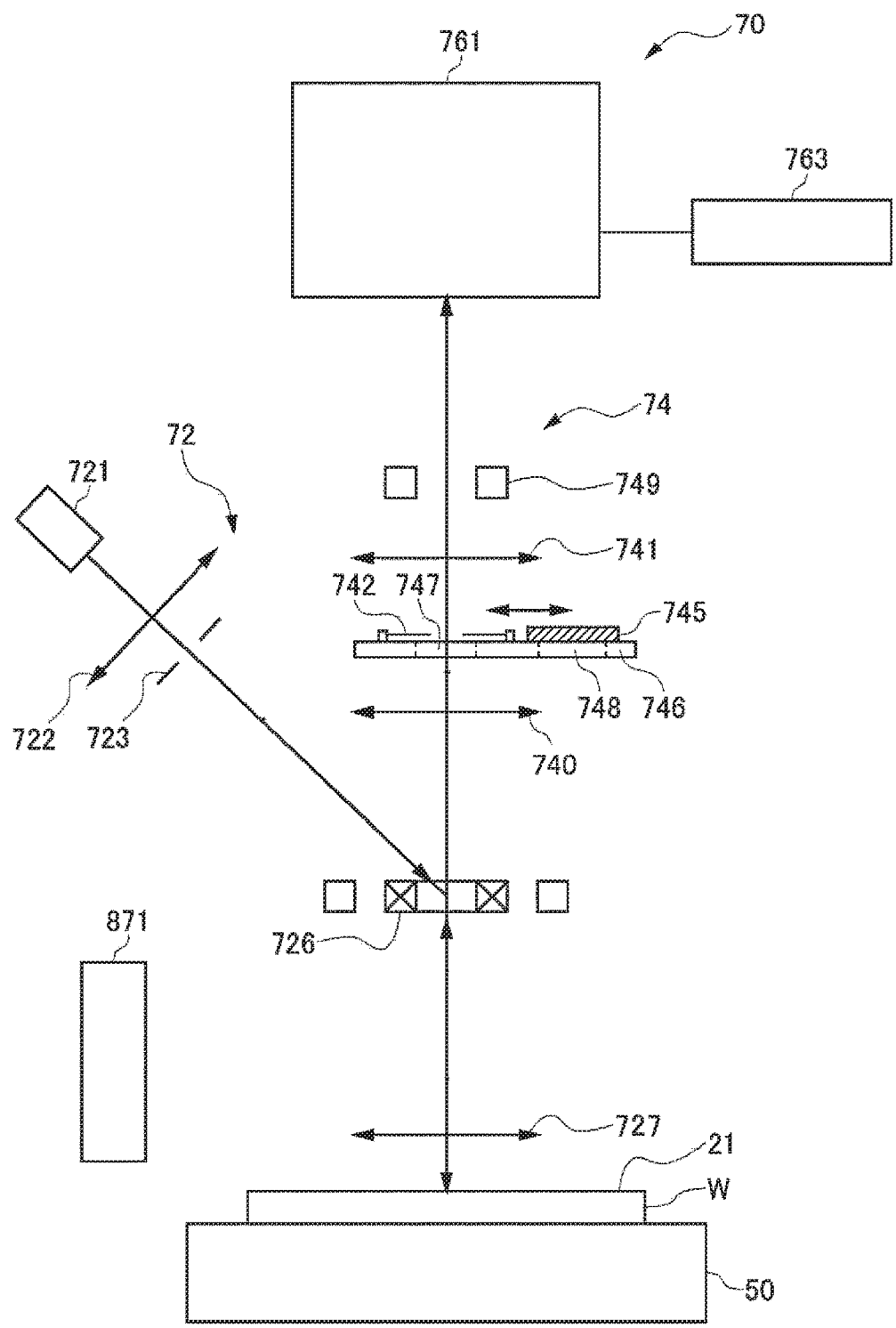
FIG. 15 is a diagram for explaining the beam path in the electronic optical device shown in FIG. 14.
Figure 16B:
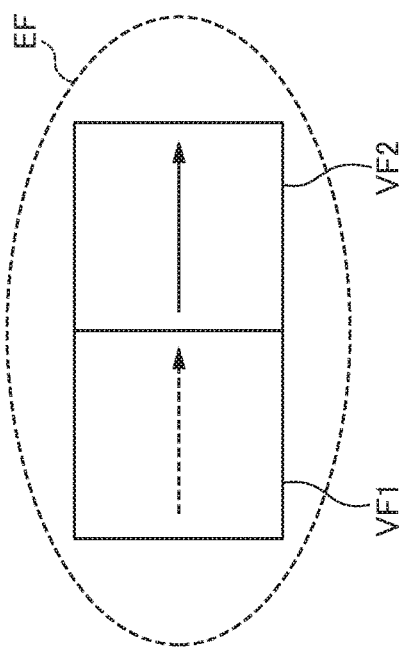
FIG. 16B is a diagram showing a relationship between an emission field and a viewing field according to an embodiment.
Figure 16C:
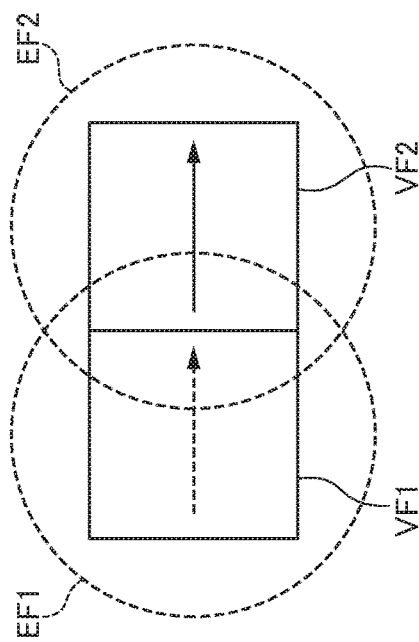
FIG. 16C is a diagram showing a relationship between an emission field and a viewing field according to an embodiment.
Figure 16A:
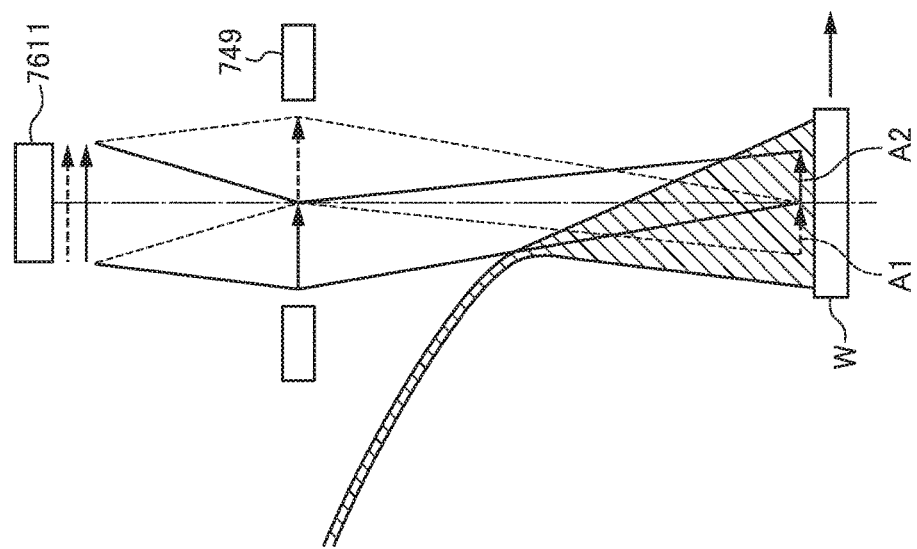
FIG. 16A is a diagram for explaining an operation to be performed by a high-speed deflector that deflects a secondary beam so that the secondary beam follows the movement of a wafer according to an embodiment.
Figure 17:
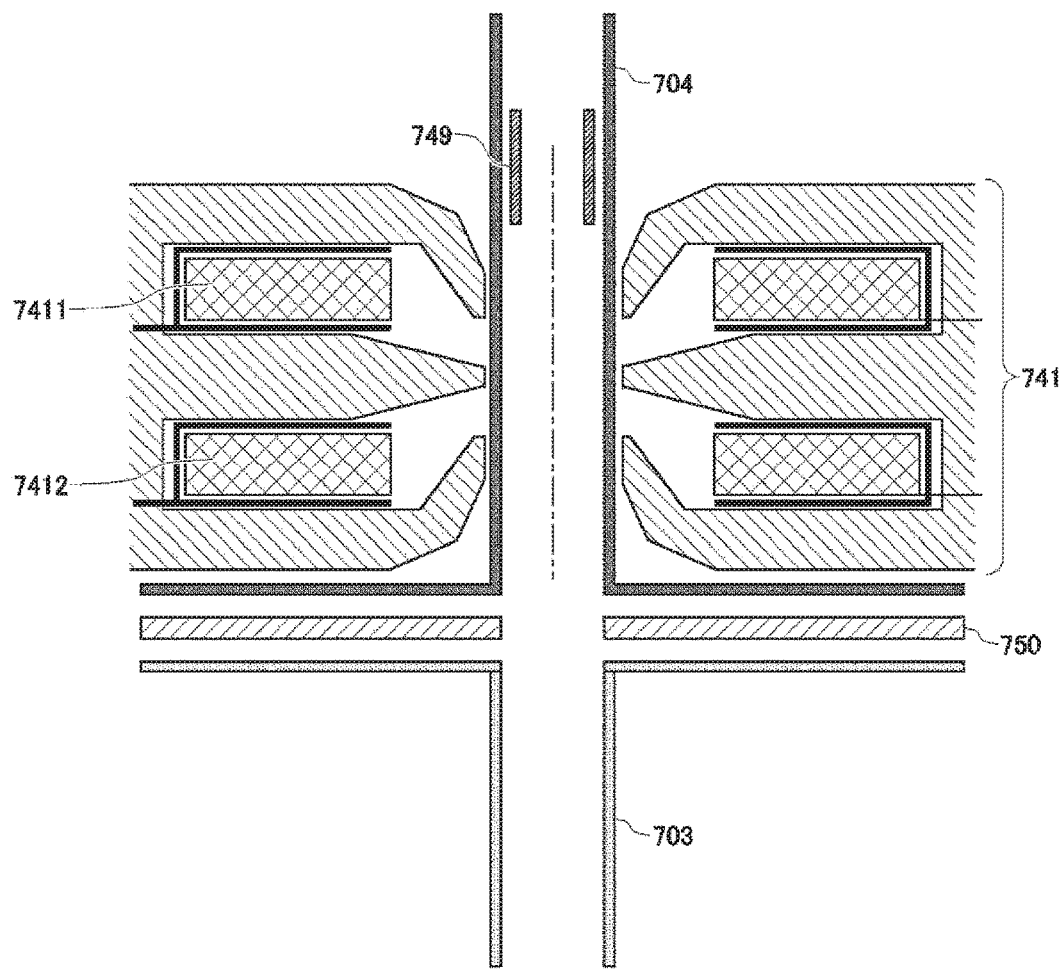
FIG. 17 is a diagram showing the structure of a combined unit formed with a high-speed deflector, an imaging lens, and an intermediate electrode according to an embodiment.
Figure 18:
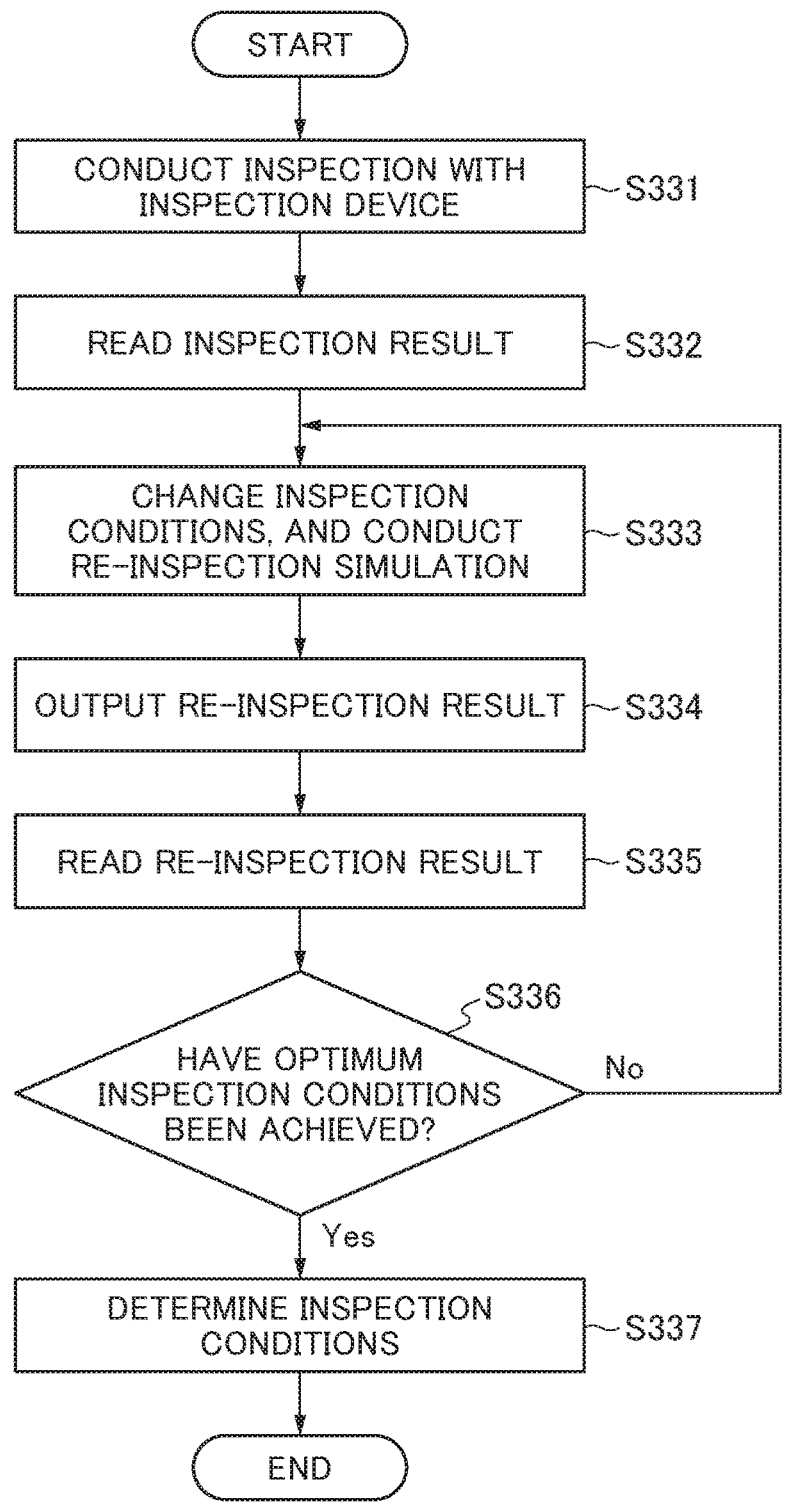
FIG. 18 is a flowchart showing an operation to be performed by a simulation device according to an embodiment.
Figure 19A:
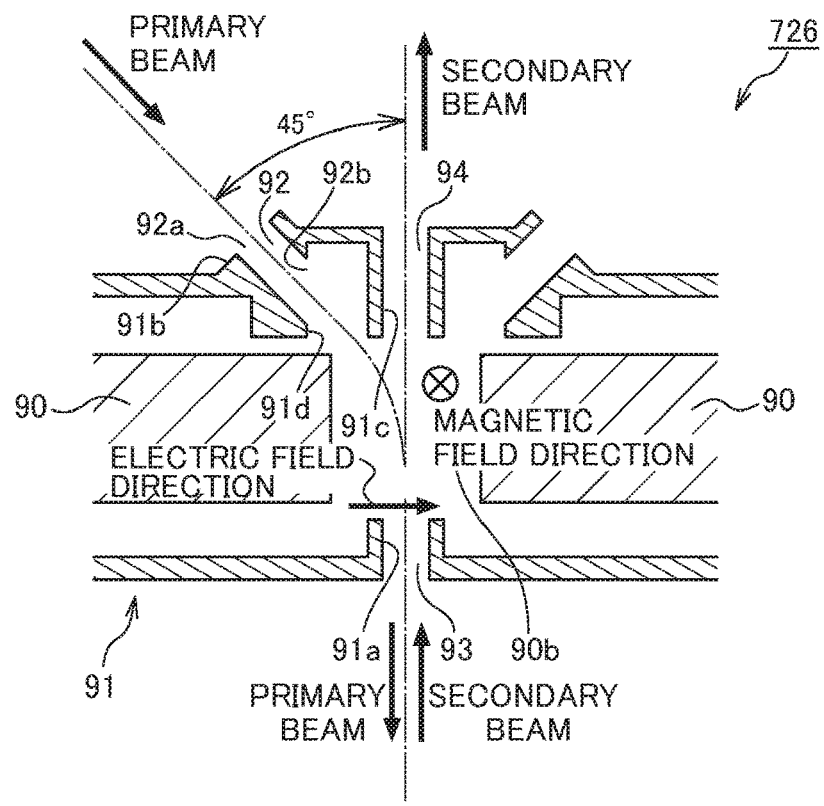
FIG. 19A is a cross-sectional view of a Wien filter according to this embodiment.
Figure 19B:
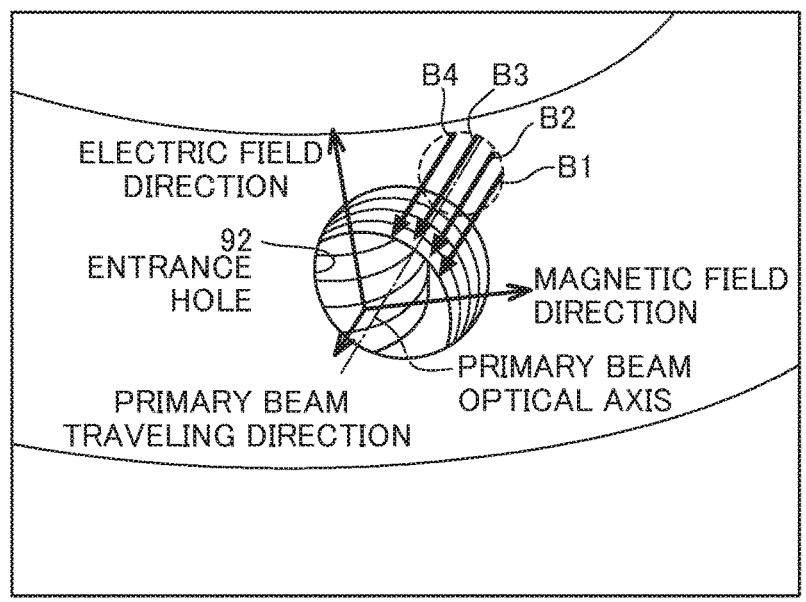
FIG. 19B is a diagram showing the exit positions of primary beams in the Wien filter according to this embodiment.
Figure 20:
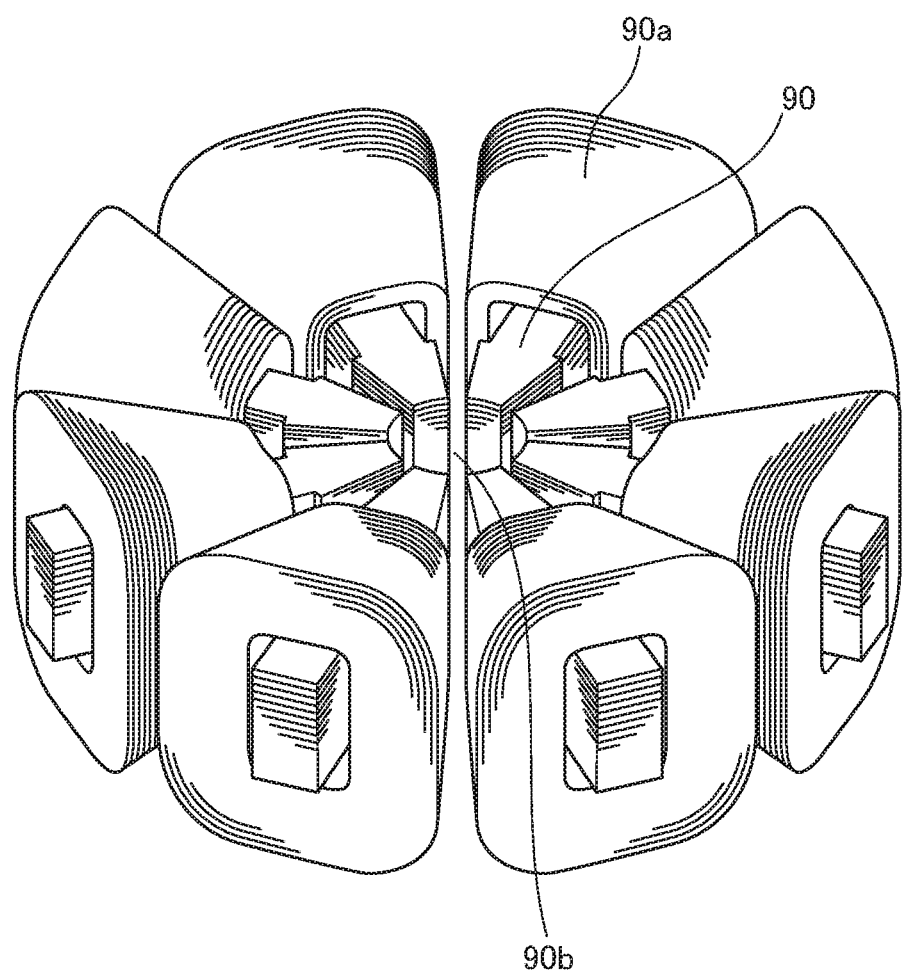
FIG. 20 is a schematic: perspective view of electromagnetic: poles.
Figure 21:
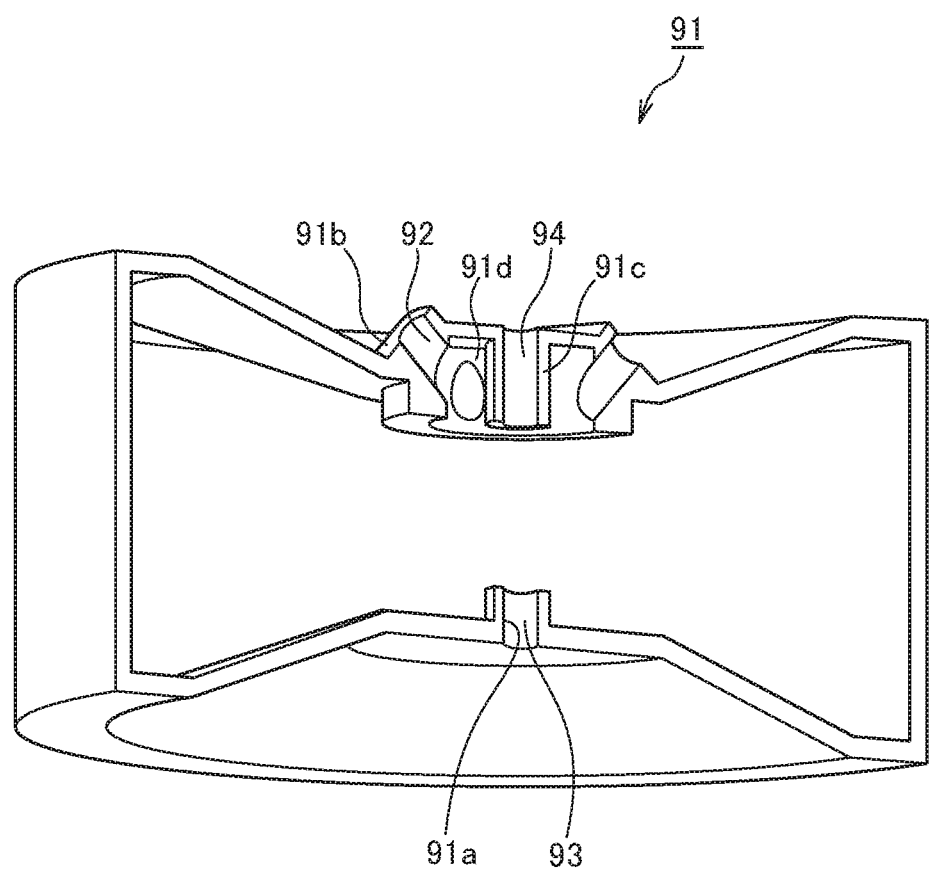
FIG. 21 is a schematic view of a cross-section of a shield member, seen from obliquely above.
Figure 22:
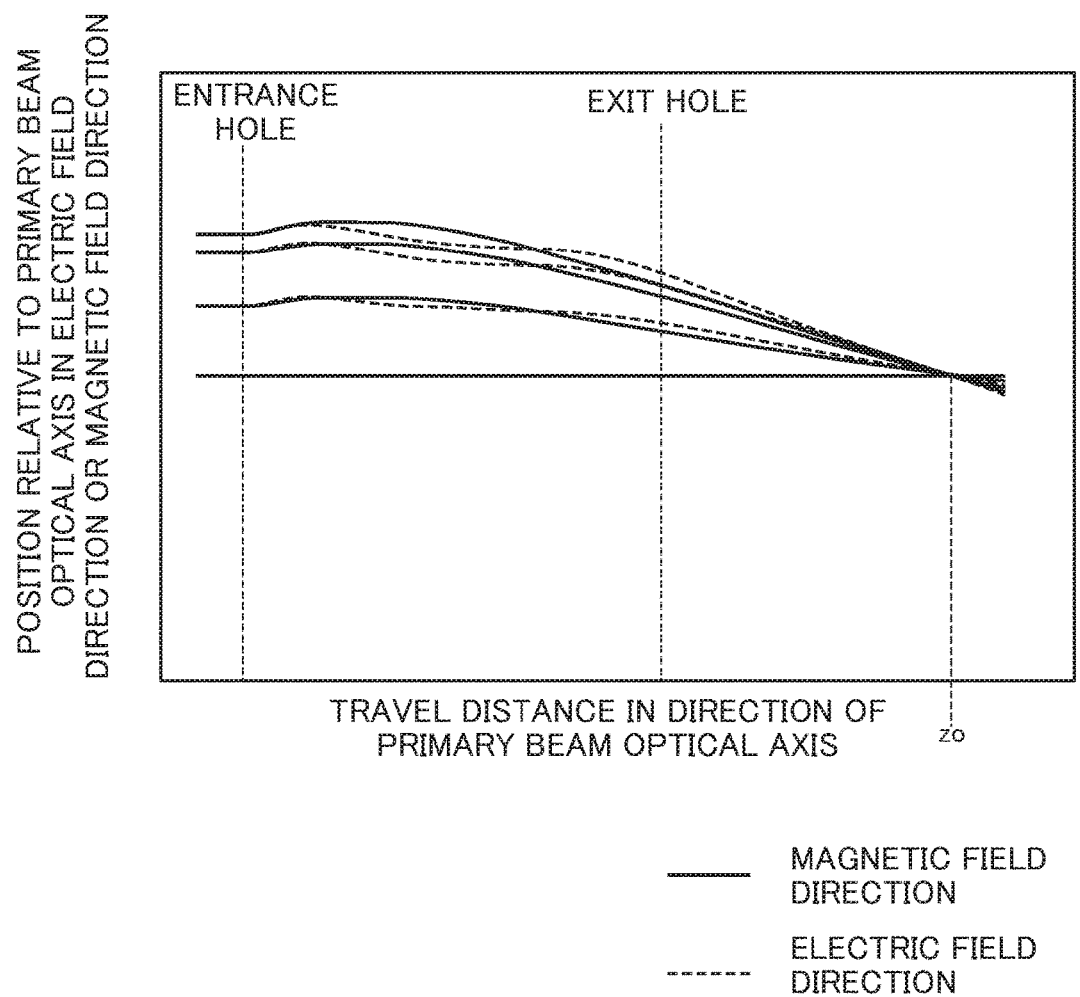
FIG. 22 is a graph showing the focusing properties of primary-beams in an electric field direction and a magnetic field direction in a Wien filter according to this embodiment.
Figure 23:
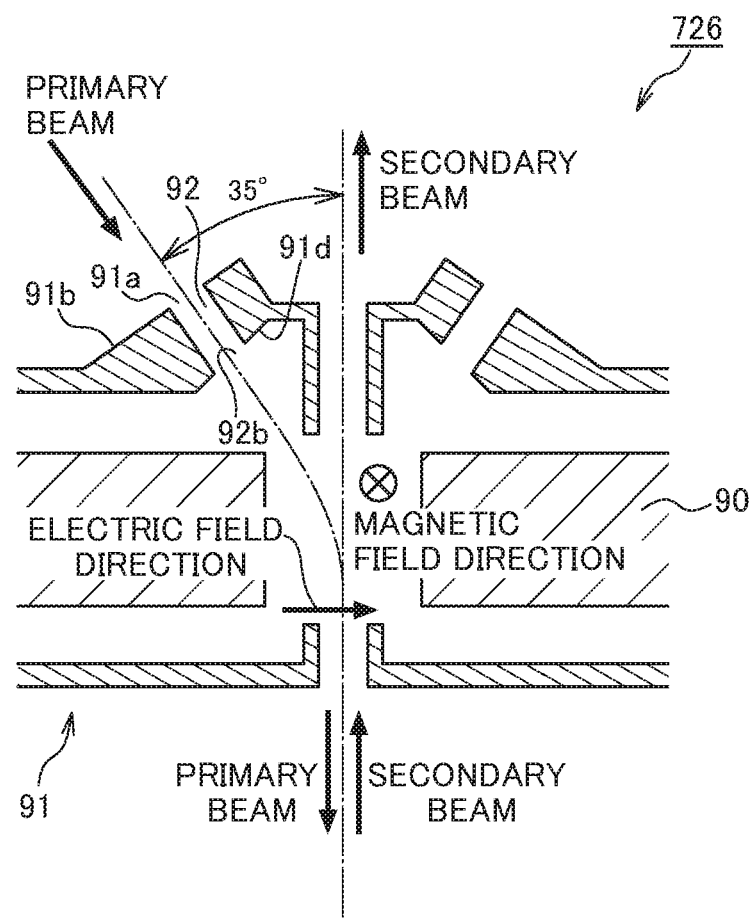
FIG. 23 is a cross-sectional view of a Wien filter according to a modification.
Figure 24A:
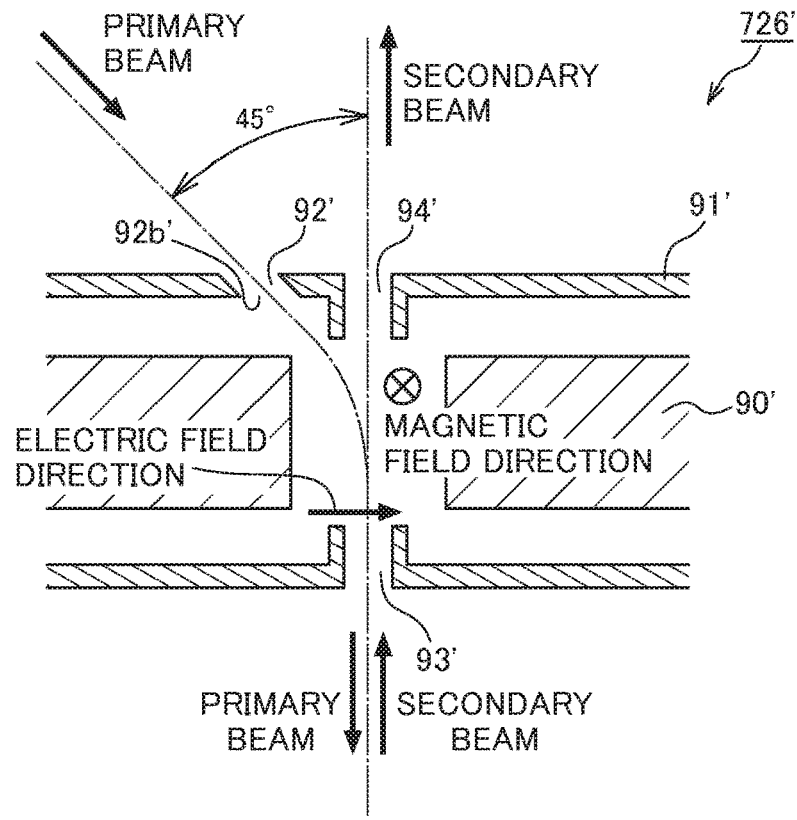
FIG. 24A is a cross-sectional view of a Wien filter according to a comparative example.
Figure 24B:
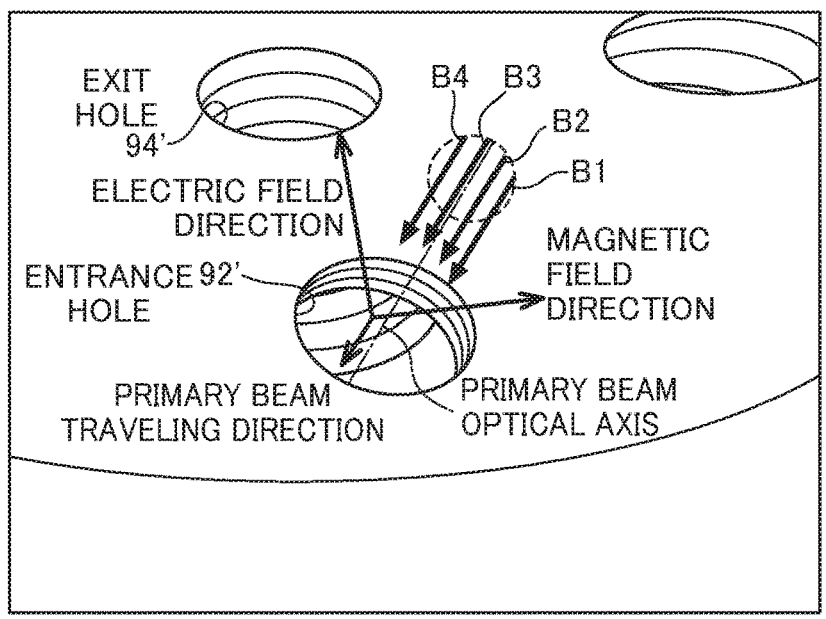
FIG. 24B is a diagram showing the exit positions of primary beams in a Wien filter according to a present embodiment.
Figure 25:
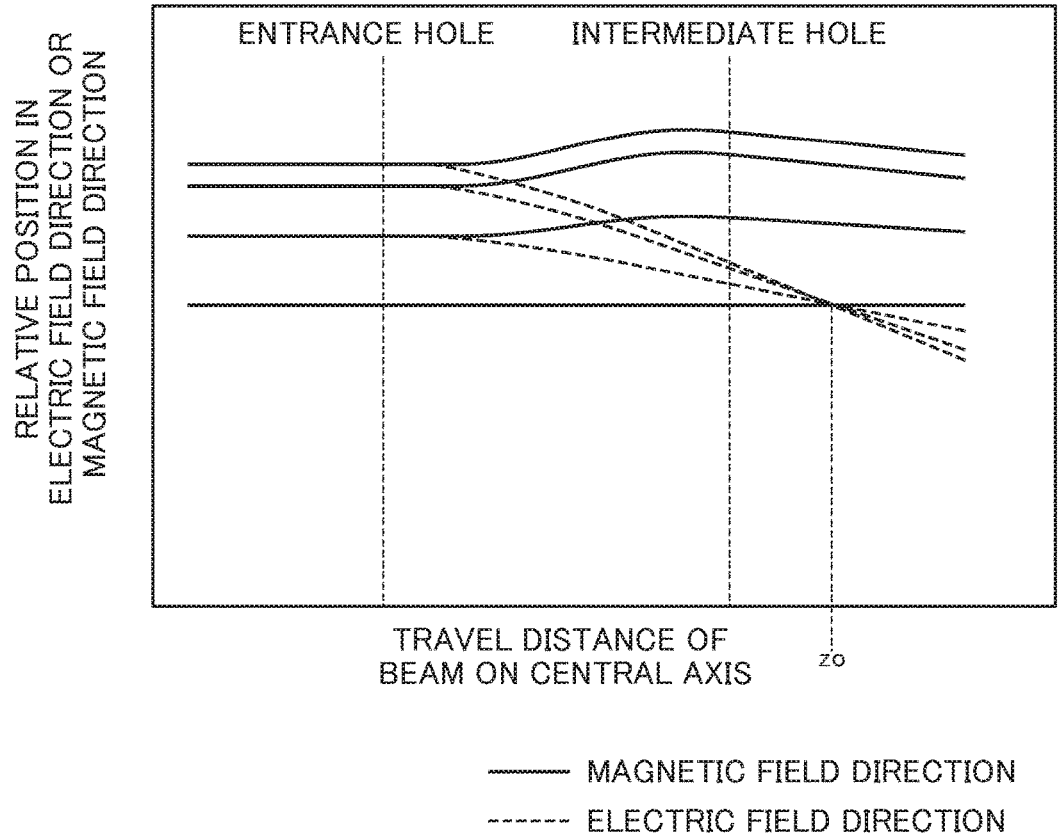
FIG. 25 is a graph showing the focusing properties of primary beams in an electric field direction and a magnetic field direction in a Wien filter according to a comparative example.

FIG. 12 is an elevation view of the principal components of an inspection device according to an embodiment;

FIG. 13 is a plan view of the principal components of the inspection device shown in FIG. 12, and is a diagram of the inspection device seen along the line B-B defined in FIG. 12;

FIG. 14 is a diagram showing the configuration of an electronic optical device according to an embodiment;

FIG. 15 is a diagram for explaining the beam path in the electronic optical device shown in FIG. 14;

FIG. 16A is a diagram for explaining an operation to be performed by a high-speed deflector that deflects a secondary beam so that the secondary beam follows the movement of a wafer according to an embodiment;

FIG. 16B is a diagram showing a relationship between an emission field and a viewing field according to an embodiment;

FIG. 16C is a diagram showing a relationship between an emission field and a viewing field according to an embodiment;

FIG. 17 is a diagram showing the structure of a combined unit formed with a high-speed deflector, an imaging lens, and an intermediate electrode according to an embodiment;

FIG. 18 is a flowchart showing an operation to be performed by a simulation device according to an embodiment;

FIG. 19A is a cross-sectional view of a Wien filter according to this embodiment;

FIG. 19B is a diagram showing the exit positions of primary beams in the Wien filter according to this embodiment;

FIG. 20 is a schematic perspective view of electromagnetic poles;

FIG. 21 is a schematic view of a cross-section of a shield member, seen from obliquely above;

FIG. 22 is a graph showing the focusing properties of primary beams in an electric field direction and a magnetic field direction in a Wien filter according to this embodiment;

FIG. 23 is a cross-sectional view of a Wien filter according to a modification;

FIG. 24A is a cross-sectional view of a Wien filter according to a present embodiment;

FIG. 24B is a diagram showing the exit positions of primary beams in a Wien filter according to a comparative example; and FIG. 25 is a graph showing the focusing properties of primary beams in an electric field direction and a magnetic field direction in a Wien filter according to a comparative example.

The following is a description of an inspection device according to an example of this embodiment, with reference to the accompanying drawings. It should be noted that the example described below is an example case where this embodiment is carried out, and does not limit this embodiment to the specific structures described below. In carrying out this embodiment, any appropriate specific structure according to an example may be adopted. It should also be noted that different reference numerals from those used in the foregoing embodiments are used in this embodiment.

FIGS. 12 and 13 are an elevation view and a plan view of the principal components of an inspection device 1 according to this embodiment.

The inspection device 1 according to this embodiment includes: a cassette holder 10 that holds cassettes each storing samples; a mini-environment device 20; a main housing 30 that defines a working chamber; a loader housing 40 that is disposed between the mini-environment device 20 and the main housing 30 to define two loading chambers; a loader 60 that loads a sample from the cassette holder 10 onto a stage device 50 provided in the main housing 30; an electronic optical device 70 attached to the main housing 30; an optical microscope 3000; and a scanning electron microscope (SEM) 3002. These components are arranged in the positional relationship shown in FIGS. 12 and 13. The inspection device 1 further includes: a precharge unit 81 disposed in the vacuum main housing 30; a potential application mechanism that applies a potential to a sample; an electron beam calibration mechanism; and an optical microscope 871 that forms an alignment controller 87 for positioning the sample on the stage device 50.

Here, "samples" are exposure masks, EW masks, nanoimprint masks (and templates), semiconductor wafers, substrates for optical elements, substrates for optical circuits, and the like. The samples include samples with patterns and samples without patterns. The samples with patterns include samples with surface roughness and samples without surface roughness. The patterns on the samples without surface roughness are formed with different materials. The samples without patterns include samples coated with an oxide film and samples without oxide film coating.

<Cassette Holder>

The cassette holder 10 holds two or more (two in this embodiment) cassettes c (closed cassettes, such as SMIF and FOUP, manufactured by Asyst Technologies Inc.) each storing samples (25 samples, for example) arranged parallel to one another in the vertical direction. In a case where each cassette is conveyed by a robot or the like and is automatically loaded into the cassette holder 10, the cassette holder 10 has a structure suitable for that. In a case where the cassettes are manually loaded into the cassette holder 10, a cassette holder that has an open cassette structure suitable to that can be selected and installed as the cassette holder 10. In this embodiment, the cassettes c are automatically loaded into the cassette holder 10. The cassette holder 10 includes a lifting table 11, and a lifting mechanism 12 that lifts the lifting table 11 up and down, for example. The cassettes c can be automatically set onto the lifting table 11 in the position as indicated by dashed lines in FIG. 13. After the setting, the cassettes c are automatically rotated to the positions indicated by solid lines in FIG. 13, and are aligned with the rotational axis line of a first conveyance unit 61 in the mini-environment device 20. The lifting table 11 is also lowered to the position indicated by a dashed line in FIG. 12. In this manner, the cassette holder to be used in the case of automatic loading or the cassette holder to be used in the case of manual loading can be appropriately selected from among known structures. Therefore, detailed explanation of the structures and functions thereof is not made herein.

The samples housed in the cassettes c are the samples to be inspected. The inspection is conducted after or while processing is performed on the samples in the semiconductor manufacturing process. Specifically, the samples stored in the cassettes c are samples subjected to a film forming process, CMP, ion injection, and the like, samples having patterns formed on the surfaces thereof, or samples not having any pattern formed thereon. The samples housed in each cassette c are arranged at a distance from one another and parallel to one another in the vertical direction. Therefore, an arm 612 of the first conveyance unit 61 can be moved up and down so that a sample at any position can be held by the first conveyance unit 61.

<Mini-Environment Device>

In FIGS. 12 and 13, the mini-environment device 20 includes: a housing 22 that defines an atmosphere-controlled mini-environment space 21; a gas circulator 23 that circulates gas, such as cleaned air, to control the atmosphere in the mini-environment space 21; an evacuator 24 that collects and evacuates part of the air supplied into the mini-environment space 21; and a prealigner 25 that is disposed in the mini-environment space 21 and performs rough positioning on a sample as the inspection object.

The housing 22 includes a top wall 221, a bottom wall 222, and surrounding walls 223 formed at the four sides, and is designed to isolate the mini-environment space 21 from the outside. To control the atmosphere in the mini-environment space 21, the gas circulator 23 includes: a gas supply unit 231 that is attached to the top wall 221, cleans the gas (air in this embodiment), and blows the cleaned air as a laminar flow downward through one or more gas outlets (not shown) in the mini-environment space 21; a collection duct 232 that is disposed on the bottom wall 222 in the mini-environment space, and collects the air having flowed down to the bottom; and a pipe 233 that connects the collection duct 232 and the gas supply unit 231, and returns the collected air to the gas supply unit 231. In this embodiment, the gas supply unit 231 captures about 20% of the air to be supplied, from the outside of the housing 22, and then cleans the captured air. However, the proportion of the air captured from the outside can be set at any appropriate value. The gas supply unit 231 includes an HEPA or ULPA filter that has a known structure for creating clean air. The downward laminar flow of the cleaned air, which is a downflow, is supplied so as to flow over a conveyance surface of the first conveyance unit 61 disposed in the mini-environment space 21. This flow prevents dust possibly caused by the conveyance unit from adhering to the sample. Therefore, the downflow nozzle is not necessarily disposed at a position near the top wall as shown in the drawing, and may be disposed at any position above the conveyance surface of the conveyance unit. The air does not necessarily flow over the entire surfaces of the mini-environment space 21. In some cases, an ion wind is used as the cleaned air, to maintain cleanness. Further, a sensor for measuring cleanness may be provided in the mini-environment space 21, and the device can be shut down when the cleanness becomes lower. A gateway 225 is formed at a portion of the surrounding wall 223 of the housing 22 that is adjacent to the cassette holder 10. A shutter device having a known structure may be provided in the vicinity of the gateway 225, to close the gateway 225 from the mini-environment device side. The downflow of the laminar flow formed in the vicinity of the sample has a flow rate of 0.3 to 0.4 m/sec, for example. The gas supply unit 231 may not be provided inside the mini-environment space 21, and may be provided outside the mini-environment space 21.

The evacuator 24 includes: an intake duct 241 disposed at a position below the sample conveyance surface of the first conveyance unit 61, and at a lower portion of the first conveyance unit 61; a blower (not shown) disposed outside the housing 22; and a pipe (not shown) that connects the intake duct 241 and the blower. Using the intake duct 241, the evacuator 24 sucks the gas that has flowed down to the region surrounding the first conveyance unit 61 and might contain dust possibly caused by the first conveyance unit 61, and evacuates the gas from the housing 22 through the pipe and the blower. In this case, the gas may be ejected into an exhaust pipe (not shown) extended to a position near the housing 22.

The prealigner 25 disposed in the mini-environment space 21 optically or mechanically detects an orientation flat (a flat portion formed at the outer circumference of a circular sample) formed on the sample, or one or more V-shaped notches formed at the outer circumference of the sample, and performs positioning on the sample beforehand in the rotating direction about the axis line O-O of the sample with an accuracy of about ±1 degree. The prealigner 25 forms part of the mechanism that determines the coordinates of the inspection object, and serves to perform rough positioning on the inspection object. The prealigner 25 may have a known structure, and therefore, explanation of the structure and operation thereof is not made herein.

Although not shown in the drawing, a collection duct for the evacuator 24 may also be provided at a lower portion of the prealigner 25 so that air containing dust ejected from the prealigner 25 can be released to the outside.

<Main Housing>

In FIGS. 12 and 13, the main housing 30, which defines a working chamber 31, includes a housing main body 32. The housing main body 32 is supported by a housing supporter 33 mounted on a vibration isolating device that is a vibration isolator 37 disposed on a base frame 36. The housing supporter 33 includes a frame structure 331 formed into a rectangular shape. The housing main body 32 is disposed and fixed onto the frame structure 331, includes a bottom wall 321 placed on the frame structure 331, a top wall 322, and surrounding walls 323 that are formed at the four sides and are connected to the bottom wall 321 and the top wall 322. The housing main body 32 isolates the working chamber 31 from the outside. In this embodiment, the bottom wall 321 is formed with a steel plate having a relatively great thickness so as not to cause distortion due to the weight of a device mounted thereon, such as the stage device 50. However, the bottom wall 321 may nave some other structure. In this embodiment, the housing main body 32 and the housing supporter 33 are designed to nave rigid structures. Vibration of the floor on which the base frame 36 is placed is prevented from reaching the rigid structures by the vibration isolator 37. A gateway 325 through which a sample is conveyed in and out is formed in the surrounding wall adjacent to the later described loader housing 40 among the surrounding walls 323 of the housing main body 32.

The vibration isolator 37 may be an active isolator having an air spring, a magnetic bearing, or the like, or may be a passive isolator having these components. Either isolator may have a known structure, and therefore, explanation of the structure and operation thereof is not made herein. The vacuum atmosphere in the working chamber 31 is maintained by a vacuum device (not shown) having a known structure. A controller 2 that controls the operation of the entire device is disposed under the base frame 36.

<Loader Housing>

In FIGS. 12 and 13, the loader housing 40 includes a housing main body 43 that defines a first loading chamber 41 and a second loading chamber 42. The housing main body 43 includes a bottom wall 431, a top wall 432, surrounding walls 433 formed at the four sides, and a partition wall 434 that separates the first loading chamber 41 and the second loading chamber 42 from each other. The housing main body 43 can isolate both of the loading chambers from the outside. An opening that serves as a gateway 435 for exchanges of samples between the two loading chambers is formed in the partition wall 434. Gateways 436 and 437 are formed in portions of the surrounding walls 433 adjacent to the mini-environment device 20 and the main housing 30. The housing main body 43 of the loader housing 40 is mounted on the frame structure 331 of the housing supporter 33, and is supported by housing supporter 33. Thus, vibration of the floor is not transmitted to the loader housing 40, either. The gateway 436 of the loader housing 40 and a gateway 226 of the housing 22 of the mini-environment device 20 are aligned with each other. At the alignment position, a shutter device 27 that selectively blocks communication between the mini-environment space 21 and the first loading chamber 41 is provided. The shutter device 27 includes: a sealing member 271 that surrounds the gateways 226 and 436 and is in close contact with and fixed to the surrounding wall 433; a door 272 that cooperates with the sealing member 271 to prevent the air from flowing through the gateways 226 and 436; and a drive device 273 that moves the door 272. The gateway 437 of the loader housing 40 and the gateway 325 of the housing main body 32 are also aligned with each other. At the alignment position, a shutter device 45 that selectively blocks communication between the second loading chamber 42 and the working chamber 31 is provided. The shutter device 45 includes: a sealing member 451 that surrounds the gateways 437 and 325 and is in close contact with and fixed to the surrounding walls 433 and 323; a door 452 that cooperates with the sealing member 451 to prevent the air from flowing through the gateways 437 and 325; and a drive device 453 that moves the door 452. Further, at an opening formed in the partition wall 434, a shutter device 46 that closes the opening with a door 461 to selectively block communication between the first and second loading chambers 41 and 42 is provided. When in a closed state, the shutter devices 27, 45, and 46 can hermetically seal the respective chambers. Each of these shutter devices may have a known structure, and therefore, detailed explanation of the structures and operations thereof is not made herein. The method of supporting the housing 22 of the mini-environment device 20 is different from the method of supporting the loader housing 40. To prevent vibration of the floor from reaching the loader housing 40 and the main housing 30 through the mini-environment device 20, a vibration isolating cushion member is preferably provided between the housing 22 and the loader housing 40 in such a manner as to hermetically surround the gateways.

A sample rack 47 that vertically separates samples (two samples in this embodiment) and horizontally supports the samples is provided in the first loading chamber 41. The sample rack 47 includes upright pillars 472 that are separated from one another and are fixed at the four corners of a rectangular substrate 471. A two-stage supporter is formed at each of the pillars 472, and the circumferential edge of a sample W is placed on the supporters and are held thereon. The ends of arms of the later described first and second conveyance units are then moved closer to the sample from between the adjacent pillars, so that the arms grip the sample.

The atmospheres in the loading chambers 41 and 42 can be controlled to a high degree of vacuum (a degree of vacuum of $10^{-5}$ to $10^{-6}$ Pa) by a vacuum evacuator (not shown) that has a known structure including a vacuum pump (not shown). In this case, the first loading chamber 41 maintains a low-vacuum atmosphere and serves as a low-vacuum chamber, and the second loading chamber 42 maintains a high-vacuum atmosphere and serves as a high-vacuum chamber. In this manner, sample contamination can be effectively prevented. As such a structure is adopted, the sample that is housed in the loading chambers 41 and 42, and is to be inspected for defects next can be conveyed into the working chamber 31 without delay. As the loading chambers 41 and 42 are used, the defect inspection throughput can be increased. Further, the vacuum state in the vicinity of the laser source that requires a high-vacuum storage condition can be increased to the highest possible degree of vacuum.

A vacuum exhaust pipe and a vent pipe for inert gas (such as dry pure nitrogen) (either of the pipes is not shown) are connected to each of the first and second loading chambers 41 and 42. With this structure, an atmospheric pressure state can be formed in each loading chamber by inert gas venting (an inert gas is injected to prevent some other gas, such as an oxygen gas, from adhering to the surface). The device for performing such inert gas venting may have a known structure, and therefore, detailed explanation thereof is not made herein.

<Stage Device>

The stage device 50 includes: a fixed table 51 placed on the bottom wall 321 of the main housing 30; a Y-table 52 that moves in the Y-direction (the direction perpendicular to the drawing sheet in FIG. 12) on the fixed table 51; an X-table 53 that moves in the X-direction (the lateral direction in FIG. 12) on the Y-table 52; a rotating table 54 that can rotate on the X-table 53; and a holder 55 disposed on the rotating table 54. A sample is releasably held on a sample mounting surface 551 of the holder 55. The holder 55 may have a known structure that can releasably grip a sample mechanically or in an electrostatic-chuck manner. The stage device 50 can perform highly accurate positioning on a sample held on the mounting surface 551 of the holder 55, in the X-direction, in the Y-direction, and in the Z-direction (the vertical direction in FIG. 12), and further in a direction ($\theta$-direction) about an axis line perpendicular to the supporting surface of the sample, with respect to an electron beam emitted from the electronic optical device 70, by moving the tables with servomotors, encoders, and various sensors (not shown). The positioning in the Z direction is designed to enable fine adjustment of the position on the mounting surface 551 of the holder 55 in the Z-direction, for example. In this case, the reference position of the mounting surface 551 is detected by a position measuring instrument using fine diameter laser (a laser interferometric distance meter adopting the principles of an interferometer), and the position is controlled by a feedback circuit (not shown). Together with or instead of this control, control is performed by measuring the position of the notch or the orientation flat of the sample to detect the planar position and the rotational position of the sample with respect to the electron beam, and rotating the rotating table 54 with a stepping motor or the like capable of fine angle control. To minimize generation of dust in the working chamber 31, servomotors 521 and 531 and encoders 522 and 532 for the stage device 50 are disposed outside the main housing 30. The stage device 50 may be a device that is used in a stepper or the like and has a known structure, and therefore, detailed explanation of the structure and operation thereof is not made herein. The laser interferometric distance meter may also have a known structure, and therefore, detailed explanation of the structure and operation thereof is not made herein.

The rotational position and the X- and Y-positions of a sample with respect to an electron beam are inputted to the later described signal detecting system or image processing system, so that signals indicating the rotational position and the X- and Y-positions of the sample obtained at the time of inspection can be standardized. Furthermore, a sample chuck mechanism provided in the holder 55 can apply a voltage for chucking a sample to an electrode of an electrostatic chuck, and perform positioning by pressing the outer circumferential portion of the sample at three points (which are preferably arranged at regular intervals in a circumferential direction). The sample chuck mechanism includes two fixed positioning pins, and one pressing clamp pin. The clamp pin can achieve automatic chucking and automatic releasing, and forms a conducting portion for voltage application.

In this embodiment, the table moving in the lateral direction in FIG. 13 is the X-table 53, and the table moving in the vertical direction is the Y-table 52. However, the table moving in the lateral direction may be the Y-table, and the table moving in the vertical direction may be the X-table in the drawing.

As shown in FIGS. 12 and 13, the stage device 1 of this embodiment continuously moves, with the first and second samples W placed thereon. While the primary optical system 76 of the first electronic optical device 701 is emitting a primary beam to the first sample W, the primary optical system of the second electronic optical device 702 emits a primary beam to the second sample W. With this structure, the time required for inspecting the samples W can be greatly shortened.

<Loader>

The loader 60 includes: a robotic first conveyance unit 61 disposed in the housing 22 of the mini-environment device 20; and a robotic second conveyance unit 63 disposed in the second loading chamber 42.

The first conveyance unit 61 includes a multi-joint arm 612 capable of rotating about an axis line $O_1$-$O_1$ with respect to a driver 611. The multi-joint arm 612 may be an arm having any appropriate structure. In this embodiment, the arm 612 includes three portions joined in such a manner as to rotate with respect to one another. One portion of the arm 612 of the first conveyance unit 61, which is a first portion closest to the driver 611, is attached to a shaft 613 that can be rotated by a drive mechanism (not shown) that is provided in the driver 611 and has a known structure. The arm 612 can be rotated about the axis line $O_1$-$O_1$ by the shaft 613, and the entire arm 612 can expand and contract in the radial direction with respect to the axis line $O_1$-$O_1$ through relative rotation among the respective portions. A gripper 616 that has a known structure, such as a mechanical chuck or an electrostatic chuck, and grips a sample is provided at the edge of a third portion of the arm 612, which is the furthest from the shaft 613. The driver 611 can be vertically moved by a lifting mechanism 615 that has a known structure.

The arm 612 of the first conveyance unit 61 extends in either one of directions M1 and M2 of the two cassettes c held by the cassette holder 10. The first conveyance unit 61 places a sample stored in the cassettes c on the arm 612, or grips and pulls out a sample with a chuck (not shown) attached to the end of the arm 612. The arm 612 then contracts (the state shown in FIG. 13), rotates to reach such a position as to be able to extend in a direction M3 of the prealigner 25, and stops at the position. The arm 612 then extends again, and places the sample held by the arm 612 onto the prealigner 25. After the sample is received from the prealigner 25 in the manner reversed from the above described manner, the arm 612 further rotates and stops at such a position as to extend toward the second loading chamber 41 (direction M4), and transfers the sample to the sample rack 47 in the second loading chamber 41. In a case where a sample is mechanically gripped, the sample is gripped at the circumferential portion (the portion within about 5 mm from the circumference). This is because devices (circuit wiring lines) are formed on the entire surface of the sample except for the circumferential portion. If the sample is gripped at portion other than the circumferential portion, the devices break, resulting in defects.

The structure of the second conveyance unit 63 is substantially the same as that of the first conveyance unit 61, and differs from the structure of the first conveyance unit 61 only in that sample conveyance is conducted between the sample rack 47 and the mounting surface 551 of the stage device 50. Therefore, detailed explanation of the structure of the second conveyance unit 63 is not made herein.

In the loader 60, the first and second conveyance units 61 and 63 conduct conveyance of a sample from a cassette held in the cassette holder 10 onto the stage device 50 disposed in the working chamber 31, and conveyance of the sample in the inverse direction, while the sample is kept horizontal. The arms of the conveyance units vertically move only when a sample is pulled out from or inserted into a cassette, a sample is mounted on or removed from the sample rack 47, and a sample is mounted on or removed from the stage device 50. Thus, a large sample, such as a sample having a diameter of 30 cm or 45 cm, can be smoothly moved.

<Sample Conveyance>

Next, conveyance of a sample from a cassette c supported by the cassette holder 10 to the stage device 50 disposed in the working chamber 31 is described step by step.

In a case where each cassette is manually set as described above, the cassette holder 10 may be a holder having a structure suitable for the manual setting. In a case where each cassette is automatically set, the cassette holder 10 may be a holder having a structure suitable for the automatic setting. In this embodiment, when the cassettes c are set on the lifting table 11 of the cassette holder 10, the lifting table 11 is lowered by the lifting mechanism 12, so that the cassettes c are aligned with the gateway 225.

After the cassettes c are aligned with the gateway 225, a cover (not shown) provided on each cassette c opens. Further, a cylindrical cover is provided between the cassettes c and the gateway 225 of the mini-environment, to isolate the inside of each cassette c and the inside of the mini-environment space 21 from the outside. These structures are known structures, and therefore, detailed explanation of the structures and operations thereof is not made herein. In a case where a shutter device that opens and closes the gateway 225 is provided on the side of the mini-environment device 20, the shutter device operates to open the gateway 225.

Meanwhile, the arm 612 of the first conveyance unit 61 stays still while facing one of the directions M1 and M2 (the direction M2 in this description). When the gateway 225 opens, the arm 612 extends and receives one of the samples stored in the cassettes c with its end portion. Position adjustment in the vertical direction is performed on the arm 612 and the sample to be pulled out from the cassettes c is conducted by vertically moving the driver 611 and the arm 612 of the first conveyance unit 61 in this embodiment. However, the position adjustment may be performed by vertically moving the lifting table 11 of the cassette holder 10, or by vertically moving the lifting table 11 of the cassette holder 10 as well as the driver 611 and the arm 612 of the first conveyance unit 61.

After the arm 612 receives the sample, the arm 612 contracts, and the shutter device operates to close the gateway 225 (if there is the shutter device). The arm 612 then becomes capable of extending in the direction M3 by rotatively moving about the axis line $O_1$-$O_1$. The arm then extends and places the sample, which is on the end portion of the arm 612 or is gripped by the chuck, onto the prealigner

25. The prealigner 25 performs positioning on the orientation of the sample in the rotating direction (the orientation about the central axis line perpendicular to the sample surface) within a predetermined range. After the positioning is completed, the first conveyance unit 61 receives the sample from the prealigner 25 with the end portion of the arm 612. The arm 612 is then made to contract so that the first conveyance unit 61 is put into such a position as to be able to extend the arm 612 in the direction M4. The door 272 of the shutter device 27 then moves to open the gateways 226 and 436, and the arm 612 extends to place the sample on the upper stage or the lower stage of the sample rack 47 in the first loading chamber 41. Before the shutter device 27 opens, and the sample is transferred to the sample rack 47 as described above, the opening 435 formed in a partition wall 434 is hermetically closed by the door 461 of the shutter device 46.

In the process of conveyance of the sample with the first conveyance unit 61, a cleaned air flows like a laminar flow (as a downflow) from the gas supply unit 231 provided on the housing 22 of the mini-environment device 20. The flow prevents dust from adhering to the upper surface of the sample during the conveyance. Part of the air surrounding the first conveyance unit 61 (about 20% of the air that is supplied from a supply unit and is mostly dirty in this embodiment) is sucked into the intake duct 241 of the evacuator 24 and is then released to the outside of the housing 22. The remaining air is collected through the collection duct 232 provided at a bottom portion of the housing 22, and is returned to the gas supply unit 231.

After the sample is placed in the sample rack 47 in the first loading chamber 41 of the loader housing 40 by the first conveyance unit 61, the shutter device 27 is closed to seal the inside of the first loading chamber 41. The first loading chamber 41 is then filled with inert gas, and the air is evacuated from the first loading chamber 41. After that, the inert gas is also evacuated, and a vacuum atmosphere is created in the first loading chamber 41. The vacuum atmosphere in the first loading chamber 41 may have a low degree of vacuum. After a certain degree of vacuum is achieved in the first loading chamber 41, the shutter device 46 operates to open the gateway 435, which has been hermetically closed by the door 461, and the arm 632 of the second conveyance unit 63 extends and receives a sample from the sample rack 47 with the gripper at the end portion (the sample is placed on the end portion or is gripped by the check attached to the end portion). After the sample is received, the arm 632 contracts, and the shutter device 46 again operates to close the gateway 435 with the door 461. Before the shutter device 46 opens, the arm 632 is put into such a position as to be able to extend in a direction N1 toward the sample rack 47. Also, before the shutter device 46 opens, the gateways 437 and 325 are closed with the door 452 of the shutter device 45 as described above, and communication between the inside of the second loading chamber 42 and the inside of the working chamber 31 is blocked in a hermetical state. In this manner, the air is evacuated from the second loading chamber 42.

After the shutter device 46 closes the gateway 435, the air is again evacuated from the second loading chamber 42, and the vacuum in the second loading chamber 42 has a higher degree of vacuum than that in the first loading chamber 41. Meanwhile, the arm 632 of the second conveyance unit 63 rotates to reach such a position as to be able to extend in the direction toward the stage device 50 in the working chamber 31. On the other hand, in the stage device 50 in the working chamber 31, the Y-table 52 moves upward in FIG. 13 to a position where the center line $X_0$-$X_0$ of the X-table 53 is substantially aligned with the X-axis line $X_1$-$X_1$ crossing the rotational axis line $O_2$-$O_2$ of the second conveyance unit 63, and the X-table 53 moves to a position close to the leftmost position in FIG. 13. The tables 52 and 53 stand by in the respective positions. When the inside of the second loading chamber 42 becomes substantially the same as the vacuum state in the working chamber 31, the door 452 of the shutter device 45 operates to open the gateways 437 and 325, and the arm 632 extends so that the end portion of the arm 632 holding the sample approaches the stage device 50 in the working chamber 31. The sample is then placed on the mounting surface 551 of the stage device 50. After the sample is placed, the arm 632 contracts, and the shutter device 45 closes the gateways 437 and 325.

The operation to convey a sample in a cassette c to the stage device 50 has been described above. To return the sample that has been placed on the stage device 50 and been subjected to processing from the stage device 50 into the cassette c, the opposite of the above described operation is performed. As two or more samples are placed in the sample rack 47, a sample can be conveyed between a cassette c and the sample rack 47 by the first conveyance unit 61 while another sample is being conveyed between the sample rack 47 and the stage device 50 by the second conveyance unit 63. Thus, an inspection process can be efficiently performed.

Specifically, in a case where a processed sample A and an unprocessed sample B are in the sample rack 47, (1) the unprocessed sample B is first moved to the stage device 50, and processing is started, and (2) during the processing, the processed sample A is moved by the arm 632 from the stage device 50 to the sample rack 47, and an unprocessed sample C is removed from the sample rack 47 by the arm 632, is positioned by the prealigner 25, and is then moved to the sample rack 47 in the first loading chamber 41. In this manner, the processed sample A can be replaced with the unprocessed sample C in the sample rack 47, while the sample B is being processed.

Depending on how this device that conducts inspection and evaluation is used, two or more stage devices 50 may be employed and arranged in parallel, and samples may be transferred from a single sample rack 47 to the respective stage devices 50. In this manner, two or more samples can be simultaneously processed.

According to the above described embodiment, the effects described below can be achieved.

(A) An entire configuration of a projection inspection device that uses an electron beam can be obtained, and inspection objects can be processed with a high throughput.

(B) In a mini-environment space, cleaned gas flows around an inspection object, to prevent dust from adhering to the inspection object. Also, a sensor that measures cleanness is employed. Thus, the inspection object can be inspected while dust in the space is monitored.

(C) A loading chamber and a working chamber are integrally supported via a vibration isolating device. Thus, each inspection object can be supplied to a stage device and be inspected without being affected by the external environment.

<Electronic Optical Device>

FIG. 14 is a diagram showing the configuration of the electronic optical device 70. FIG. 15 is a diagram for explaining the beam path in the electronic optical device 70. An inspection object (a sample) in the electronic optical device 70 is a sample W. The sample W is a silicon wafer, a glass mask, a semiconductor substrate, a semiconductor pattern substrate, a substrate with a metal film, or the like.

The electron beam inspection device according to this embodiment detects foreign matter existing on the surface of the sample W, which is one of the above mentioned substrates. Foreign matter is an insulating material, a conductive material, a semiconductor material, a complex of these materials, or the like. Types of foreign matter include particles, washed residual matter (organic matter), a reaction product generated on the surface, and the like.

As shown in FIGS. 14 and 15, the electronic optical device 70 includes: a primary optical system 72 that generates an electron beam; a secondary optical system 74 that forms an enlarged image with secondary emission electrons or mirror electrons from the sample W; and a detector 761 that detects these electrons. An image processor 763 that processes a signal from the detector 761 is connected to the detector 761.

The primary optical system 72 is designed to generate an electron beam, and collectively emits the electron beam to the sample W over a region covering the detection size of the detector 761. The primary optical system 72 includes an electron gun 721, a lens 722, an aperture 723, a Wien filter 726, and a lens 727. The electron gun 721 includes a laser source 7211 and an electric-light planar cathode 7212, and an electron beam is generated by the electron gun 721. The generated electron beam is accelerated, and is shaped by the lens 722 and the aperture 723. At the Wien filter 726, the electron beam is affected by Lorentz force generated from a magnetic field and Coulomb force generated from an electric field. Entering from obliquely above, the electron beam is deflected vertically downward, and travels to the sample W. The lens 727 projects an intermediate image formed near the Wien filter 726, onto the sample W. The primary beam is decelerated near the sample W, and then enters the sample W or is reflected in the vicinity of the sample W.

The primary optical system 72 emits both a charging electron beam for precharge and an imaging electron beam. The energy of the primary beam entering the sample W (the energy being called "landing energy") is defined by the difference between the sample potential and the acceleration potential of the electron gun. Experiment results show that the difference between the precharge landing energy LE1 and the landing energy LE2 of the imaging electron beam is preferably 5 to 20 eV.

In this regard, the precharge landing energy LE1 is emitted in a negatively-charged region, when there is a potential difference between foreign matter on the surface 21 of the sample W and the surrounding region. The charge-up voltage varies depending on the value of LE1. This is because the relative ratio between LE1 and LE2 varies (LE2 represents the landing energy of the imaging electron beam as described above). Where LE1 is large, the charge-up voltage is high. Because of this, a reflecting point is formed at a position above the foreign matter (the position being closer to the detector 761). The orbital path and the transmittance of mirror electrons vary depending on the position of the reflecting point. Accordingly, optimum charge-up voltage conditions are determined by the reflecting point. If LE1 is too low, the efficiency of mirror electron formation becomes lower. The difference between LE1 and LE2 is preferably 5 to 20 eV. The value of LE1 is preferably 0 to 40 eV, or more preferably, 5 to 20 eV.

As the conditions for the electric field and the magnetic field of the Wien filter 726 are adjusted, the angle of incidence of the primary electron beam entering the sample W can be determined. For example, the conditions for the Wien filter 726 can be set so that the primary beam can perpendicularly enter the sample W. To effectively increase sensitivity, the angle of incidence the electron beam in the primary optical system with respect to the sample W should be slightly tilted. An appropriate angle of tilt is 0.05 to 10 degrees, or more preferably, 0.1 to 3 degrees.

As described above, an electron beam with a slightly tilted angle of incidence is emitted to foreign matter, so that a stronger signal can be obtained from the foreign matter, and the conditions for preventing the mirror electron orbital path from deviating from the center of the optical axis of the secondary optical system can be formed. Thus, the transmittance of mirror electrons can be increased. In view of this, a tilted electron beam is advantageously used when foreign matter is charged up to guide mirror electrons.

The sample W is on the stage device 50, and there is foreign matter on the sample W. The primary beam is emitted to the surface 21 of the sample W with a landing energy LE of 5 to 10 eV. Because of the foreign matter charged up in advance, the electrons of the primary beam do not come into contact with the foreign matter but are reflected. The mirror electrons generated in this manner are guided to the detector 761 by the secondary optical system 74. At the same time, secondary emission electrons are also generated from the primary beam emitted to the surface 21 of the sample W that has not been charged up. However, the efficiency of secondary-electron emission by electron irradiation with a landing energy LE of approximately 5 to 10 eV is close to 0. Furthermore, secondary electrons are emitted from the surface 21 of the sample W with an angle distribution close to Lambert's cosine law, and therefore, most of the secondary electrons are cut off by an aperture 742 of the secondary electron optical system. As a result, the proportion of the secondary electrons that reach the detector 761 is very small, and is approximately 0.5 to 4.0%, for example. On the other hand, the ratio of the mirror electrons to the primary electrons is almost 1, and scattering is smaller than the angle distribution of the secondary electrons. Accordingly, the mirror electrons reach the detector 761 with a high transmittance. Because of this, a signal derived from the foreign matter is detected with high contrast.

An image of the mirror electrons derived from the foreign matter is projected in a larger size than the actual size onto the detector 761, by virtue of the effect of a local electric field formed by the charged-up foreign matter. The enlargement factor is as high as 5 to 50. Under typical conditions, the enlargement factor is often 20 to 30. If the enlarged size of the foreign matter is three or more times larger than the pixel size of the detector 761, the foreign matter can be detected. Therefore, the projection magnification in the secondary optical system 74 is made smaller, and the pixel size of the detector 761 is made larger, so that the area in which foreign matter can be detected at once is made larger. Thus, high-speed, high-throughput inspection can be conducted.

In a case where the diameter of the foreign matter is 20 nm, the pixel size of the detector 761 may be 60 nm, 100 nm, or 500 nm, for example. In this example, the pixel size of the detector 761 is made three or more times larger than the size of the foreign matter, so that the foreign matter can be imaged and inspected. This is a particularly advantageous feature for achieving higher throughput than with SEM or the like.

The secondary optical system 74 is a means to enlarge the distribution of electrons reflected by the sample W or secondary electrons emitted from the surface 21 of the sample W, and project the enlarged distribution onto the detector 761. The secondary optical system 74 includes lenses 727, 740, and 741, an NA aperture 742, and the detector 761. Electrons are reflected by the sample W, and again pass through the objective lens 727 and the Wien filter 726. The electrons are then guided by the secondary optical system 74. In the secondary optical system 74, the electronic signal derived from the sample W is guided as an image onto the detector 761 through the lens 740, the NA aperture 742, and the lens 741.

The NA aperture 742 serves to determine the transmittance and aberration of the secondary system. The size and the position of the NA aperture 742 are selected so that the difference between the signal (mirror electrons and the like) from the foreign matter and the signal of the surrounding region (normal region) becomes larger. Alternatively, the size and the position of the NA aperture 742 may be selected so that the ratio of the signal from the foreign matter to the signal of the surrounding region becomes higher. In this manner, the S/N ratio can be made higher.

For example, the NA aperture 742 can be selected in the range of $\varphi 50$ to $\varphi 3000$ μm. The electrons to be detected include both the mirror electrons and the secondary emission electrons. To increase the S/N ratio of the mirror electron image in such a circumstance, selecting an appropriate aperture size is effective. In this case, it is preferable to lower the transmittance of the secondary emission electrons, and select the size of the NA aperture 742 so that the transmittance of the mirror electrons can be maintained.

For example, when the angle of incidence of the primary electron beam is 3 degrees, the angle of reflection of the mirror electrons is approximately 3 degrees. In this case, it is preferable to select the size of the NA aperture 742 so that the orbital path of the mirror electrons can pass through the NA aperture 742. An appropriate size is $\varphi 250$ μm, for example. Limited by the NA aperture ($\varphi 250$ μm), the transmittance of the secondary emission electrons becomes lower. Accordingly, the S/N ratio of the mirror electron image can be improved. If the aperture diameter is changed from $\varphi 2000$ μm to $\varphi 250$ μm, for example, the background tone (noise level) can be at least halved.

The foreign matter may be formed with any kind of material. For example, the foreign matter may be a semiconductor, an insulating material, a metal, or a mixture of these materials. As a natural oxide film or the like is formed on a foreign matter surface, the foreign matter is coated with an insulating material. Because of this, even if the foreign matter is a metal, charge-up occurs in the oxide film. This charge-up is suitably used in this example.

The detector 761 is a means to detect the electrons guided by the secondary optical system 74. The detector 761 includes a two-dimensional image sensor 7611. In the two-dimensional image sensor 7611, pixels are two-dimensionally arranged.

An electron bombardment (EB) semiconductor sensor can be used as the two-dimensional image sensor 7611. For example, an EB-CMOS sensor may be used as the two-dimensional image sensor 7611. An electron beam (secondary beam) can directly enter an EB-CMOS sensor. Accordingly, there is no resolution degradation due to a photoelectric conversion mechanism or an optical transmission mechanism, and a high MTF (Modulation Transfer Function) and contrast can be obtained. Furthermore, with an EB-CMOS, the S/N ratio of a weak signal of small foreign matter can be increased. Thus, a higher sensitivity can be achieved. The S/N ratio can become 1.2 to 2 times higher. Alternatively, an EB-CCD sensor or an EB-TDI sensor may be used as the two-dimensional image sensor 7611.

Also, a CCD (Charge Coupled Device) or a TDI (Time Delay Integration)-CCD may be used as the two-dimensional image sensor 7611. These sensors perform signal detection after converting electrons into light. Therefore, these sensors require a means for photoelectric conversion or the like. In view of this, a photoelectric converter or a scintillator is used to convert electrons into light. Image information about the light is transmitted to the TDI that senses light. In this manner, the electrons are detected.

The number of pixels in the two-dimensional image sensor 7611 may be (2 k×2 k) to (10 k×10 k). The data rate in the two-dimensional image sensor 7611 may be 10 GPPS or lower. Further, the pixel size of the two-dimensional image sensor 7611 may be 1 to 15 μm.

The image processor 763 performs image processing, such as a noise reduction process, an accumulation process, and sub-pixel alignment, on the secondary beam image obtained with the detector 761. The processing speed of the image processor 763 may be 10 GPPS or lower.

The electronic optical device 70 is further described below. The sample W is placed on the stage device 50, which can move in the X-, Y-, Z-, and θ-directions. High-precision alignment is conducted by the stage device 50 and the optical microscope 871. The projection optical system then conducts foreign matter inspection and pattern defect inspection on the sample W, using an electron beam. Here, the potential of the surface 21 of the sample W is important. To measure the surface potential, a surface potential measurement device that can perform measurement in a vacuum is attached to a main chamber 160. The surface potential measurement device measures a two-dimensional surface potential distribution on the sample W. In accordance with a result of the measurement, focus control is performed in the secondary optical system 74, which forms an electron image. A focus map of the two-dimensional position of the sample W is then created in accordance with the potential distribution. With this map, inspection is conducted while the focus being inspected is changed and controlled. In this manner, blurring and distortion of an image due to changes in the surface potential depending on positions can be reduced, and accurate and stable image acquisition and inspection can be conducted.

In foreign matter inspection, it is also important to efficiently obtain a mirror signal from foreign matter. The position of the NA aperture 742 determines the transmittance and the aberration of a signal, and therefore, is of great importance. Secondary emission electrons emitted from one point on the surface 21 of the sample W are normally emitted according to the Lambert's cosine law, and invariably spread a wide region ($\varphi 3$ mm, for example) when reaching the NA position. Accordingly, the secondary emission electrons are insensitive to the position of the NA aperture 742. In the case of mirror electrons, on the other hand, the angle of reflection on the surface 21 of the sample W is almost equal to the angle of incidence of the primary electron beam. Therefore, the mirror electrons show a narrow spread, and has a small beam diameter when reaching the NA aperture 742. For example, the region where the mirror electrons spread is 1/20 or smaller than the region where the secondary emission electrons spread. Accordingly, the mirror electrons are very sensitive to the position of the NA aperture 742. The mirror electron spread region at the NA position is normally a region of $\varphi 10$ to $\varphi 100$ μm. Therefore, the position where the mirror electron intensity is maximized is determined, and the center of the NA aperture 742 is placed at the determined position, which is greatly advantageous.

To set the NA aperture 742 at such an appropriate position, the NA aperture 742 is preferably moved in the X- and Y-directions with an accuracy of approximately 1 μm in the vacuum in the electron column. While the NA aperture 742 is being moved, signal intensity is measured. The position where the signal intensity is maximized is determined, and the center of the NA aperture 742 is set at the determined coordinate position.

In signal intensity measurement, an EB-CCD 745 is very advantageously used. With the EB-CCD 745, it is possible to obtain two-dimensional information about a beam, and the number of electrons entering the detector 761 can be calculated. Thus, a quantitative signal intensity evaluation can be made.

Alternatively, the conditions for the lens 741 may be set so that the position of the NA aperture 742 and the position of the detection surface of the detector 761 can have a conjugate relation. This arrangement is also greatly advantageous. Accordingly, an image of the beam at the position of the NA aperture 742 can be formed on the detection surface of the detector 761, Thus, the beam profile at the position of the NA aperture 742 can be observed with the detector 761.

The NA size (aperture diameter) of the NA aperture 742 is also important. Since the mirror electron signal region is small as described above, an effective NA size is approximately 10 to 200 μm.

In this regard, an electron image is formed with the mirror electrons and the secondary emission electrons. As the aperture size is set as described above, the proportion of the mirror electrons can be made even higher. In this manner, the contrast of the mirror electrons can be made higher, which is to say, the contrast of the foreign matter can be made higher.

More specifically, if the aperture hole is made smaller, the number of secondary emission electrons decreases in inverse proportion to the aperture area. As a result, the tone of the normal portion becomes lower. However, the mirror signal does not change, and the tone of the foreign matter does not change. Accordingly, the contrast of the foreign matter can become higher by the amount of decrease in the tone of the surrounding region, and a higher S/N ratio can be achieved.

An aperture or the like may be designed so that the position of the aperture can be adjusted not only in the X- and Y-directions but also in the Z-axis direction. This arrangement is also advantageous. The aperture is preferably set at the position where the mirror electrons are narrowed down the most. Accordingly, a reduction in the aberration of the mirror electrons and a decrease in the number of the secondary emission electrons can be achieved in a remarkably effective manner. Thus, a higher S/N ratio can be achieved.

<Electron Image Follow-Up Method>

The electronic optical device 70 is further described below. As shown in FIG. 14, the primary optical system 72 includes a first high-voltage reference pipe 701 that is formed along the primary beam path and is designed to surround the path. In the primary optical system 72, the emission current may be 10 μA to 10 μA, the transmittance may be 20 to 50%, the spot size may be φ1 to φ10 μm, the emission region size (emission field size) may be φ10 to φ1000 μm, and the optical magnification may be 10 to $\frac{1}{10}$.

A high-speed deflector 749 is provided in the secondary beam path in the secondary optical system 74. Specifically, the high-speed deflector 749 is located closer to the detector 761 than the NA aperture 742 is. The high-speed deflector 749 is formed with a multipole (with 12 poles in this embodiment), and deflects a secondary beam in any appropriate direction. The high-speed deflector 749 also applies a tetrapolar field, a hexapolar field, and an octapolar field in an overlapping manner, so that the aberration caused by the deflection can be reduced. This deflection direction (deflection amount) is controlled by the controller 2 that functions as a deflection controller 90. The configuration of the high-speed deflector 749 will be further described later in detail. The multipole to be used in the high-speed deflector 749 may be a multipole such as an octapole or a tetrapole.

The imaging magnification of the secondary optical system 74 may be 10 to 10000, the size of sample to be captured with one pixel of the two-dimensional image sensor 7611 may be 1 to 1000 nm (1 to 1000 nm/pixel), the transmittance of the NA aperture 742 may be 10 to 50%, and the lowest defect sensitivity may be 1 to 200 nm.

The controller 2 functions not only as a deflection controller that controls the deflection direction of the high-speed deflector 749, but also as an electronic optical controller that controls the other operations to be performed by the electronic optical device 70, a stage controller that controls the stage device 50, a conveyance controller that controls the structure for conveying the sample W, an imaging controller that controls imaging in the two-dimensional image sensor 7611, and the like. Particularly, in this embodiment, the sample W is moved at a constant velocity by the stage device 50 during inspection, and the controller 2 controls the stage device 50, to perform movement control on the sample W. In FIG. 14, the set of the fixed table 51, the Y-table 52, the X-table 53, and the rotating table 54 shown in FIGS. 12 and 13 are denoted by reference numeral 56.

FIG. 16A is a diagram for explaining an operation to be performed by the high-speed deflector 749 that deflects the secondary beam so that the secondary beam follows the movement of the sample W. As shown in FIG. 16A, in a case where the sample W is continuously moving rightward, the high-speed deflector 749 deflects the secondary beam from a position A1 on the sample W, so that the secondary beam forms a secondary beam image on the two-dimensional image sensor 7611. While the sample W is moving rightward, the high-speed deflector 749 changes the deflection direction and the deflection amount of the secondary beam in every time step dt in accordance with the movement of the sample W, so that the secondary beam image of the portion of the sample W located at the position A1 is always formed at the same position on the two-dimensional image sensor 7611. That is, the high-speed deflector 749 performs the operation so that the secondary beam image appears as if staying still for a certain period of time when seen from the two-dimensional image sensor 7611. The time step dt is preferably such that the product of the time step dt and the moving velocity (imaging plane moving velocity) on the two-dimensional image sensor 7611, which is an integrated value of the moving velocity v of the sample W and the absolute value M of the imaging magnification of the secondary optical system 74, does not exceed the size of one pixel of the two-dimensional image sensor 7611. The operating cycle is preferably 100 kHz to 100 MHz.

By virtue of such changes (follow-up) in the deflection direction and the deflection amount of the secondary beam, the secondary beam from the portion of the sample W first located at the position A1 always enters the two-dimensional image sensor 7611 during the time before the portion of the sample W located at the position A1 reaches a position A2 through movement. During this period (equivalent to one cycle), the two-dimensional image sensor 7611 captures a secondary beam image of the same region of the sample W.

When the portion of the sample W located at the position A1 reaches the position A2, the high-speed deflector 749 returns the viewing field to the position A1. As a result, a secondary beam image of an adjacent region in an imaging region located ahead of the sample W currently located at the position A1 is captured. After the viewing field of the two-dimensional image sensor 7611 returns from the position A2 to the position A1, the high-speed deflector 749 also changes the deflection direction and the deflection amount of the secondary beam in each time step dt by following the movement of the sample W, so that the secondary beam image of the portion of the sample W is always formed at the same position on the two-dimensional image sensor 7611.

The viewing field of the two-dimensional image sensor 7611 moves back and force between the position A1 and the position A2 as described above, but the viewing field is always irradiated with the primary beam. To achieve this, the primary beam should be emitted onto the sample W so that the emission field EF of the primary beam covers the entire viewing field VF1 at the position A1 and the viewing field VF2 at the position A2, as shown in FIG. 16B. That is, the emission field EF should have a size equal to two viewing fields. In this case, the emission field EF of the primary beam can be always fixed at this position.

Also, as shown in FIG. 16C, the emission field of the primary beam may be moved from an emission field EF1 at the position A1 to an emission field EF2 at the position A2, following the movement of the sample W and the viewing field. The change of the emission field of the primary beam can be made by a high-speed deflector (not shown) changing the deflection direction and the deflection amount of the primary beam. This high-speed deflector is disposed closer to the electron gun 721 than the Wien filter 726 is.

In the secondary optical system 74, a second high-voltage reference pipe 702, a third high-voltage reference pipe 703, and a fourth high-voltage reference pipe 704 are provided in this order from the one closest to the sample W. These high-voltage reference pipes are arranged along the secondary beam path, and are designed to surround the secondary beam path. The second high-voltage reference pipe 702 is disposed between the sample W and the Wien filter 726 serving as a beam separator, the third high-voltage reference pipe 703 is disposed closer to the two-dimensional image sensor 7611 than the Wien filter 726 is, and the fourth high-voltage reference pipe 704 is disposed between the third high-voltage reference pipe 703 and the detector 761. The NA aperture 742 is provided inside the third high-voltage reference pipe 703, and the high-speed deflector 749 is provided inside the fourth high-voltage reference pipe 704.

A first voltage V1, a second voltage V2, a third voltage V3, and a fourth voltage V4 are applied to the first high-voltage reference pipe 701, the second high-voltage reference pipe 702, the third high-voltage reference pipe 703, and the fourth high-voltage reference pipe 704, respectively. In this embodiment, the sample W has the ground potential, and the detection voltage in the detector 761 is represented by V5. These voltages have the following relationships: V1=V2=V3, V3>V4, and V4=V5. The preferred incident energy of an electron beam entering the detector 761 is determined beforehand in the design process, and is 5 keV, for example. In that case, the voltage V5 is 5 kV. The first voltage V1 (=V2=V3) is determined from the influence of the space-charge effects and the easiness of handling of the primary beam and the secondary beam, and is preferably 20 to 50 kV. Further, since most of the secondary beam is cut off at the NA aperture 742, the influence of the space-charge effect in the optical path from the NA aperture 742 to the detector 761 is small. Therefore, the connecting portion between the third high-voltage reference pipe 703 and the fourth high-voltage reference pipe 704 is located closer to the detector 761 than the NA aperture 742 is. This arrangement is preferable in maintaining high-speed responsiveness of the voltage power supply for the high-speed deflector 749 disposed in the fourth high-voltage reference pipe 704.

Meanwhile, as two different potentials are in contact with each other, a bipotential lens is formed. This potential difference causes a strong lens effect. As the potential difference is determined by the potential difference between the two high-voltage reference pipes in contact with each other, the potential difference represents a fixed focal length. Therefore, handling of the lens element is extremely difficult in the electronic optical design.

Therefore, an intermediate electrode 750 is provided between the third high-voltage reference pipe 703 and the fourth high-voltage reference pipe 704 in this embodiment, and a different potential from V3 and V4 is applied to the intermediate electrode 750. This potential is normally a potential that is lower than V3 and is higher than V4. However, the potential may be higher than V3 and be lower than V4. Alternatively, the potential may be equal to V3 or V4. With this arrangement, the lens effect caused by different potential in contact with each other can be adjusted. Further, the intermediate electrode 750 is disposed near the object plane of the projector lens 741, and is used as the field lens for the projector lens 741.

FIG. 17 is a diagram showing the structure of a combined unit formed with a high-speed deflector, an imaging lens, and an intermediate electrode. The intermediate electrode 750 is provided between the third high-voltage reference pipe 703 to which a third voltage of 40 kV, for example, is applied, and the fourth high-voltage reference pipe 704 to which a fourth voltage of 5 kV, for example, is applied. The intermediate electrode 750 is not in contact with the third high-voltage reference pipe 703 and the fourth high-voltage reference pipe 704. An intermediate voltage of 5 to 20 kV is applied to the intermediate electrode 750, for example.

To deflect the secondary beam with a high degree of accuracy, the high-speed deflector 749 has a 12-pole structure as described above. The 12 poles are arranged at regular angular intervals in circumferential direction with respect to the optical axis, and a voltage can be applied to each of the poles by the controller 2. A power source and an amplifier for high-speed reflection that are overlapped with the fourth voltage V4 by the fourth high-voltage reference pipe are used to increase the voltage accuracy of the high-speed deflector 749.

A double-gap magnetic field lens is used as the projector lens 741. As the magnetic flux directions of an upper coil 7411 and a lower coil 7412 are the opposite directions from each other, a secondary beam image that is hardly rotated can be projected. Also, the magnetic flux ratio between the upper coil 7411 and the lower coil 7412 is varied, so that fine adjustment can be performed on image rotation, and distortion called S-shaped distortion unique to magnetic field lenses can be reduced. Further, the coils 7411 and 7412 for a magnetic field lens are of a two-wire type, and thus, temperature can be stabilized by constant power.

The high-speed deflector 749 is preferably disposed near the image-side focal position of the projector lens 741.

The high-speed deflector 749 performs not only deflection to follow the movement of the sample W, but also the above described distortion correction on a secondary beam image and the later described position variation correction. These functions are achieved by the controller 2 calculating a deflection field from deviation from the original position and applying the deflection field in an overlapping manner.

Referring back to FIG. 14, position variation correction is now described. As described above, the sample W is continuously moved at a constant velocity by the stage device 50, and the high-speed deflector 749 changes the deflection direction of the secondary beam so that the viewing field follows the movement of the sample W. However, the movement of the sample W being moved by the stage device 50 might have some unintended position variation. As described above, the two-dimensional image sensor 7611 constantly captures a secondary beam image of the same portion of the sample W during one cycle of the movement of the viewing field. However, if unintended position variation occurs in the sample W, the secondary beam from some other portion of the sample W enters each pixel of the two-dimensional image sensor 7611. This phenomenon is called contamination.

As described above, the stage device 50 can perform highly-accurate positioning on the sample W held by the holder 55, in the X-direction, in the Y-direction, and in the Z-direction (the vertical direction in FIG. 12), and further in a direction ((c)-direction) about an axis line perpendicular to the supporting surface of the sample W, by moving the tables with servomotors, encoders, and various sensors (not shown). As for the structures designed for performing such highly accurate positioning, a mirror 571 is fixed to the holder 55, and a laser interferometer 572 is provided on an inner wall of the main housing 30. This laser interferometer 572 emits a laser beam to the mirror 571, and the laser reflected by the mirror 571 returns to the laser interferometer 572.

In the inspection device 1 of this embodiment, the mirror 571 fixed to the holder 55 and the laser interferometer 572 are used as a position variation detection means, and position variation correction is performed. Unintended position variation of the sample W detected by the laser interferometer 572 is inputted to the controller 2. The controller 2 has been instructed to change the deflection direction of the secondary beam with the high-speed deflector 749 as in a case where the sample W is moved without any unintended position variation. However, the controller 2 determines the change to be made by the high-speed deflector 749 to the deflection direction of the secondary beam, taking into account not only the intended movement of the sample W but also the unintended position variation of the sample W detected by the laser interferometer 572. The controller 2 then controls the high-speed deflector 749. However, the controller 2 is not necessarily instructed to change the deflection direction of the secondary beam with the high-speed deflector 749 as in a case where the sample W is moved without any unintended position variation. In such a case, the controller 2 detects the position of (the holder 55 holding) the sample W, including the unintended position variation of the sample W detected by the laser interferometer 572. In accordance with the position, the controller 2 determines the change to be made by the high-speed deflector 749 to the deflection direction of the secondary beam, and then controls the high-speed deflector 749.

As described above, in the inspection device 1 including the electronic optical device 70 of this embodiment, while the sample W is moving, the high-speed deflector 749 deflects the secondary beam so that the secondary beam from the same portion of the sample W always enters the same portion of the two-dimensional image sensor 7611, in synchronization with the movement of the sample W. This high-speed deflector 749 also functions as a position variation corrector that corrects contamination caused by unintended position variation of the sample W. Thus, a high-accuracy secondary beam image can be obtained at the two-dimensional image sensor 7611.

The first voltage V1, the second voltage V2, the third voltage V3, the fourth voltage V4, and the detection voltage V5 are not limited to the above example, and may have the following relationships: V1<V2, V2=V3, V3>V4, and V4=V5, for example. That is, the first voltage V1 may be lower than the second voltage V2 and the third voltage V3. If the first voltage V1 to be applied to the first high-voltage reference pipe 701 in the primary optical system 72 is made lower, the risk of discharge in the first high-voltage reference pipe 701 can be lowered. Specifically, in the primary optical system 72, there is the aperture 723 in the first high-voltage reference pipe 701, and 50% or more of the emission from the electron gun 721 is absorbed at the aperture 723. Therefore, the leak current amount is large, and also greatly vary. To counter this, the first voltage V1 to be applied to the first high-voltage reference pipe 701 is lowered. Thus, the risk of discharge can be lowered or eliminated.

Also, in the above described inspection device 1, a voltage controller that adjusts the fourth voltage V4 to be applied to the fourth nigh-voltage reference pipe 704 may be provided, and the fourth voltage V4 may be varied in synchronization with the detection voltage V5. Here, the fourth voltage V4 (and the detection voltage V5) may be adjusted in the range of +1 kV, for example. As the fourth voltage V4 (and the detection voltage V5) is adjusted in this manner, the electronic energy (incident energy) of the secondary beam entering the detector 761 can be adjusted. Thus, the gain of the two-dimensional image sensor 7611 (which is the luminance of the secondary beam image) can be adjusted.

<Re-Inspection Simulation by Software>

Referring back to FIG. 14, the electronic optical device 70 emits the primary beam that is a planar beam onto the sample W held on the stage device 50, and guides the resultant secondary beam emitted from the sample W to the detector 761. The detector 761 captures the secondary beam with a two-dimensional image sensor (not shown), generates a secondary beam image, and outputs the secondary beam image to the image processor 763.

Functioning as an inspection processor, the image processor 763 performs image processing on the secondary beam image inputted from the detector 761, using image processing filters (such as a mean filter, a Gaussian filter, and a median filter), and performs shading correction. The image processor 763 then conducts inspection through comparison processes, such as comparison between cells, comparison between dies, and comparison between a die and a database. Specifically, the image processor 763 detects a defect that is a portion in which a difference detected as a result of a comparison process exceeds a predetermined threshold value. The image processor 763 then generates a defect image.

The image processor 763 conducts inspection in accordance with inspection condition parameters that are set in advance. The inspection condition parameters include the cell cycle in the case of comparison between cells, the allowable edge value in the case of comparison between dies, the threshold value for detecting a defect, the image processing filters, the shading correction value, the parameters for comparison between a die and a database, and classification information about defects not to be detected. The classification information about defects not to be detected is obtained as a result of classification conducted through imaging performed with a SEM after inspection.

An inspection device that detects a defect in a sample needs to repeat inspection while changing the inspection conditions such as the detection threshold value, and then determine optimum inspection conditions, to detect a real defect without fail and not to detect any false defect (portion not having a defect).

However, where inspection is repeated, a long time is required to optimize the inspection conditions. Further, where inspection is repeated, damage is accumulated in the samples, or the samples are contaminated.

Therefore, to avoid damage to the samples and contamination of the samples, and determine the inspection conditions by conducting inspection a fewer number of times, the inspection device 1 of this embodiment includes a simulation device 200. The image processor 763 outputs a defect image and the unprocessed image (secondary beam image) used in generating the defect image, to the simulation device 200.

The simulation device 200 includes a simulation processor 201, an input module 202, and a monitor 203, and is formed with a general-purpose computer that includes an input means, a monitor, an arithmetic processing unit, a memory, a storage device, an input/output port, and the like. The simulation processor 201 is formed by the arithmetic processing unit executing an inspection result reviewing program of this embodiment. The inspection result reviewing program may be provided to the simulation device 200 through a network, or may be stored in a storage medium from which the simulation device 200 reads and obtains the inspection result reviewing program. The simulation device 200 provided in this manner is stored into the storage device of the simulation device 200, and is then read from the storage device and is executed, to form the simulation processor 201.

The simulation processor 201 conducts a re-inspection simulation on the secondary beam image inputted from the image processor 763, while changing the inspection condition parameters. In this manner, the simulation processor 201 determines optimum inspection condition parameters. The inspection condition parameters to be changed by the simulation processor 201 for a re-inspection simulation include the cell cycle in the case of comparison between cells, the allowable edge value in the case of comparison between dies, the threshold value for detecting a defect, the image processing filters, the shading correction value, the parameters for comparison between a die and a database, and the classification information about the defects not to be detected.

FIG. 18 is a flowchart showing an operation to be performed by the simulation device 200. First, the electronic optical device 70 conducts inspection, and the image processor 763 outputs an inspection result to the simulation device 200 (step S331). In this step, the image processor 763 outputs not only the inspection result, but also the unprocessed image (secondary beam image) used in obtaining the inspection result, and the classification information about the defects not to be detected, to the simulation device 200, In the simulation device 200, the simulation processor 201 reads the inspection result and generates a defect image, and the monitor 203 displays the defect image (step S332).

The simulation processor 201 then changes the inspection conditions and conducts a re-inspection simulation (step S333), and outputs the re-inspection result obtained from the simulation (step S334). In this re-inspection simulation, any defect indicated by the classification information about the defects not to be detected is not detected, as in the inspection conducted by the electronic optical device 70. The simulation processor 201 reads the re-inspection result obtained in step S334, generates a defect image, and outputs the defect image to the monitor 203 (step S335).

The defect image obtained in the re-inspection is then evaluated, and a check is made to determine whether the inspection conditions are optimum inspection conditions (step S336). If the inspection conditions are not optimum inspection conditions (NO in step S336), the operation returns to step S333. The inspection conditions are then changed, and a re-inspection simulation is conducted (step S333). A re-inspection simulation is repeated while the inspection condition parameters are changed in the above manner. If the inspection conditions are optimum inspection conditions (YES in step S336), the optimum inspection conditions are determined to be the inspection conditions to be used in the electronic optical device 70 (step S337), and the processing then comes to an end. The simulation processor 201 may determine whether the inspection conditions are optimum inspection conditions, in accordance with an input from the input module 202, for example.

As described above, according to this embodiment, after actual inspection is conducted in the electronic optical device 70, a re-inspection simulation is conducted by inspection result reviewing software while the inspection conditions are changed in the simulation device 200 using a defect image and an unprocessed image outputted from the electronic optical device 70. Thus, it is possible to optimize the inspection conditions by conducting inspection a fewer number of times, and shorten the time required for optimizing the inspection conditions. Furthermore, there is no need for the electronic optical device 70 to repeat the actual inspection. Thus, damage to the samples and contamination of the samples can be reduced.

Next, the Wien filter 726 shown in FIGS. 14 and 15 is described in detail. Using the effects of a parallel magnetic field and a parallel electric field that are generated in the Wien filter 726 and are perpendicular to each other, the Wien filter 726 deflects the primary beam from the primary optical system 72 and guides the primary beam to the sample W located below the Wien filter 726, and guides the secondary beam emitted from the sample W to the detector 761 located above the Wien filter 726. First, a comparative example is described.

FIG. 24A is a cross-sectional view of a Wien filter 726' according to a comparative example. The Wien filter 726' shown in FIG. 24A includes electromagnetic poles 90', coils (not shown) wound around the respective electromagnetic poles 90', and a shield member 91'.

The shield member 91' is provided to cover the electromagnetic poles 90' and the coil, and encloses the magnetic field and the electric field inside the shield member 91'. An entrance hole 92', an intermediate hole 93', and an exit hole 94' are formed in the shield member 91'. A primary beam enters through the entrance hole 92'. The primary beam is deflected by a magnetic field and an electric field generated from the electromagnetic poles 90', and exits through the intermediate hole 93'. Further, a secondary beam generated from a sample W enters through the intermediate hole 93', travels in a straight line, and exits through the exit hole 94'.

Here, the primary beam enters from obliquely above (to be more precise, from a direction at an angle to the vertical direction) as shown in FIGS. 14 and 15. Therefore, the entrance hole 92' is an oblique hole at the same angle as the angle of incidence of the primary beam. In the comparative example, the exit plane 92b' of the entrance hole 92' is a horizontal plane.

As shown in FIG. 24B, the primary beam entering through the entrance hole 92' is spatial. This drawing shows that beams B1 through B4 arranged at angular intervals of 30 degrees about the primary beam optical axis travel in a direction parallel to the primary beam optical axis, and enter the inside of the Wien filter 726' through the entrance hole 92'.

FIG. 25 is a graph showing changes in the relative distances from the primary beams B1 through B4 shown in FIG. 24B to the optical axis of the primary optical system in the electric field direction and the magnetic field direction in the Wien filter 726' according to the comparative example. In the graph, the abscissa axis indicates the distance to the optical axis of the primary optical system in the traveling direction. The ordinate axis indicates the position relative to the optical axis of the primary optical system.

As shown in FIG. 25, in the electric field direction, the primary beams B1 through B4 that have traveled in a direction parallel to the optical axis of the primary optical system through points located away from the center of the entrance hole 92' approach the optical axis of the primary optical system after passing through the entrance hole 92', and focus on a point at a particular distance zo. In the magnetic field direction, however, the primary beams B1 through B4 that have traveled in a direction parallel to the optical axis of the primary optical system through points located away from the center of the entrance hole 92' temporarily move away from the optical axis of the primary optical system after passing through the entrance hole 92', and again start approaching the optical axis of the primary optical system at a point immediately before the intermediate hole 93'. The reason for such a primary beam orbital path has not been clearly discovered, but the above result is obtained probably because deflection characteristics vary with positions in the orbital path, due to an electric field (potential change) generated between the potential (positive and high) of the electromagnetic pole 90' located on the primary beam incidence side and the shield member 91'. In any case, such extremely non-stigmatic focusing properties increase the difficulty of optical design, and there is a need to add a new optical element for correcting the non-stigmatic focusing properties.

Therefore, this embodiment is designed as described below.

FIG. 19A is a cross-sectional view of the Wien filter 726 according to this embodiment. As shown in FIG. 19A, the Wien filter 726 includes eight or more electromagnetic poles 90, and a shield member 91 designed to cover the electromagnetic poles 90. The electromagnetic poles 90 deflect the primary beam, and generate a magnetic field and an electric field for causing the secondary beam to travel in a straight line. The shield member 91 is formed with a soft magnetic material such as permalloy C. An entrance hole 92 having an entrance plane 92a and an exit plane 92b, an intermediate hole 93, and an exit hole 94 are formed in the shield member 91. The entrance plane 92a and the exit plane 92b of the entrance hole 92 are not physical surfaces, but virtual surfaces. The entrance hole 92 is formed at one position for allowing the primary beam to pass. However, two or more entrance holes 92 may be formed at positions rotationally symmetrical to the optical axis of the secondary beam, with the symmetric properties between the electric field and the magnetic field being taken into account.

FIG. 20 is a schematic perspective view of the electromagnetic poles 90. The Wien filter 726 is formed with the electromagnetic poles 90 that are formed with eight conductive members and eight soft magnetic members arranged at regular intervals in a circumferential direction with respect to the optical axis of the secondary beam. A coil 90a is wound around each of the electromagnetic poles 90. Potentials that are different from one another can be applied to the respective electromagnetic poles 90. With the direction of incidence of the primary beam being the reference, potentials obtained by multiplying the cosines of the phase angles of the positions of the electromagnetic poles 90 by a voltage VE are applied to the respective electromagnetic poles 90. As a result, a uniformly parallel electric field is generated in the vicinity of the optical axis of the secondary beam surrounded by the electromagnetic poles 90. Also, currents that are different from one another can be applied to the respective coils 90a. With the direction of incidence of the primary beam being the reference, currents obtained by multiplying the sines of the phase angles of the positions of the respective electromagnetic poles 90 by a current IB are applied to the respective coils 90a. As a result, a uniformly parallel magnetic field perpendicular to the uniformly parallel electric field is generated in the vicinity of the optical axis of the secondary beam. Because of the electric field and the magnetic field, the primary beam passing through the space formed inside the eight electromagnetic poles 90 is deflected (the space will be hereinafter referred to as the beam passing hole 90b). Farther, as the voltage VE and the current IB are adjusted, the primary beam that has entered through the entrance hole 92 is deflected, and then exits through the intermediate hole 93. The secondary beam that has entered through the intermediate hole 93 travels in a straight line, and then exits through the exit hole 94.

FIG. 21 is a schematic view of a cross-section of the shield member 91, seen from obliquely above. Referring now to FIGS. 19A and 21, the shape of the shield member 91 is described. In this embodiment, the primary beam enters from above in a 45-degree oblique direction (to be more specific, a direction at an angle of 45 degrees to the vertical direction).

The shield member 91 is designed to have such a thickness and a position that the magnetic flux density in the shield member 91 does not become higher than a half of the saturation magnetic flux density of the material of the shield member 91. Further, the existence of the uniformly parallel electric field and the uniformly parallel magnetic field generated by the electromagnetic poles 90 is preferably restricted to a limited region. Therefore, the electron exit hole of the shield member 91 should have a shape that has a certain length along the electron orbit path.

The center of the bottom portion of the shield member 91 is bent vertically upward, and this bent surface 91a forms the intermediate hole 93. The same shape as the shape of the intermediate hole 93 can also be formed by bending the center of the bottom portion of the shield member 91 vertically downward, or by increasing the thickness of the bottom portion of the shield member 91. In either case, however, the distance from the electromagnetic poles 90 becomes shorter, and the magnetic flux density in the shield member 91 becomes higher. Therefore, the structure adopted in this embodiment is preferable.

On the upper surface of the top portion of the shield member 91, a surface 91b substantially perpendicular to the orbital path of the primary beam is formed, and the entrance hole 92 is formed through the surface 91b. Further, the center of the upper surface of the top portion of the shield member 91 is bent vertically upward, and the exit hole 94 is formed through the bent surface 91c. The surface 91b is not necessarily substantially perpendicular to the primary beam, as long as the shield length along the orbital path of the primary beam is at least five times greater than the diameter of the entrance hole 92, for example.

The lower surface of the top portion of the shield member 91 has a substantially vertical surface 91d, and the exit plane 92b of the entrance hole 92 is formed through the surface 91d. The upper end of the vertical surface 91d is bent and extends in the horizontal direction, and is further bent vertically downward.

The entrance plane 92a of the entrance hole 92 is perpendicular to the primary beam, and more specifically, is tilted at 45 degrees to the horizontal direction. The entrance hole 92 is also tilted at 45 degrees, to conform to the angle of incidence of the primary beam. In this embodiment, the exit plane 92b of the entrance hole 92 is not horizontal but vertical, which differs from the equivalent plane of the comparative example. The primary beam emitted from the exit plane 92b enters the electric field and the magnetic field generated by the electromagnetic poles 90.

The intermediate hole 93 is located below the beam passing hole 90b formed by the electromagnetic poles 90, and the primary beam deflected by the electromagnetic poles 90 is emitted to the sample W placed below the Wien filter 726. The secondary beam generated from the sample W then enters through the intermediate hole 93. The secondary beam is not deflected but travels vertically upward, as an equilibrium is established between the Coulomb force from the parallel electric field and the Lorentz force from the parallel magnetic field generated by the electromagnetic poles 90.

The exit hole 94 is located above the beam passing hole 90b formed by the electromagnetic poles 90, and the secondary beam is emitted to the detector 761 disposed above the Wien filter 726.

As shown in FIG. 19B, the primary beam entering through the entrance hole 92 is spatial. This drawing shows that beams B1 through B4 arranged at angular intervals of 30 degrees about the primary beam optical axis travel in a direction parallel to the primary beam optical axis, and enter the inside of the Wien filter 726 through the entrance plane 92a of the entrance hole 92.

FIG. 22 is a graph showing changes in the relative distances from the primary beams B1 through B4 to the optical axis of the primary optical system in the electric field direction and the magnetic field direction in the Wien filter 726 according to this embodiment. In this graph, the ordinate axis and the abscissa axis are the same as those shown in FIG. 25. According to this embodiment, the beams B1 through B4 focus at a particular distance zo in both the electric field direction and the magnetic field direction.

As described above, the reason why focusing properties differ between the comparative example (FIGS. 24A through 25) and this embodiment (FIGS. 19A through 22) is because the shape of the shield member 91 differs, and therefore, the potential distribution, the electric field, and the magnetic field formed in the shield member 91, and the angles of incidence to the end faces also differ between the comparative example and this embodiment. This aspect is described below in greater detail.

As disclosed in "Nano Electron Optics" (Kyoritsu Shuppan), Katsumi URA, pp. 163-165, when an electron beam enters the end face of a magnetic field in a non-vertical manner, a force is applied to the electron beam in a focusing direction or a scattering direction, depending on the angle of incidence. A similar phenomenon can happen on the end face of an electric field. However, the force generated by the oblique incidence on an end face is applied in a scattering direction in the electric field direction, and in a focusing direction in the magnetic field direction in the comparative example. These are the opposite directions from the directions indicated by a result of orbit calculation. There is a possibility that some other effect, such as a force generated from a difference between the potential of an electron beam and the space potential near the orbital path in the Wien filter, is dominant.

In either case, the shape of the shield member 91, or particularly, the angle of the exit plane 92b of the entrance hole 92 (the angle being the angle of incidence onto the electric field and the magnetic field generated by the electromagnetic poles 90), should be appropriately determined, through numerical analysis, in accordance with the focusing properties of the incident primary beam in the electric field direction and the focusing properties in the magnetic field direction. More specifically, the angle of the exit plane 92b is set at such a value that the difference between the focusing properties in the electric field direction and the focusing properties in the magnetic field direction becomes smaller (or more preferably, equal). In other words, the angle of the exit plane 92b is set at such a value that the difference between the focus position in the electric field direction and the focus position in the magnetic field direction becomes smaller (or more preferably, equal).

FIG. 23 is a cross-sectional view of a Wien filter 726 according to a modification. In the following, the differences from the Wien filter 726 shown in FIG. 19A are mainly described. In this modification, the primary beam enters from above in a 35-degree oblique direction. In the Wien filter 726, the exit plane 92b of the entrance hole 92 is not horizontal.

The shape of the lower surface of the top portion of the shield member 91 and the shape of the upper surface of the top portion of the shield member 91 are substantially the same as those in FIG. 19A, However, the angle of tilt of the surface 91b differs from that in FIG. 19A.

The lower surface of the top portion of the shield member 91 has a surface 91d that is tilted at approximately 55 degrees, and the exit plane 92b of the entrance hole 92 is formed through the surface 91d. The upper end of the tilted surface 91d extends in the horizontal direction, and is later bent vertically downward.

The entrance plane 92a of the entrance hole 92 is tilted so as to be substantially perpendicular to the angle of incidence of the primary beam. The entrance hole 92 is also tilted at 35 degrees, to conform to the angle of incidence of the primary beam. The exit plane 92b of the entrance hole 92 is also tilted, and the primary beam emitted from the exit plane 92b enters the electric field and the magnetic field generated by the electromagnetic poles 90.

As described above, in a case where the primary beam enters at an angle that is not 45 degrees, the shape of the shield member 91, or particularly, the angle of the exit plane 92b of the entrance hole 92, should be appropriately determined in accordance with the angle of incidence as described above.

In this embodiment, the exit plane 92b of the entrance hole 92 is not horizontal, and is set at an appropriate angle in accordance with the angle of incidence of the primary beam. As a result, the primary beam that has traveled in a direction parallel to the optical axis of the primary beam and entered through the entrance hole 92 focuses at one point at substantially the same travel distances in the magnetic field direction and in the electric field direction. Accordingly, primary beam focusing in two directions can be achieved, without the addition of a new optical element. Also, the shape of the shield member is simply changed, and there is no need to change the shapes of electrodes or magnetic poles in an asymmetric manner. Thus, focusing in two directions can be more easily achieved, and factors that might hinder the secondary beam from traveling in a straight line are eliminated.

In this embodiment, the reason why eight or more electromagnetic poles 90 are used is not simply because a uniformly parallel electric field and a uniformly parallel magnetic field can be formed over a wide region including the beam passing hole 90b. Where a uniformly parallel electric field and a uniformly parallel magnetic field that are perpendicular to each other are simply generated, a focusing effect is achieved only in the electric field direction, even if the conditions for the secondary beam are adjusted so that the secondary beam can travel in a straight direction. This is a phenomenon that occurs due to a difference between the potential of the traveling beam and the space potential distribution, and such a phenomenon cannot be eliminated. Because of this, when an aperture is formed on the downstream side of the Wien filter in the electron beam traveling direction, optimum positions differ between the electric field direction and the magnetic field direction, and the aperture cannot be formed at an optimum position.

The electromagnetic poles 90 of this embodiment can generate a tetrapolar electric field and a tetrapolar magnetic field in the beam pas sing hole 90b in an overlapping manner. With the generated tetrapolar electric field and tetrapolar magnetic field, the beam focusing effect in the electric field direction is weakened, and a focusing effect is newly achieved in the magnetic field direction at the same time. Thus, a beam that is traveling in a straight line can be focused in two directions, and an aperture can be formed at an optimum position.

Both a tetrapolar electric field and a tetrapolar magnetic field may be generated in an overlapping manner. However, focusing in two directions can be achieved even if only one of them is generated.

The above embodiments are disclosed for enabling those with ordinary knowledge in the technical field of the present invention to carry out the present invention, Various modifications of the above embodiments should be obvious to those skilled in the art, and the technical ideas of the present invention can be applied to other embodiments. Therefore, the present invention is not limited to the above embodiments, and should be construed as including a wider technical scope based on the technical ideas defined by the claims.

From the third embodiment described above, the modes described below can be developed, for example.

[Appendix 1] A Wien filter used in an inspection device that emits a primary beam to a sample and conducts inspection of the sample in accordance with a secondary beam generated from the sample as a result of the primary beam emission, the Wien filter deflecting the primary beam entering from obliquely above in a vertically downward direction and emitting the deflected primary beam, the Wien filter emitting the secondary beam after hardly deflecting the secondary beam entering from vertically below, the Wien filter including:

at least eight electromagnetic poles that are arranged at regular angular intervals about an optical axis of the secondary beam, and are formed with conductive members and soft magnetic members;

coils wound around the respective electromagnetic poles; and a shield member provided to cover circumferences of the electromagnetic poles, wherein potentials different from one another are applied to the respective electromagnetic poles, to generate a uniformly parallel electric field in a direction in which the primary beam is deflected, the uniformly parallel electric field being generated near the optical axis of the secondary beam, currents different from one another are applied to the respective coils, to generate a uniformly parallel magnetic field in a direction in which the primary beam is deflected, the uniformly parallel magnetic field being generated near the optical axis of the secondary beam, a first beam hole, a second beam hole, and a third beam hole are formed in the shield member, the primary beam entering the first beam hole from obliquely above, the primary beam deflected by the electromagnetic poles exiting from the second beam hole, the secondary beam generated from the sample entering the second beam hole, the secondary beam exiting from the third beam hole, and an exit plane of the first beam hole is not horizontal.

[Appendix 2] The Wien filter of appendix 1, wherein an angle between the exit plane of the first beam hole and a horizontal plane is set in accordance with focusing properties of the primary beam in an electric field direction and focusing properties of the primary beam in a magnetic field direction.

[Appendix 3] The Wien filter of appendix 1 or 2, wherein an angle between the exit plane of the first beam hole and a horizontal plane is set at a value with which a difference between focusing properties of the primary beam in an electric field direction and focusing properties of the primary beam in a magnetic field direction becomes smaller.

[Appendix 4]

The Wien filter of any of appendix 1 through 3, wherein an angle between the exit plane of the first beam hole and a horizontal plane is set at a value with which a difference between a focus position of the primary beam in an electric field direction and a focus position of the primary beam in a magnetic field direction becomes smaller.

[Appendix 5]

The Wien filter of any of appendix 1 through 4, wherein the primary beam enters the first beam hole from above in a 45-degree oblique direction, and an angle between the exit plane of the first beam hole and a horizontal plane is approximately 90 degrees.

[Appendix 6] The Wien filter of any of appendix 1 through 5, wherein the electromagnetic poles overlap a tetrapolar electric field or a tetrapolar magnetic field with the uniformly parallel electric field and the uniformly parallel magnetic field.

REFERENCE SIGNS LIST

90 Electromagnetic pole
90a Coil
90b Beam passing hole
91 Shield member
91a to 91d Surface
92 Entrance hole
92a Entrance plane
92b Exit plane
93 Intermediate hole
94 Exit hole The above described embodiments may be combined as appropriate.

What is claimed is:

1. An electron beam inspection device comprising:
a primary electron optical system configured to irradiate a surface of a sample with an electron beam; and
a secondary electron optical system configured to gather secondary electrons emitted from the sample and form an image with the secondary electrons on an electron sensor surface of a detector,
wherein an electron image of the surface of the sample is obtained from a signal detected by the detector to inspect the sample,
a cylindrical member is provided inside a lens tube into which the secondary electron optical system is incorporated, the cylindrical member being formed by stacking an inner layer conductor, an intermediate layer insulator and an outer layer conductor, an electron orbital path is formed inside the cylindrical member,
and members constituting the secondary electron optical system are arranged outside the cylindrical member.

2. The electron beam inspection device according to claim 1, wherein flange portions protruding outward are formed at upper and lower end portions of the intermediate layer insulator of the cylindrical member, to increase a creepage distance between end portions of the inner layer conductor and the outer layer conductor.

3. The electron beam inspection device according to claim 1, wherein a plurality of wider portions having a greater diameter than the cylindrical member are formed in the electron orbital path of the lens tube, and an exhaust pipe is connected to each of the wider portions by a connecting pipe, the exhaust pipe being provided outside the lens tube and being connected to a vacuum pump.

4. The electron beam inspection device according to claim 1, wherein an auxiliary small-size magnetic field lens is disposed near a magnetic field lens provided outside the cylindrical member.

5. An inspection device that inspects a sample, the inspection device comprising:
a stage on which the sample is placed;
a primary optical system configured to irradiate the sample on the stage with an electron beam with a planar shape of a predetermined size; and
a secondary optical system configured to accelerate secondary electrons emitted from the sample upon irradiation with the electron beam, guide the secondary electrons to a detector, and projecting an image on the detector, the secondary optical system comprising an objective lens, wherein
the objective lens comprises:
a first coil;
a second coil disposed along an optical axis of the secondary optical system and parallel to the first coil, the second coil being asymmetrical with respect to the first coil; and
a yoke formed with a magnetic material, the yoke comprising a first housing configured to house the first coil and a second housing configured to house the second coil, the yoke having a ring-like slit for each of the first housing and the second housing, each ring-like slit being located near the optical axis of the secondary optical system and being concentric with respect to the optical axis,
there is a potential difference between the sample and the secondary optical system, and the secondary electrons emitted from the sample are accelerated to a predetermined potential in an electric field, and
currents are applied to the first coil and the second coil, to cause a magnetic flux density of the second coil to cancel a magnetic flux density of the first coil at a position of a surface of the sample on the optical axis of the secondary optical system.

6. The inspection device according to claim 5, wherein the objective lens comprises an acceleration electrode disposed between the yoke and the sample, the acceleration electrode being formed with a nonmagnetic material.

7. An objective lens included in an inspection device that inspects a sample,
the inspection device irradiating the sample on a stage with an electron beam with a planar shape of a predetermined size, guiding secondary electrons emitted from the sample upon irradiation with the electron beam to a detector, and projecting an image on the detector,
the objective lens comprising:
a first coil;
a second coil disposed along an optical axis of the secondary optical system and parallel to the first coil, the second coil being asymmetrical with respect to the first coil; and
a yoke formed with a magnetic material, the yoke comprising a first housing configured to house the first coil and a second housing configured to house the second coil, the yoke having a ring-like slit for each of the first housing and the second housing, each ring-like slit being located near the optical axis of the secondary optical system and being concentric with respect to the optical axis, wherein
there is a potential difference between the sample and the secondary optical system, and the secondary electrons emitted from the sample are accelerated to a predetermined potential in an electric field, and
currents are applied to the first coil and the second coil, to cause a magnetic flux density of the second coil to cancel a magnetic flux density of the first coil at a position of a surface of the sample on the optical axis of the secondary optical system.

8. A Wien filter used in an inspection device that emits a primary beam to a sample and conducts inspection of the sample in accordance with a secondary beam generated from the sample, the Wien filter deflecting the primary beam entering from obliquely above in a vertically downward direction and emitting the deflected primary beam, the Wien filter emitting the secondary beam without deflecting the secondary beam entering from vertically below, the Wien filter comprising:
at least eight electromagnetic poles arranged at regular angular intervals about an optical axis of the secondary beam, the electromagnetic poles being formed with conductive members and soft magnetic members;
coils wound around the respective electromagnetic poles; and
a shield member provided to cover circumferences of the electromagnetic poles, wherein
potentials different from one another are applied to the respective electromagnetic poles, to generate a uniformly parallel electric field in a direction in which the primary beam is deflected, the uniformly parallel electric field being generated near the optical axis of the secondary beam,
currents different from one another are applied to the respective coils, to generate a uniformly parallel magnetic field in a direction in which the primary beam is deflected, the uniformly parallel magnetic field being generated near the optical axis of the secondary beam, a first beam hole, a second beam hole, and a third beam hole are formed in the shield member, the primary beam entering the first beam hole from obliquely above, the primary beam deflected by the electromagnetic poles exiting from the second beam hole, the secondary beam generated from the sample entering the second beam hole, the secondary beam exiting from the third beam hole, and an exit plane of the first beam hole is not horizontal.

9. The Wien filter according to claim 8, wherein an angle between the exit plane of the first beam hole and a horizontal plane is set in accordance with focusing properties of the primary beam in an electric field direction and focusing properties of the primary beam in a magnetic field direction.

10. The Wien filter according to claim 8, wherein an angle between the exit plane of the first beam hole and a horizontal plane is set at a value with which a difference between focusing properties of the primary beam in an electric field direction and focusing properties of the primary beam in a magnetic field direction becomes smaller.

11. The Wien filter according to claim 8, wherein an angle between the exit plane of the first beam hole and a horizontal plane is set at a value with which a difference between a focus position of the primary beam in an electric field direction and a focus position of the primary beam in a magnetic field direction becomes smaller.

12. The Wien filter according to claim 8, wherein
the primary beam enters the first beam hole from above in a 45-degree oblique direction, and
an angle between the exit plane of the first beam hole and a horizontal plane is approximately 90 degrees.

13. The Wien filter according to claim 8, wherein the electromagnetic poles overlap one of a tetrapolar electric field and a tetrapolar magnetic field with the uniformly parallel electric field and the uniformly parallel magnetic field.

* * * * *

UNITED STATES PATENT AND TRADEMARK OFFICE
CERTIFICATE OF CORRECTION

PATENT NO. : 10,002,740 B2
APPLICATION NO. : 15/667040
DATED : June 19, 2018
INVENTOR(S) : Masahiro Hatakeyama et al.

It is certified that error appears in the above-identified patent and that said Letters Patent is hereby corrected as shown below:

On the Title Page

At item (*) please delete the extra word "days" at the end of the sentence

In the Specification

Column 18, Line 53, "nigh-voltage" should read --high-voltage--

Column 22, Line 19, "EW masks," should read --EUV masks,--

Column 35, Line 59, "10 µA" to 10µA" should read --10 µA to 10mA--

Column 35, Line 60, "φ1 to φ10 µm," should read --φ1 to φ100 µm,--

Column 39, Line 24, "a direction ((c)-direction)" should read --a direction (θ-direction)--

Signed and Sealed this
Twenty-third Day of October, 2018

Andrei Iancu
*Director of the United States Patent and Trademark Office*